(12) United States Patent
Hanzawa et al.

(10) Patent No.: US 11,653,122 B2
(45) Date of Patent: May 16, 2023

(54) SOLID-STATE IMAGE CAPTURING ELEMENT WITH FLOATING DIFFUSION LAYERS PROCESSING A SIGNAL UNDERGOING PIXEL ADDITION

(71) Applicant: Sony Semiconductor Solutions Corporation, Kanagawa (JP)

(72) Inventors: Katsuhiko Hanzawa, Kanagawa (JP); Yoshikazu Nitta, Park Ridge, NJ (US); Hirotaka Murakami, Park Ridge, NJ (US); Kazumasa Nishimura, Fukuoka (JP); Pude Mark, Park Ridge, NJ (US); Christopher Moule Eric, Park Ridge, NJ (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 270 days.

(21) Appl. No.: 16/818,022

(22) Filed: Mar. 13, 2020

(65) Prior Publication Data

US 2021/0289156 A1 Sep. 16, 2021

(51) Int. Cl.
*H04N 25/75* (2023.01)
*H01L 27/146* (2006.01)
(Continued)

(52) U.S. Cl.
CPC ............. *H04N 25/75* (2023.01); *H04N 25/46* (2023.01); *H04N 25/778* (2023.01);
(Continued)

(58) Field of Classification Search
CPC .... H04N 5/378; H04N 5/347; H04N 5/37457; H01L 27/14641; H01L 27/14645;
(Continued)

(56) References Cited

U.S. PATENT DOCUMENTS 7,777,171 B2 * 8/2010 Parks .................. H04N 5/3741
348/308
2014/0333812 A1 * 11/2014 Kuroda ................ H04N 5/3745
348/302
2020/0036930 A1 * 1/2020 Hanzawa .............. H04N 5/376

FOREIGN PATENT DOCUMENTS

EP 3 487 166 A1 5/2019
JP 2013-197989 A 9/2013
(Continued)

OTHER PUBLICATIONS

U.S. Appl. No. 17/909,732, filed Sep. 6, 2022, Hanzawa et al.
(Continued)

*Primary Examiner* — Jennifer D Bennett
*Assistant Examiner* — Erin R Garber
(74) *Attorney, Agent, or Firm* — Wolf, Greenfield & Sacks, P.C.

(57) ABSTRACT

A solid-state image capturing element includes a pair of first floating diffusion layers arranged in a direction perpendicular to a predetermined direction and a pair of second floating diffusion layers arranged in the perpendicular direction and adjacent to the pair of first floating diffusion layers in the predetermined direction. The element includes a first connection circuit configured to select at least one of the pair of first floating diffusion layers and to connect the selected first floating diffusion layer to a predetermined first wire; a second connection circuit configured to select at least one of the pair of second floating diffusion layers and to connect the selected second floating diffusion layer to the first wire; and an output circuit configured to output a signal according to an amount of charge of at least one of the pair of first floating diffusion layers or the pair of second floating diffusion layers.

15 Claims, 37 Drawing Sheets

(51) Int. Cl.
*H04N 25/46* (2023.01)
*H04N 25/778* (2023.01)
*G01S 7/4863* (2020.01)

(52) U.S. Cl.
CPC ....... *G01S 7/4863* (2013.01); *H01L 27/14641* (2013.01); *H01L 27/14645* (2013.01)

(58) Field of Classification Search
CPC ......... H01L 27/14643; H01L 27/14612; H01L 27/14603; H01L 27/14636; H01L 27/14638; G01S 7/4863
See application file for complete search history.

(56) References Cited

FOREIGN PATENT DOCUMENTS

| KR | 10-0790582 B1 | 1/2008 | |
|---|---|---|---|
| WO | WO 2018/003305 A1 | 1/2018 | |
| WO | WO-2018003305 A1 * | 1/2018 | ............. H04N 5/347 |

OTHER PUBLICATIONS

Invitation to Pay Additional Fees mailed Nov. 24, 2020 in connection with International Application No. PCT/JP2020/037081.
International Search Report and Written Opinion dated Feb. 2, 2021 in connection with International Application No. PCT/JP2020/037081.

* cited by examiner

FIG. 10

| | NORMAL MODE | CONVERSION EFFICIENCY CHANGE MODE | | | |
|---|---|---|---|---|---|
| | | CONVERSION EFFICIENCY C1 | CONVERSION EFFICIENCY C2 | CONVERSION EFFICIENCY C3 | CONVERSION EFFICIENCY C4 |
| FDG_b0 | OFF | ON | ON | ON | ON |
| FDG_b1 | OFF | OFF | ON | ON | ON |
| FDG_b2 | OFF | OFF | OFF | ON | ON |
| FDG_b3 | OFF | OFF | OFF | OFF | ON |
| TRG | ONLY TRG_(m, n) OF SUBJECT OF READING | | | | |

FIG. 11

| | PIXEL ADDITION MODE | | | |
|---|---|---|---|---|
| | ADDITION OF 8 PIXELS | ADDITION OF 16 PIXELS | ADDITION OF 24 PIXELS | ADDITION OF 32 PIXELS |
| FDG_b0 | OFF | ON | ON | ON |
| FDG_b1 | OFF | ON | ON | ON |
| FDG_b2 | OFF | OFF | ON | ON |
| FDG_b3 | OFF | OFF | OFF | ON |
| TRG | TURN ON ALL CONNECTION TRANSISTORS IN FD SHARING BLOCK #0 | TURN ON ALL CONNECTION TRANSISTORS IN FD SHARING BLOCKS #0, 1 | TURN ON ALL CONNECTION TRANSISTORS IN FD SHARING BLOCKS #0 TO 2 | TURN ON ALL CONNECTION TRANSISTORS IN FD SHARING BLOCKS #0 TO 3 |

SOLID-STATE IMAGE CAPTURING ELEMENT WITH FLOATING DIFFUSION LAYERS PROCESSING A SIGNAL UNDERGOING PIXEL ADDITION

TECHNICAL FIELD

The present technology relates to a solid-state image capturing element. More particularly, the present technology relates to a solid-state image capturing element that processes a signal that undergoes pixel addition, and an image capturing device.

BACKGROUND ART

In the past, in solid-state image capturing elements, pixel addition for adding a plurality of pixel signals has been used for the purpose of improving sensitivity and reducing noise. For example, a solid-state image capturing element has been proposed in which connection transistors connecting two floating diffusion layers (FDs) adjacent in the vertical direction are provided between the FDs (for example, see Patent Literature 1).

CITATION LIST

Patent Literature

[PTL 1]
JP 2013-197989 A

SUMMARY

Technical Problem

In the above-described related art, connection transistors are provided between two FDs adjacent in the vertical direction, thereby adding pixel signals of two pixels arranged in the vertical direction. However, it is difficult for the solid-state image capturing element described above to perform pixel addition on a plurality of pixels arranged in a direction other than the vertical direction. For example, in the Bayer array, a plurality of green (G) pixels is arranged in the diagonal direction, but it is difficult for the above-described solid-state image capturing element to add the pixel signals of these pixels. In this way, in the above-described solid-state image capturing element, there is a problem that the arrangement direction of a subject of pixel addition is limited to the vertical direction and flexibility is lacking.

The present technology has been created in view of such a situation, and it is desirable to improve flexibility in the arrangement direction of a subject of addition in the solid-state image capturing element that performs pixel addition.

Solution to Problem

According to a first aspect of the present technology, there is provided a solid-state image capturing element including: a pair of first floating diffusion layers arranged in a direction perpendicular to a predetermined direction; a pair of second floating diffusion layers arranged in the perpendicular direction and adjacent to the pair of first floating diffusion layers in the predetermined direction; a first connection circuit configured to select at least one of the pair of first floating diffusion layers and to connect the selected first floating diffusion layer to a predetermined first wire; a second connection circuit configured to select at least one of the pair of second floating diffusion layers and to connect the selected second floating diffusion layer to the first wire; and an output circuit configured to output a signal according to an amount of charge of at least one of the pair of first floating diffusion layers or the pair of second floating diffusion layers. This brings about an effect of improving flexibility of a subject of pixel addition.

Furthermore, in the first aspect, the first connection circuit may include: a first connection transistor configured to connect one of the pair of first floating diffusion layers to the first wire according to a first control signal; and a second connection transistor configured to connect another one of the pair of first floating diffusion layers to the first wire according to a second control signal, and the second connection circuit may include: a third connection transistor configured to connect one of the pair of second floating diffusion layers to the first wire according to a third control signal; and a fourth connection transistor configured to connect another one of the pair of second floating diffusion layers to the first wire according to a fourth control signal. This brings about an effect that the four floating diffusion layers are individually connected to the first wire according to the control signals.

Furthermore, in the first aspect, a reset transistor may be disposed between the first connection transistor and the third connection transistor in the predetermined direction, and a selection transistor may be disposed between the first connection transistor and the second connection transistor in the perpendicular direction. This brings about an effect that the connection transistors are connected to the first wire installed in the perpendicular direction.

Furthermore, in the first aspect, the first connection transistor and the third connection transistor may be disposed adjacent to each other in the predetermined direction, and a selection transistor may be disposed between the first connection transistor and the second connection transistor in the perpendicular direction. This brings about an effect of reducing the number of wires.

Furthermore, in the first aspect, a reset transistor may be disposed between the first connection transistor and the third connection transistor in the predetermined direction, and the first connection transistor and the second connection transistor may be disposed adjacent to each other in the perpendicular direction. This brings about an effect that the wiring distance in the perpendicular direction is reduced.

Furthermore, in the first aspect, the first connection transistor and the third connection transistor may be disposed adjacent to each other in the predetermined direction, and the first connection transistor and the second connection transistor may be disposed adjacent to each other in the perpendicular direction. This brings about an effect that the wiring distance in the horizontal direction is reduced.

Furthermore, in the first aspect, the second connection circuit may further include: a fifth connection transistor configured to connect one of the pair of second floating diffusion layers to a predetermined second wire according to a fifth control signal; and a sixth connection transistor configured to connect another one of the pair of second floating diffusion layers to a predetermined third wire according to a sixth control signal. This brings about an effect of increasing the number of pixels of a subject of addition.

Furthermore, in the first aspect, a reset transistor may be disposed adjacent to the fifth connection transistor in the predetermined direction. This brings about an effect that the connection transistors are connected to the first, second, and third wires installed in the perpendicular direction.

Furthermore, in the first aspect, a predetermined number of the fifth connection transistors may be arranged adjacent to each other in the predetermined direction. This brings about an effect of reducing the number of wires.

Furthermore, in the first aspect, the output circuit may further include: a first reset transistor configured to connect a predetermined power node to the first wire according to a first reset signal; and a second reset transistor configured to connect a predetermined power node to the first wire according to a second reset signal. This brings about an effect that circuit symmetry is maintained when initializing the left side and the right side.

Furthermore, in the first aspect, a pair of third floating diffusion layers arranged in the perpendicular direction; a pair of fourth floating diffusion layers arranged in the perpendicular direction and adjacent to the pair of third floating diffusion layers in the predetermined direction; a third connection circuit configured to select at least one of the pair of third floating diffusion layers and to connect the selected third floating diffusion layer to the first wire; and a fourth connection circuit configured to select at least one of the pair of fourth floating diffusion layers and to connect the selected fourth floating diffusion layer to the first wire may further be included. This brings about an effect of increasing the number of pixels of a subject of addition.

Furthermore, in the first aspect, a signal processing unit configured to perform processing of measuring a distance according to a time of flight of light on the basis of the output signal may further be included. This brings about an effect that the distance to an object is measured.

Furthermore, in the first aspect, a pair of third floating diffusion layers arranged in the perpendicular direction; a pair of fourth floating diffusion layers arranged in the perpendicular direction; a third connection circuit configured to select at least one of the pair of third floating diffusion layers and to connect the selected third floating diffusion layer to a predetermined second wire; and a fourth connection circuit configured to select at least one of the pair of fourth floating diffusion layers and to connect the selected fourth floating diffusion layer to the second wire may further be included, in which the output circuit may output the signal according to an amount of charge of at least one of the pair of first floating diffusion layers or the pair of second floating diffusion layers, and a signal according to an amount of charge of at least one of the pair of third floating diffusion layers or the pair of fourth floating diffusion layers. This brings about an effect that the distance to an object is measured.

Furthermore, in the first aspect, a pair of third floating diffusion layers arranged in the perpendicular direction; a pair of fourth floating diffusion layers arranged in the perpendicular direction; a third connection circuit configured to select at least one of the pair of third floating diffusion layers and to connect the selected third floating diffusion layer to the first wire; and a fourth connection circuit configured to select at least one of the pair of fourth floating diffusion layers and to connect the selected fourth floating diffusion layer to the first wire may further be included, in which the output circuit outputs the signal according to an amount of charge of at least one of the pair of first floating diffusion layers or the pair of second floating diffusion layers, and a signal according to an amount of charge of at least one of the pair of third floating diffusion layers or the pair of fourth floating diffusion layers. This brings about an effect that signals having different phase differences are added.

Furthermore, in the first aspect, a first transfer transistor configured to transfer a charge from a first photoelectric conversion element to one of the pair of first floating diffusion layers; a second transfer transistor configured to transfer a charge from the first photoelectric conversion element to another one of the pair of first floating diffusion layers; a third transfer transistor configured to transfer a charge from a second photoelectric conversion element to one of the pair of second floating diffusion layers; and a fourth transfer transistor configured to transfer a charge from the second photoelectric conversion element to another one of the pair of second floating diffusion layers may further be included. This brings about an effect that signals having different phase differences are transferred to the floating diffusion layers arranged in the perpendicular direction.

Furthermore, in the first aspect, the first connection circuit may include: a first connection transistor configured to connect one of the pair of first floating diffusion layers to a second wire connected to the first wire according to a first control signal; a second connection transistor configured to connect another one of the pair of first floating diffusion layers to a third wire according to a second control signal; and a third connection transistor configured to connect the first wire to the third wire according to a third control signal, and the second connection circuit includes a fourth connection transistor that connects one of the pair of second floating diffusion layers to the second wire according to a fourth control signal. This brings about an effect that the FD sharing range can be variable.

Furthermore, according to a second aspect of the present technology, there is provided an electronic device including: a pair of first floating diffusion layers arranged in a direction perpendicular to a predetermined direction; a pair of second floating diffusion layers arranged in the perpendicular direction and adjacent to the pair of first floating diffusion layers in the predetermined direction; a first connection circuit configured to select at least one of the pair of first floating diffusion layers and to connect the selected first floating diffusion layer to a predetermined first wire; a second connection circuit configured to select at least one of the pair of second floating diffusion layers and to connect the selected second floating diffusion layer to the first wire; an output circuit configured to output a signal according to an amount of charge of at least one of the pair of first floating diffusion layers or the pair of second floating diffusion layers; and an analog-to-digital conversion unit configured to perform analog-to-digital conversion processing on the signal. This brings about an effect that the flexibility of a subject of pixel addition is improved and the added signal is converted into a digital signal.

BRIEF DESCRIPTION OF DRAWINGS

FIG. 10 is a diagram showing one example of a control method in a normal mode and a conversion efficiency change mode in the first embodiment of the present technology.

FIG. 11 is a diagram showing one example of the control method in a pixel addition mode in the first embodiment of the present technology.

DESCRIPTION OF EMBODIMENTS

Modes for carrying out the present technology (hereinafter referred to as embodiments) will be described below. The description will be made in the following order.
1. First embodiment (example of connecting a plurality of FDs to FD wire)
2. Second embodiment (example of adding FD wire and connecting a plurality of FDs to FD wire)
3. Third embodiment (example of connecting reset transistor and a plurality of FDs to FD wire)
4. Fourth embodiment (example of connecting eight FDs to FD wire)
5. Fifth embodiment (example of connecting a plurality of FDs to FD wire and performing distance measurement)
6. Sixth embodiment (example of connecting a plurality of FDs to FD wire and making FD sharing range variable)
7. Example of application to moving object 1. First Embodiment

[Configuration Example of Image Capturing Device]

Figure 1:
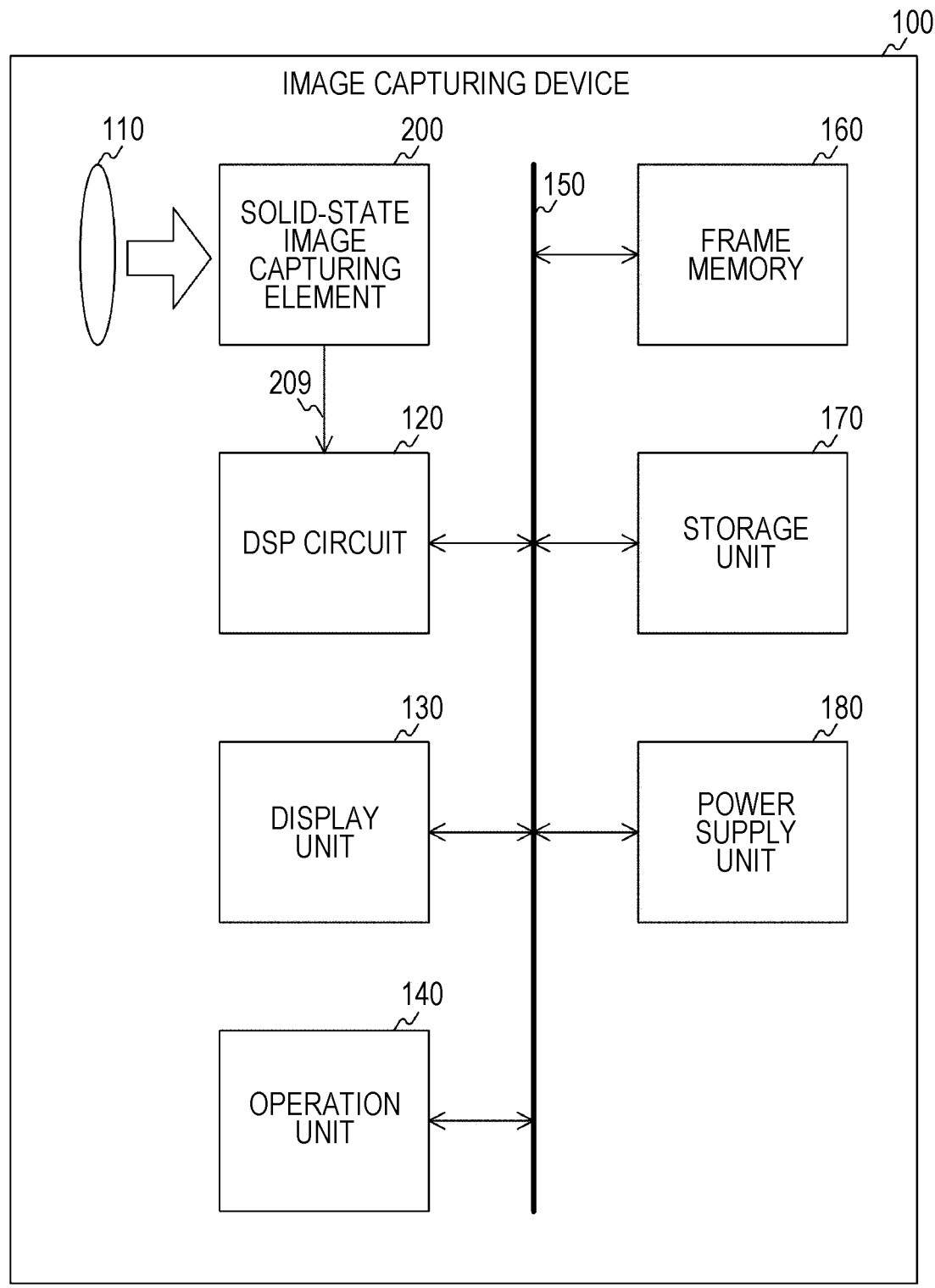
FIG. 1 is a block diagram showing one configuration example of an image capturing device in a first embodiment of the present technology.

FIG. 1 is a block diagram showing one configuration example of an image capturing device 100 in a first embodiment of the present technology. The image capturing device 100 is a device for capturing image data (frame), and includes an optical unit 110, a solid-state image capturing element 200, and a digital signal processing (DSP) circuit 120. Moreover, the image capturing device 100 includes a display unit 130, an operation unit 140, a bus 150, a frame memory 160, a storage unit 170, and a power supply unit 180. As the image capturing device 100, for example, in addition to a digital camera such as a digital still camera, a smartphone, a personal computer, a vehicle-mounted camera, and the like having an image capturing function are assumed. Note that the image capturing device 100 is one example of the electronic device described in the claims.

The optical unit 110 collects light from an object and guides the collected light to the solid-state image capturing element 200. The solid-state image capturing element 200 generates a frame by photoelectric conversion in synchronization with a vertical synchronizing signal. Here, the vertical synchronizing signal is a periodic signal having a predetermined frequency indicating timing of image capturing. The solid-state image capturing element 200 supplies the generated image data to the DSP circuit 120 via a signal line 209.

The DSP circuit 120 performs predetermined signal processing on the frame from the solid-state image capturing element 200. The DSP circuit 120 outputs the processed frame to the frame memory 160 and the like via the bus 150.

The display unit 130 displays the frame. As the display unit 130, for example, a liquid crystal panel or an organic electro luminescence (EL) panel is assumed. The operation unit 140 generates an operation signal according to a user operation.

The bus 150 is a common path for the optical unit 110, the solid-state image capturing element 200, the DSP circuit 120, the display unit 130, the operation unit 140, the frame memory 160, the storage unit 170, and the power supply unit 180 to exchange data with one another. The frame memory 160 holds the image data. The storage unit 170 stores various data such as the frame. The power supply unit 180 supplies power to the solid-state image capturing element 200, the DSP circuit 120, the display unit 130, and the like.

[Configuration Example of Solid-State Image Capturing Element]

Figure 2:
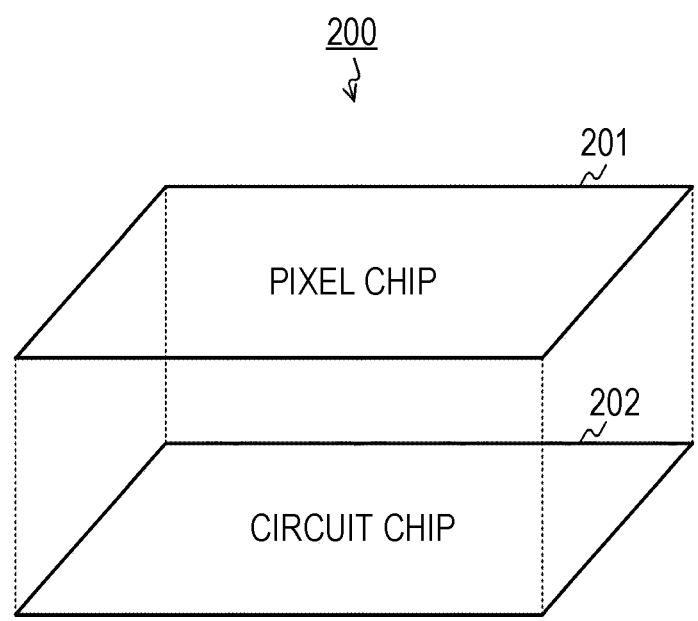
FIG. 2 is a diagram showing one example of a stacked structure of a solid-state image capturing element in the first embodiment of the present technology.

FIG. 2 is a diagram showing one example of stacked structure of the solid-state image capturing element 200 in the first embodiment of the present technology. The solid-state image capturing element 200 includes a circuit chip 202 and a pixel chip 201 stacked on the circuit chip 202. These chips are electrically connected via connection parts such as vias. Note that in addition to the vias, these chips can also be connected by Cu—Cu bonding or bumps. These chips can also be connected by another method (such as magnetic coupling). Furthermore, two chips are stacked, but three or more layers can be stacked.

Figure 3:
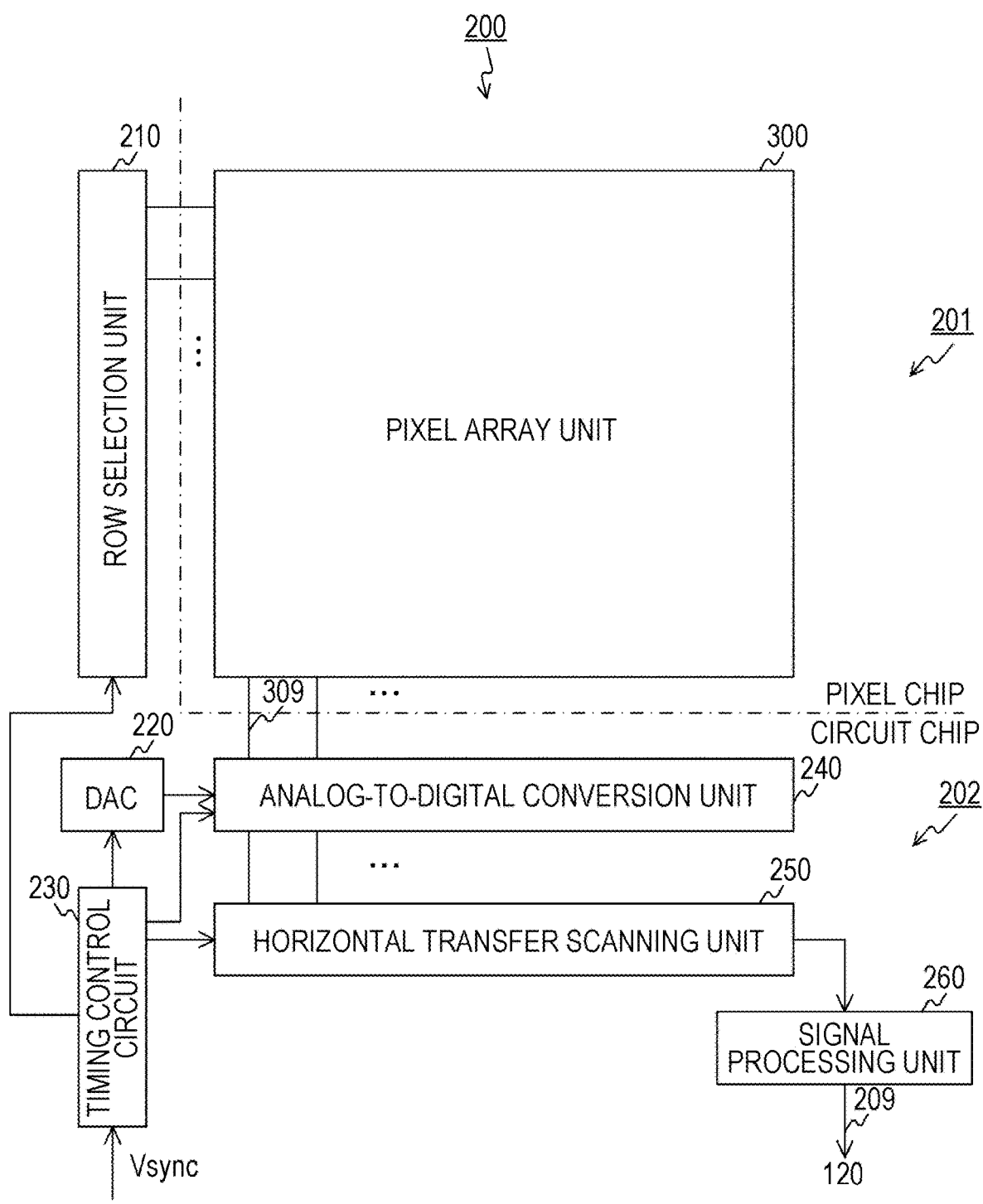
FIG. 3 is a block diagram showing one configuration example of the solid-state image capturing element in the first embodiment of the present technology.

FIG. 3 is a block diagram showing one configuration example of the solid-state image capturing element 200 in the first embodiment of the present technology. The solid-state image capturing element 200 includes a row selection unit 210, a digital-to-analog converter (DAC) 220, and a timing control circuit 230. Moreover, the solid-state image capturing element 200 includes a pixel array unit 300, an analog-to-digital conversion unit 240, a horizontal transfer scanning unit 250, and a signal processing unit 260. Furthermore, a plurality of pixels is arranged in a two-dimensional lattice in the pixel array unit 300.

The timing control circuit 230 controls operation timing of each of the row selection unit 210, the DAC 220, the analog-to-digital conversion unit 240, and the horizontal transfer scanning unit 250 in synchronization with the vertical synchronizing signal Vsync.

The row selection unit 210 selects and drives the rows sequentially, and outputs an analog pixel signal to the analog-to-digital conversion unit 240.

The DAC 220 generates a reference signal by digital-to-analog (DA) conversion and supplies the reference signal to the analog-to-digital conversion unit 240. As the reference signal, for example, a sawtooth-shaped ramp signal is used.

The analog-to-digital conversion unit 240 converts the analog pixel signal of every column into a digital signal by using the reference signal. The analog-to-digital conversion unit 240 supplies the digital signal to the signal processing unit 260 according to control by the horizontal transfer scanning unit 250.

The horizontal transfer scanning unit 250 controls the analog-to-digital conversion unit 240 to sequentially output the digital signal.

The signal processing unit 260 performs predetermined image processing on the frame in which the digital signal is arranged. The signal processing unit 260 supplies the processed frame to the DSP circuit 120.

Furthermore, the above-described circuits in the solid-state image capturing element 200 are dispersedly disposed in the pixel chip 201 and the circuit chip 202. For example, the pixel array unit 300 is provided in the pixel chip 201, and circuits other than the pixel array unit 300 (such as the analog-to-digital conversion unit 240) are disposed in the circuit chip 202. Note that the circuits disposed in the pixel chip 201 and the circuit chip 202 are not limited to this combination. For example, the pixel array unit 300 and comparators in the analog-to-digital conversion unit 240 can be disposed in the pixel chip 201, and other circuits can be disposed in the circuit chip 202.

[Configuration Example of Pixel Array Unit]

Figure 4:
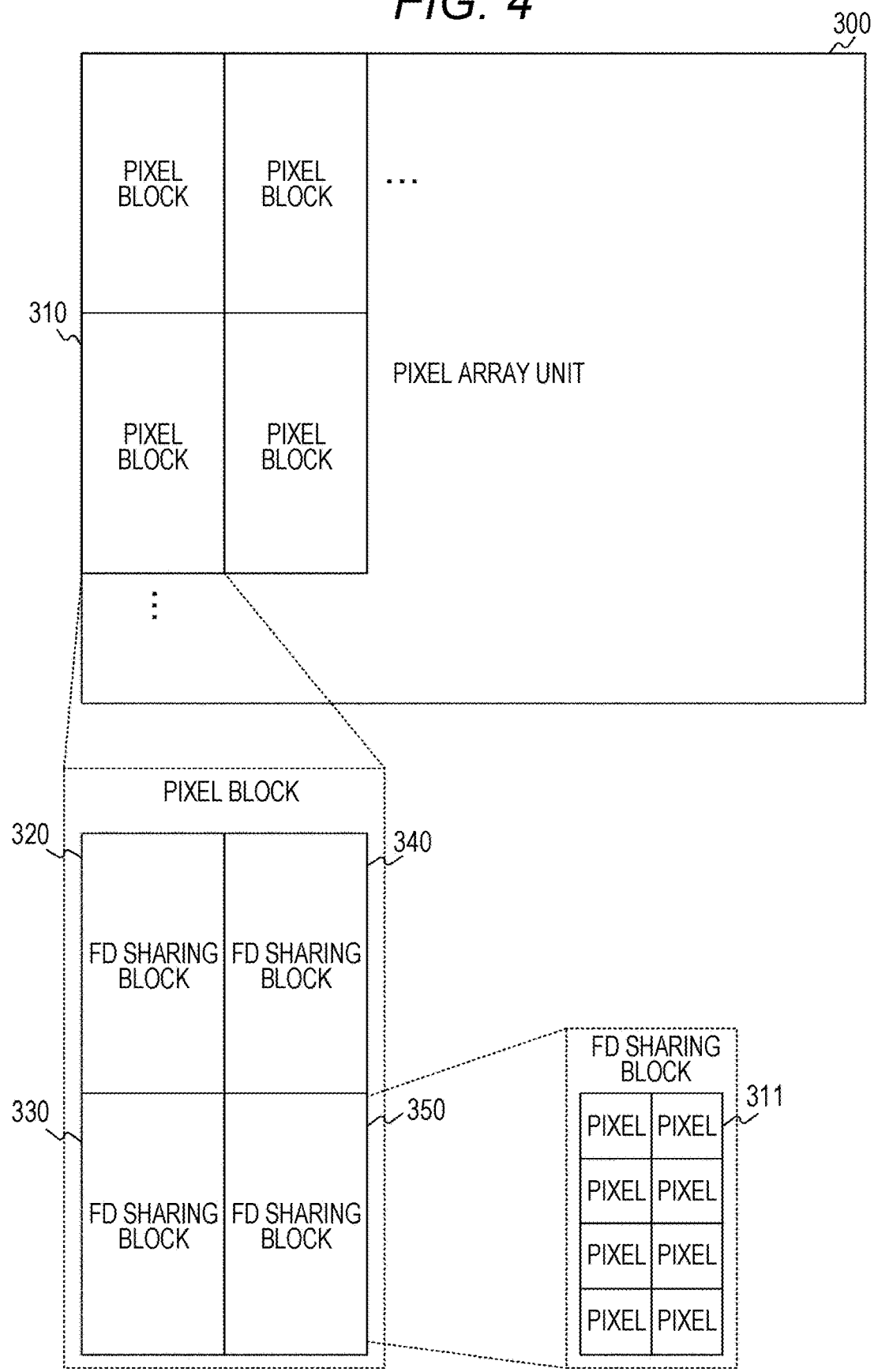
FIG. 4 is a diagram showing one configuration example of a pixel array unit in the first embodiment of the present technology.

FIG. 4 is a diagram showing one configuration example of the pixel array unit 300 in the first embodiment of the present technology. In the pixel array unit 300, a plurality of pixel blocks 310 is arranged in a two-dimensional lattice. In each pixel block 310, a plurality of FD sharing blocks is arranged in a two-dimensional lattice. For example, FD sharing blocks 320, 330, 340, and 350 are arranged in every pixel block 310. In the FD sharing block 320, a plurality of pixels 311 sharing one FD is arranged in a two-dimensional lattice. For example, eight pixels of four rows×two columns are arranged in the FD sharing block 320. In the FD sharing blocks 330, 340 and 350, eight pixels are similarly arranged.

Note that the number of pixels arranged in each of the FD sharing blocks is not limited to eight pixels, and may be two pixels or the like.

[Configuration Example of Pixel Block]

Figure 5:
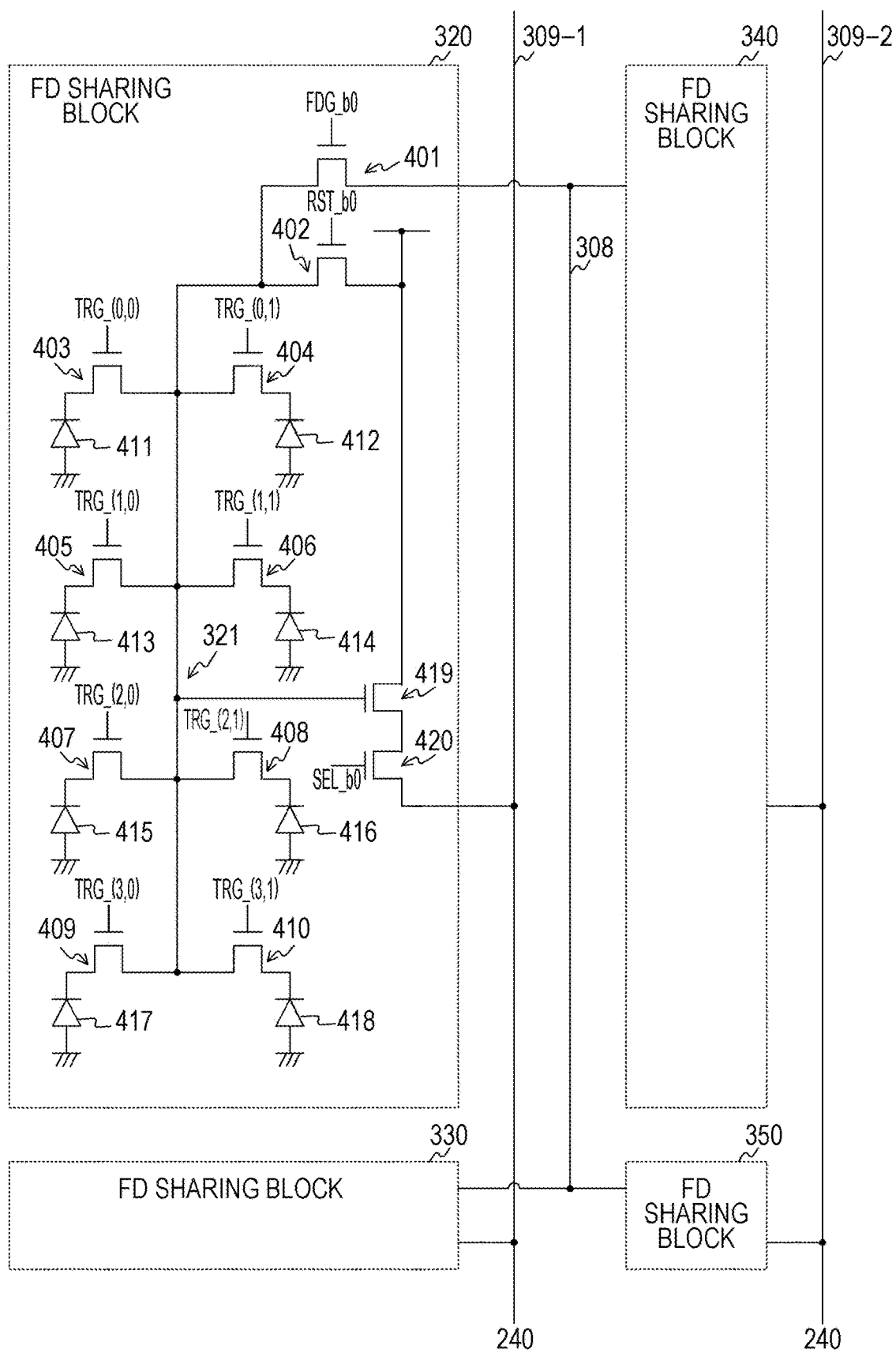
FIG. 5 is a circuit diagram showing one configuration example of an upper left FD sharing block in a pixel block in the first embodiment of the present technology.

FIG. 5 is a circuit diagram showing one configuration example of the upper left FD sharing block 320 in the pixel block 310 in the first embodiment of the present technology.

Here, in the pixel array unit 300, a vertical signal line is installed in the vertical direction for each column of FD sharing blocks, and each column is connected to the corresponding vertical signal line. For example, the column of left FD sharing blocks including the FD sharing blocks 320 and 330 is connected to the vertical signal line 309-1. Furthermore, the column of right FD sharing blocks including the FD sharing blocks 340 and 350 is connected to the vertical signal line 309-2.

Furthermore, an FD wire 308 is installed in the pixel block 310, and the FD sharing blocks 320, 330, 340, and 350 are connected to the FD wire 308.

Pay attention to the upper left FD sharing block 320. The FD sharing block 320 includes a connection transistor 401, a reset transistor 402, transfer transistors 403 to 410, photoelectric conversion elements 411 to 418, and an FD 321. Moreover, the FD sharing block 320 includes an amplification transistor 419 and a selection transistor 420.

The connection transistor 401 connects the FD 321 to the FD wire 308 according to a control signal FDG_b0 from the row selection unit 210.

The reset transistor 402 connects a power node to the FD 321 and initializes an amount of charge of the FD 321 according to a reset signal RST_b0 from the row selection unit 210.

The transfer transistor 403 transfers a charge from the photoelectric conversion element 411 to the FD 321 according to a transfer signal TRG_(0, 0) from the row selection unit 210. The transfer transistor 404 transfers a charge from the photoelectric conversion element 412 to the FD 321 according to a transfer signal TRG_(0, 1) from the row selection unit 210. The transfer transistor 405 transfers a charge from the photoelectric conversion element 413 to the FD 321 according to a transfer signal TRG_(1, 0) from the row selection unit 210. The transfer transistor 406 transfers a charge from the photoelectric conversion element 414 to the FD 321 according to a transfer signal TRG_(1, 1) from the row selection unit 210.

The transfer transistor 407 transfers a charge from the photoelectric conversion element 415 to the FD 321 according to a transfer signal TRG_(2, 0) from the row selection unit 210. The transfer transistor 408 transfers a charge from the photoelectric conversion element 416 to the FD 321 according to a transfer signal TRG_(2, 1) from the row selection unit 210. The transfer transistor 409 transfers a charge from the photoelectric conversion element 417 to the FD 321 according to a transfer signal TRG_(3, 0) from the row selection unit 210. The transfer transistor 410 transfers a charge from the photoelectric conversion element 418 to the FD 321 according to a transfer signal TRG_(3, 1) from the row selection unit 210.

The photoelectric conversion elements 411 to 418 generate a charge by photoelectric conversion. The FD 321 accumulates the transferred charge and generates a voltage according to the amount of charge. The amplification transistor 419 amplifies the voltage signal of the FD 321. The selection transistor 420 outputs the amplified analog signal to the analog-to-digital conversion unit 240 via the vertical signal line 309-1 according to a selection signal SEL_b0 from the row selection unit 210.

Any of the transfer transistors 403 to 410, any of the photoelectric conversion elements 411 to 418, and the shared transistor (such as the reset transistor 401) function as one pixel 311 illustrated in FIG. 4.

Figure 6:
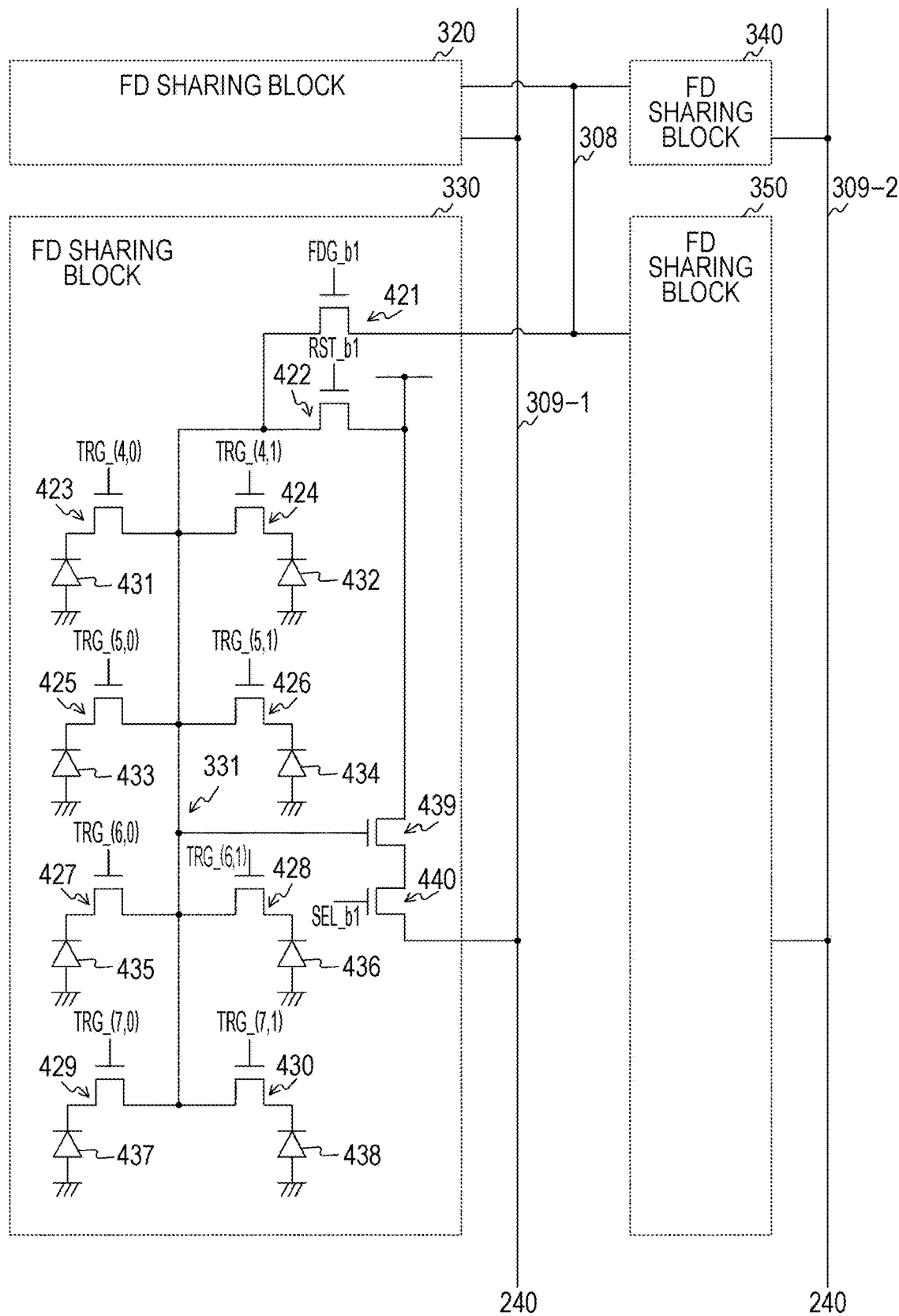
FIG. 6 is a circuit diagram showing one configuration example of a lower left FD sharing block in the pixel block in the first embodiment of the present technology.

FIG. 6 is a circuit diagram showing one configuration example of the lower left FD sharing block 330 in the pixel block 310 in the first embodiment of the present technology.

The FD sharing block 330 includes a connection transistor 421, a reset transistor 422, transfer transistors 423 to 430, photoelectric conversion elements 431 to 438, and an FD 331. Moreover, the FD sharing block 330 includes an amplification transistor 439 and a selection transistor 440.

The connection configuration of elements in the FD sharing block 330 is similar to the connection configuration in the FD sharing block 320. Furthermore, the row selection unit 210 supplies a control signal FDG_b1, a reset signal RST_b1, transfer signals for eight pixels such as a transfer signal TRG_(4, 0), and a selection signal SEL_b1 to the FD sharing block 330.

Figure 7:
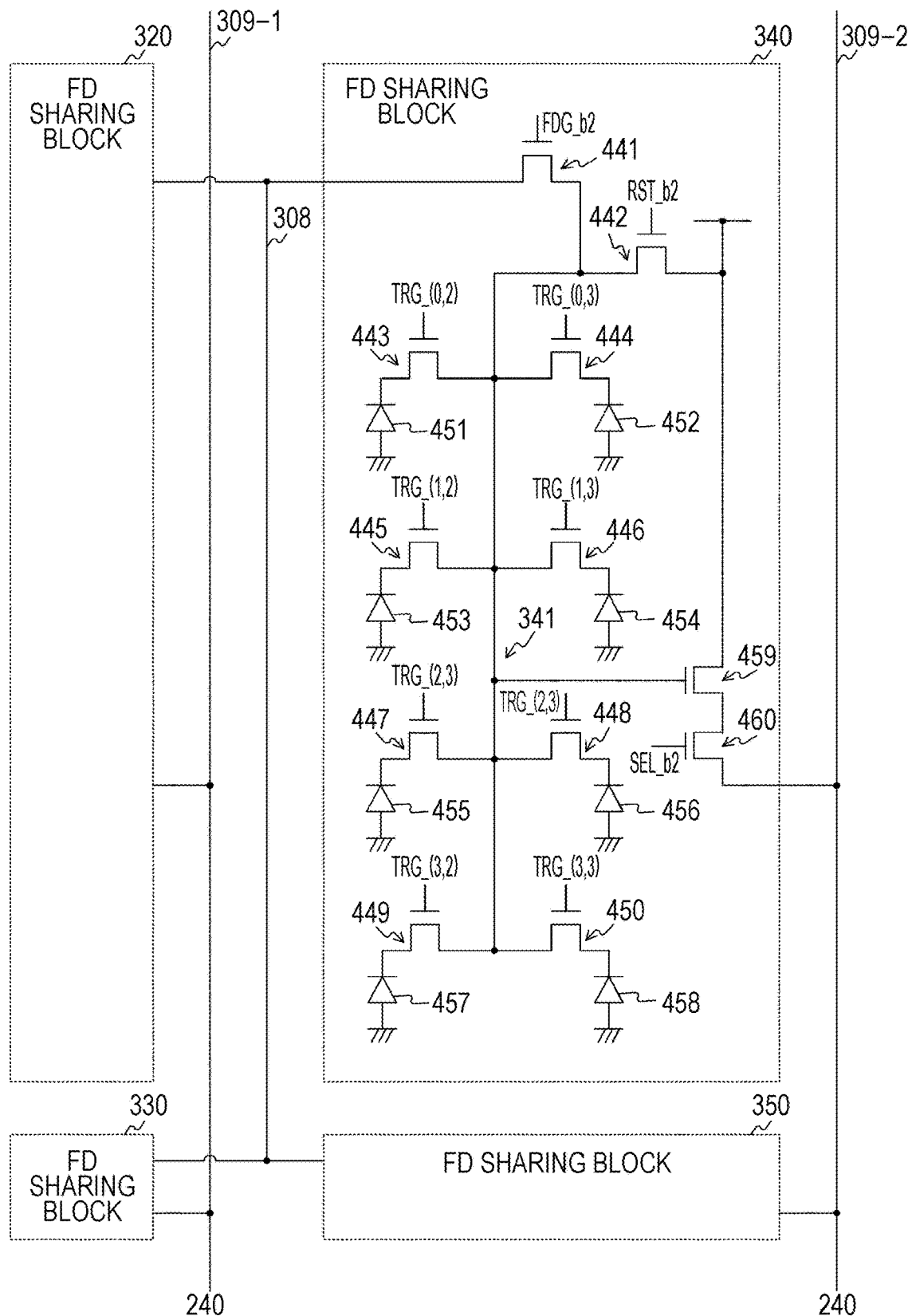
FIG. 7 is a circuit diagram showing one configuration example of an upper right FD sharing block in the pixel block in the first embodiment of the present technology.

FIG. 7 is a circuit diagram showing one configuration example of the upper right FD sharing block 340 in the pixel block 310 in the first embodiment of the present technology.

The FD sharing block 340 includes a connection transistor 441, a reset transistor 442, transfer transistors 443 to 450, photoelectric conversion elements 451 to 458, and an FD 341. Moreover, the FD sharing block 340 includes an amplification transistor 459 and a selection transistor 460.

Figure 8:
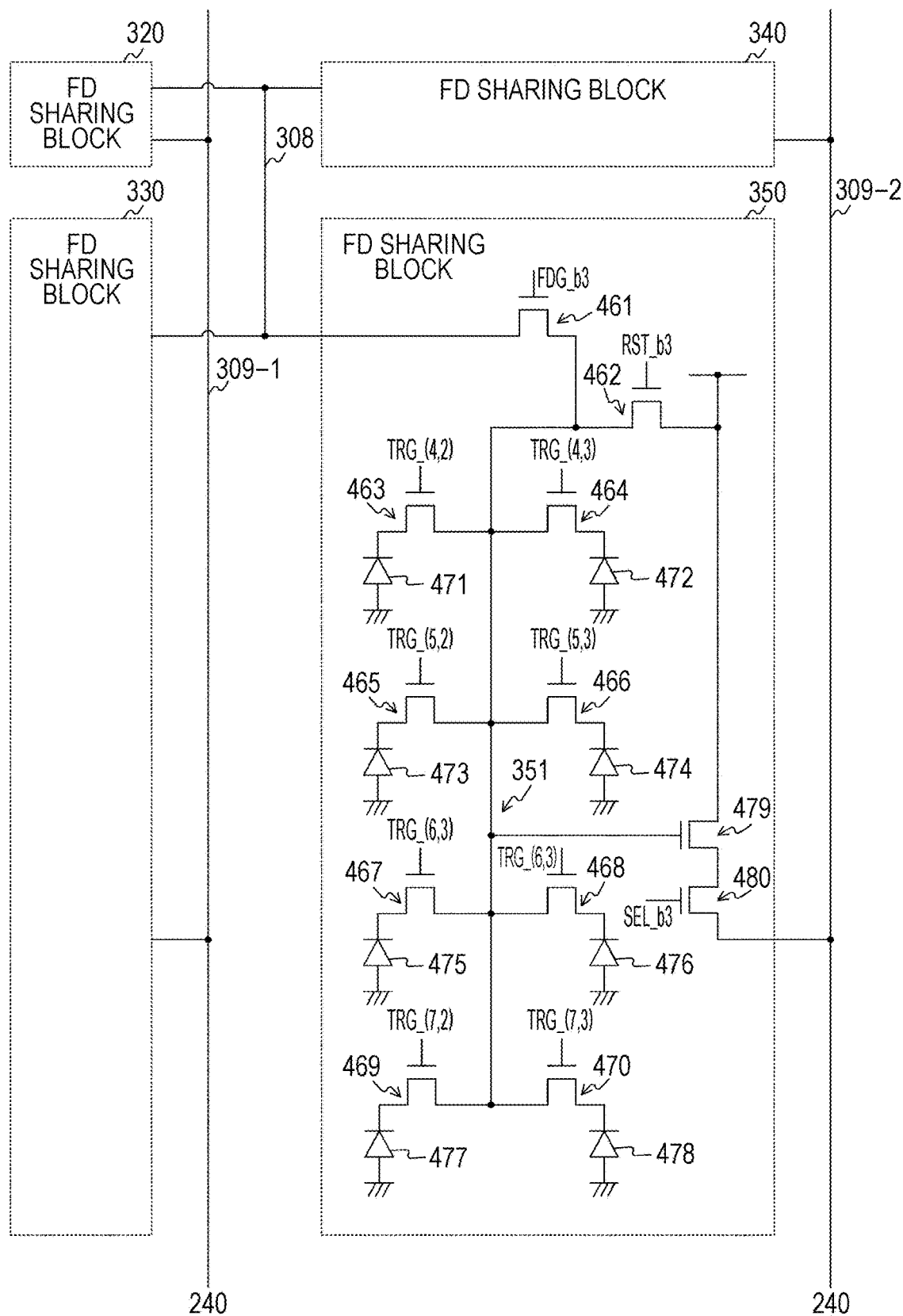
FIG. 8 is a circuit diagram showing one configuration example of a lower right FD sharing block in the pixel block in the first embodiment of the present technology.

The connection configuration of elements in the FD sharing block 340 is similar to the connection configuration in the FD sharing block 320. Furthermore, the row selection unit 210 supplies a control signal FDG_b2, a reset signal RST_b2, transfer signals for eight pixels such as a transfer signal TRG_(0, 2), and a selection signal SEL_b2 to the FD sharing block 340. FIG. 8 is a circuit diagram showing one configuration example of the lower right FD sharing block 350 in the pixel block 310 in the first embodiment of the present technology.

The FD sharing block 350 includes a connection transistor 461, a reset transistor 462, transfer transistors 463 to 470, photoelectric conversion elements 471 to 478, and an FD 351. Moreover, the FD sharing block 350 includes an amplification transistor 479 and a selection transistor 480.

The connection configuration of elements in the FD sharing block 350 is similar to the connection configuration in the FD sharing block 320. Furthermore, the row selection unit 210 supplies a control signal FDG_b3, a reset signal RST_b3, transfer signals for eight pixels such as a transfer signal TRG_(4, 2), and a selection signal SEL_b3 to the FD sharing block 350.

As illustrated in FIGS. 5 to 8, the row selection unit 210 can individually control the connection transistors 401, 421, 441 and 461 to individually connect the FDs 321, 331, 341 and 351 to the FD wire 308. Therefore, the row selection unit 210 can connect two FDs arranged in the horizontal direction or the vertical direction, and can also connect two FDs arranged in the diagonal direction. Therefore, the row selection unit 210 can perform pixel addition on two pixels arranged in the horizontal direction or the vertical direction, and can also perform pixel addition on two pixels arranged in the diagonal direction. Therefore, the row selection unit 210 can improve flexibility of the arrangement direction of a subject of addition.

[Configuration Example of Analog-to-Digital Conversion Unit]

Figure 9:
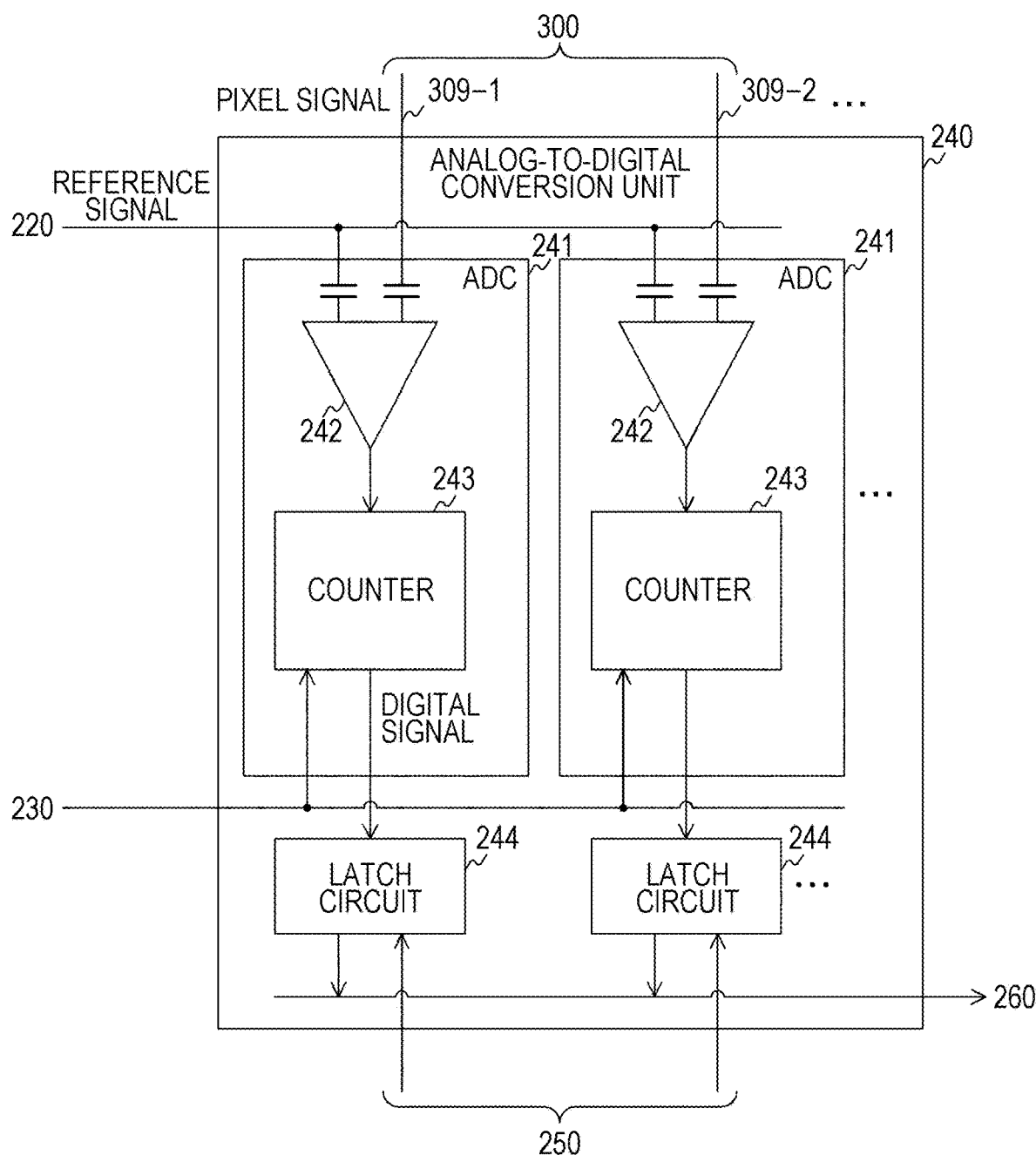
FIG. 9 is a block diagram showing one configuration example of an analog-to-digital conversion unit in the first embodiment of the present technology.

FIG. 9 is a block diagram showing one configuration example of the analog-to-digital conversion unit 240 in the first embodiment of the present technology. In the analog-to-digital conversion unit 240, an analog to digital converter (ADC) 241 and a latch circuit 244 are arranged for each vertical signal line.

The ADC 241 converts an analog pixel signal into a digital signal. The ADC 241 includes a comparator 242 and a counter 243. Such an ADC 241 is called a single-slope ADC.

The comparator 242 compares the reference signal from the DAC 220 with the corresponding pixel signal from the vertical signal line. The comparator 242 supplies the comparison result to the counter 243.

The counter 243 counts a count value in response to control by the timing control circuit 230 over a period until the comparison result is inverted. The counter 243 outputs a signal indicating the count value to the latch circuit 244 as a digital signal.

The latch circuit 244 holds the digital signal. The latch circuit 244 outputs the digital signal to the signal processing unit 260 in synchronization with a synchronization signal from the horizontal transfer scanning unit 250.

Note that an ADC other than the single-slope ADC can be used. For example, a successive approximation register analog to digital converter (SARADC), a delta sigma ADC, a pipeline ADC, or a double integration type ADC can be used.

[Operation Example of Solid-State Image Capturing Element]

FIG. 10 is a diagram showing one example of a control method in a normal mode and a conversion efficiency change mode in the first embodiment of the present technology. Here, the mode of the solid-state image capturing element 200 is set at one of a plurality of modes including the normal mode, the conversion efficiency change mode, and a pixel addition mode. The normal mode is a mode in which the pixel array unit 300 outputs the pixel signal to the analog-to-digital conversion unit 240 without performing any of pixel addition and conversion efficiency change. FIG. 10 assumes a case where attention is paid to the FD 321 corresponding to the control signal FDG_b0, and the conversion efficiency of the FD 321 is changed.

The conversion efficiency change mode is a mode in which the pixel array unit 300 generates the pixel signal by changing the conversion efficiency for converting a charge into a voltage without performing pixel addition, and outputs the pixel signal to the analog-to-digital conversion unit 240. Furthermore, the pixel addition mode is a mode in which the pixel array unit 300 adds a plurality of pixel signals without changing the conversion efficiency and outputs the addition result to the analog-to-digital conversion unit 240.

In the normal mode, the row selection unit 210 turns off all the connection transistors 401, 421, 441, and 461 with the control signals FDG_b0, FDG_b1, FDG_b2, and FDG_b3.

Furthermore, the row selection unit 210 selects a row of the FD sharing blocks, and selects one of the pixels in each of the FD sharing blocks in the row, and sets the selected pixel as a subject of reading. Assuming that the subject of reading is a pixel of the n-th row and m-th column (m and n are integers), the row selection unit 210 supplies a transfer signal TRG_(m, n) to the pixel. Furthermore, the row selection unit 210 supplies a reset signal or a selection signal to the FD sharing block including the pixel of the subject of reading. The analog-to-digital conversion unit 240 performs analog to digital (AD) conversion on the pixel signal for every column of the FD sharing blocks. The row selection unit 210 sequentially selects respective pixels in the FD sharing block, and sequentially selects the rows of the FD sharing blocks to output respective image signals in the pixel array unit 300.

Meanwhile, in the conversion efficiency change mode, the conversion efficiency is set at one of C1 to C4. In a case where the conversion efficiency is set at C1, the row selection unit 210 turns on only the connection transistor 401 with the control signals FDG_b0 to FDG_b3. In a case where the conversion efficiency is set at C2, the row selection unit 210 turns on only the connection transistors 401 and 421 with the control signals FDG_b0 to FDG_b3. Furthermore, in a case where the conversion efficiency is set at C3, the row selection unit 210 turns on the connection transistors 401, 421, and 441 and turns off the remaining connection transistor 461 with the control signals FDG_b0 to FDG_b3. In a case where the conversion efficiency is set at C4, the row selection unit 210 turns on all the connection transistors 401 and 421, 441, and 461 with the control signals FDG_b0 to FDG_b3.

In the conversion efficiency change mode, the transfer signal, the reset signal, and the selection signal to be supplied are similar to the signals in the normal mode. As described above, by turning on or off the connection transistors 401, 421, 441 and 461, any number of the FDs 321, 331, 341 and 351 can be connected to the FD wire 308. Depending on the number of connections, the total capacity of the FD that accumulates a charge or the FD wire varies. Therefore, as illustrated in FIG. 10, by controlling the number of connection transistors 401, 421, 441, and 461 to turn on, the conversion efficiency of converting a charge into a voltage can be changed.

Note that by paying attention to the FDs 331, 341 and 351 corresponding to the control signals FDG_b1, FDG_b2 and FDG_b3, the conversion efficiency of respective FDs can also be controlled. For example, in a case where attention is paid to the FD 331, it is only required to turn on only the connection transistor 421 related to the control signal FDG_b1 and to set the conversion efficiency at C1. In a case where attention is paid to the FD 341, it is only required to turn on only the connection transistor 441 related to the control signal FDG_b2 and to set the conversion efficiency at C1, or to turn on two connection transistors including the connection transistor 441 and to set the conversion efficiency at C2. In a case where attention is paid to the FD 351, it is only required to turn on only the connection transistor 461 related to the control signal FDG_b3 and to set the conversion efficiency at C1. Furthermore, in that case, it is only required to turn on two connection transistors including the connection transistor 461 and to set the conversion efficiency at C2, and to turn on three connection transistors including the connection transistor 441 and to set the conversion efficiency at C3.

FIG. 11 is a diagram showing one example of a control method in the pixel addition mode in the first embodiment of the present technology. In the pixel addition mode, the number of pixels to be added in the pixel block 310 is set at any one of 8 pixels, 16 pixels, 24 pixels, and 32 pixels.

In a case where the number of pixels is set at 8 pixels, the row selection unit 210 turns off all the connection transistors 401, 421, 441, and 461 with the control signals FDG_b0 to FDG_b3. Furthermore, the row selection unit 210 supplies the transfer signal TRG to all pixels in the FD sharing block 320. In FIG. 11, the FD sharing block #0 indicates the FD sharing block 320.

In a case where the number of pixels is set at 16 pixels, the row selection unit 210 turns on only the connection transistors 401 and 421 with the control signals FDG_b0 to FDG_b3. Furthermore, the row selection unit 210 supplies the transfer signal TRG to all pixels in the FD sharing blocks 320 and 330. In FIG. 11, the FD sharing block #1 indicates the FD sharing block 330.

In a case where the number of pixels is set at 24 pixels, the row selection unit 210 turns on the connection transistors 401, 421, and 441 and turns off the remaining connection transistor 461 with the control signals FDG_b0 to FDG_b3. Furthermore, the row selection unit 210 supplies the transfer signal TRG to all pixels in the FD sharing blocks 320, 330, and 340. In FIG. 11, the FD sharing block #2 indicates the FD sharing block 340.

In a case where the number of pixels is set at 32 pixels, the row selection unit 210 turns on all the connection transistors 401, 421, 441, and 461 with the control signals FDG_b0 to FDG_b3. Furthermore, the row selection unit 210 supplies the transfer signal TRG to all pixels in the FD sharing blocks 320, 330, 340, and 350. In FIG. 11, the FD sharing block #3 indicates the FD sharing block 350.

As described above, by turning on or off the connection transistors 401, 421, 441, and 461, arbitrary two or more of the FDs 321, 331, 341, and 351 can be connected via the FD wire 308. Therefore, as illustrated in FIG. 11, the number of pixels of a subject of addition can be changed by controlling the number of connection transistors 401, 421, 441, and 461 to turn on.

Note that although the number of pixels of a subject of addition is switched in units of eight pixels, by changing the number of pixels to supply the transfer signal in units of one pixel, it is also possible to switch in units of one pixel.

Figure 12:
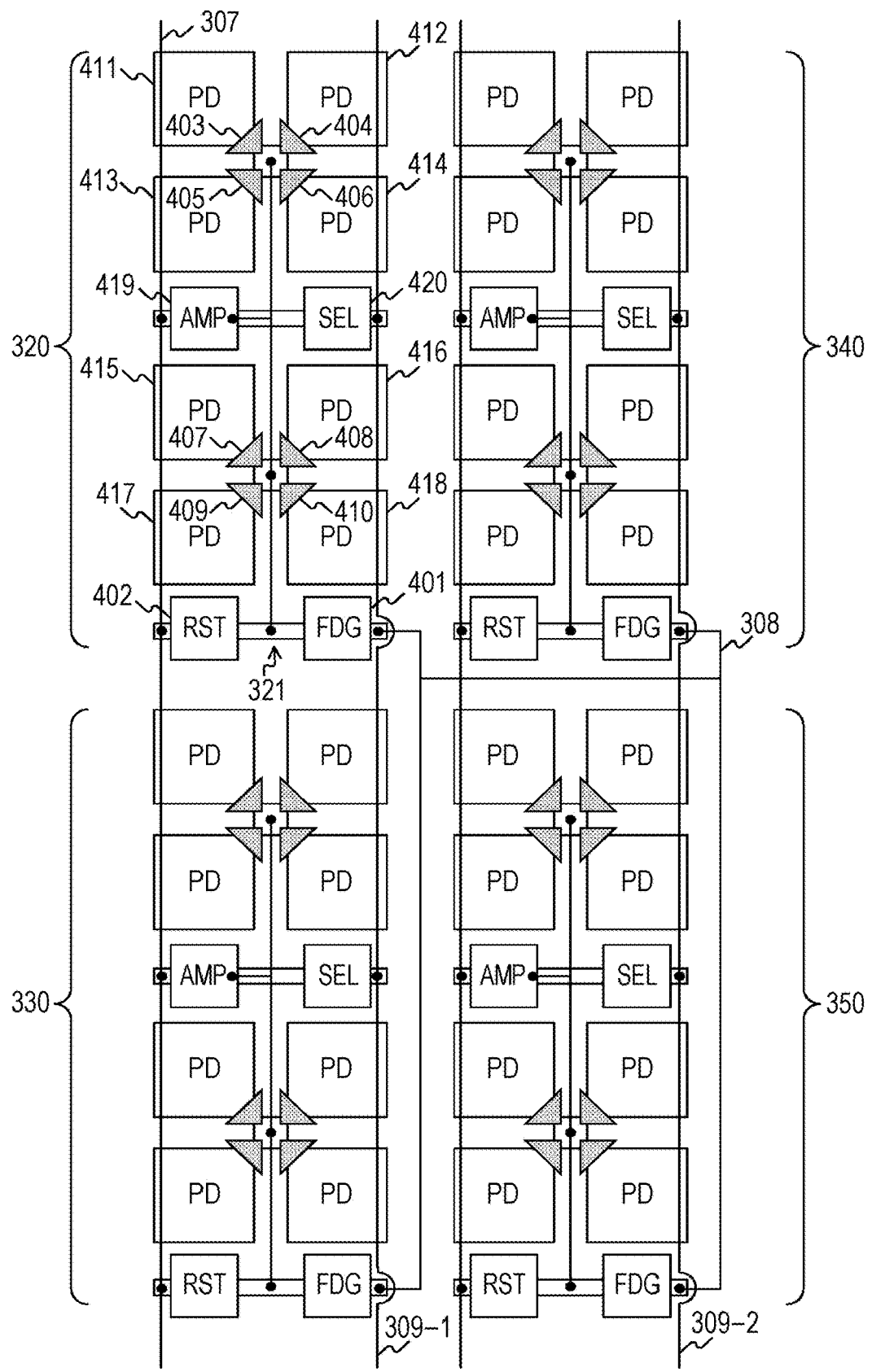
FIG. 12 is a plan view showing one example of a layout of elements and wires of the pixel array unit in the first embodiment of the present technology.

FIG. 12 is a plan view showing one example of a layout of elements and wires of the pixel array unit 300 in the first embodiment of the present technology. FIG. 12 is a plan view in a case where viewed from the optical axis direction. In the FD sharing block 320, the photoelectric conversion elements 411 to 418 are arranged in four rows×two columns.

The transfer transistors 403 to 406 are arranged around the central node of the photoelectric conversion elements 411 to 414. The transfer transistors 407 to 410 are arranged around the central node of the photoelectric conversion elements 415 to 418. These nodes are connected to the FD 321.

Furthermore, the amplification transistor 419 and the selection transistor 420 are disposed in the horizontal direction between the photoelectric conversion elements 411 to 414 and the photoelectric conversion elements 415 to 418. In FIG. 12, "AMP" represents the amplification transistor 419, and "SEL" represents the selection transistor 420.

The reset transistor 402 and the connection transistor 401 are disposed in the horizontal direction between the photoelectric conversion elements 415 to 418 and the FD sharing block 330. The reset transistor 402 is disposed on the left side, and the connection transistor 401 is disposed on the right side. In FIG. 12, "RST" represents the reset transistor 402, and "FDG" represents the connection transistor 401.

Furthermore, a power supply line 307 is installed on the left side of the FD sharing block 320, and the vertical signal line 309-1 is installed on the right side. The layout of each of the FD sharing blocks 330, 340, and 350 is similar to the layout of the FD sharing block 320. Furthermore, the connection transistors of respective FD sharing blocks are connected via the FD wire 308. Since the FD wire 308 affects characteristics of pixels, a shield may be required in some cases.

As illustrated in FIG. 12, in the horizontal direction, the reset transistor (RST) is disposed between the connection transistor (FDG) of the FD sharing block 320 and the connection transistor (FDG) of the FD sharing block 340. Furthermore, in the vertical direction, the selection transistor (SEL) is disposed between the connection transistor (FDG) of the FD sharing block 320 and the connection transistor (FDG) of the FD sharing block 330.

Figure 13:
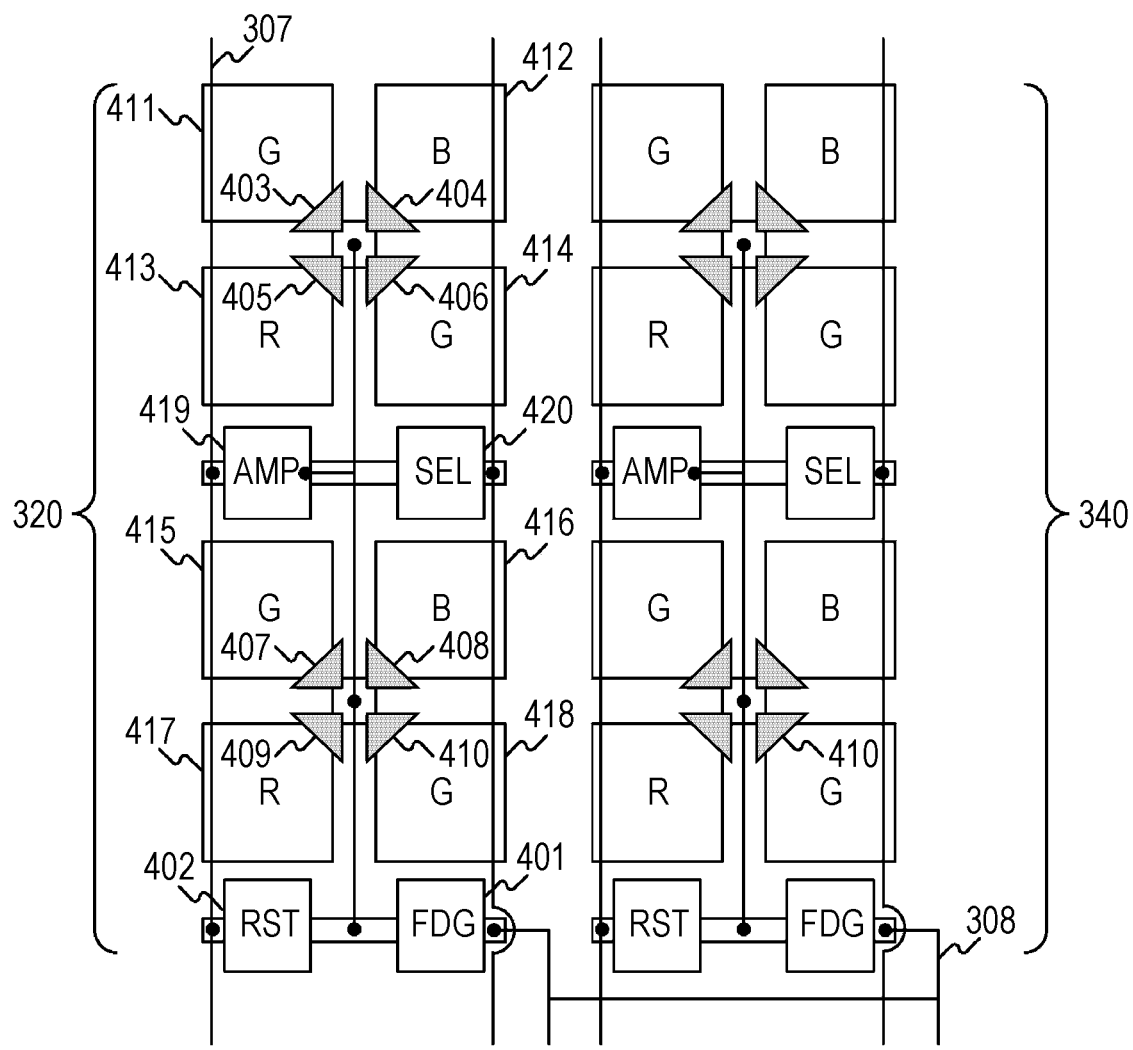
FIG. 13 is a plan view showing one example of the Bayer array in the first embodiment of the present technology.

FIG. 13 is a plan view showing one example of the Bayer array in the first embodiment of the present technology. A green color filter is provided above the photoelectric conversion elements 411, 414, 415 and 418. "G" in FIG. 13 represents the green color filter. A blue color filter is provided above the photoelectric conversion elements 412 and 416. "Blue (B)" in FIG. 13 represents the blue color filter. A red color filter is provided above the photoelectric conversion elements 413 and 417. "Red (R)" in FIG. 13 represents the red color filter. The arrangement of the color filters other than the FD sharing block 320 is similar to the arrangement of the color filters of the FD sharing block 320. The arrangement of the color filters illustrated in FIG. 13 constitutes the Bayer array. Note that the color of the color filters is not limited to R, G, and B, and may be a complementary color.

Even in the Bayer array as shown in FIG. 13, a flexible operation such as oblique addition may be required. For example, in a configuration in which FDs are not shared, a strong constraint is placed on pixel addition in a case where it is desired to increase the conversion efficiency or in a case where the pixel size is large. However, the circuits illustrated in FIGS. 5 to 8 enable flexible pixel addition.

Figure 14:
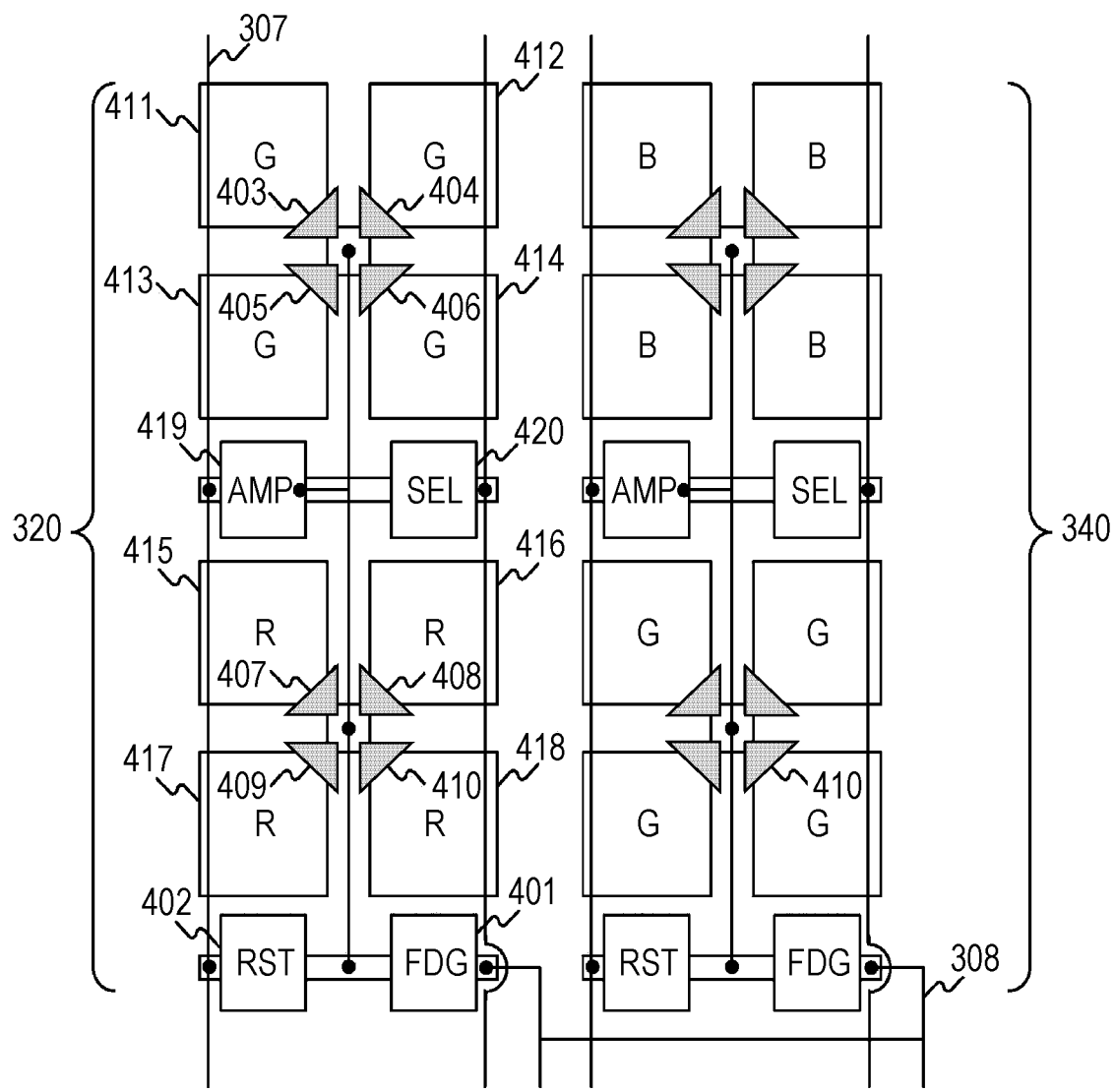
FIG. 14 is a plan view showing one example of an arrangement other than the Bayer array in the first embodiment of the present technology.
Figure 15:
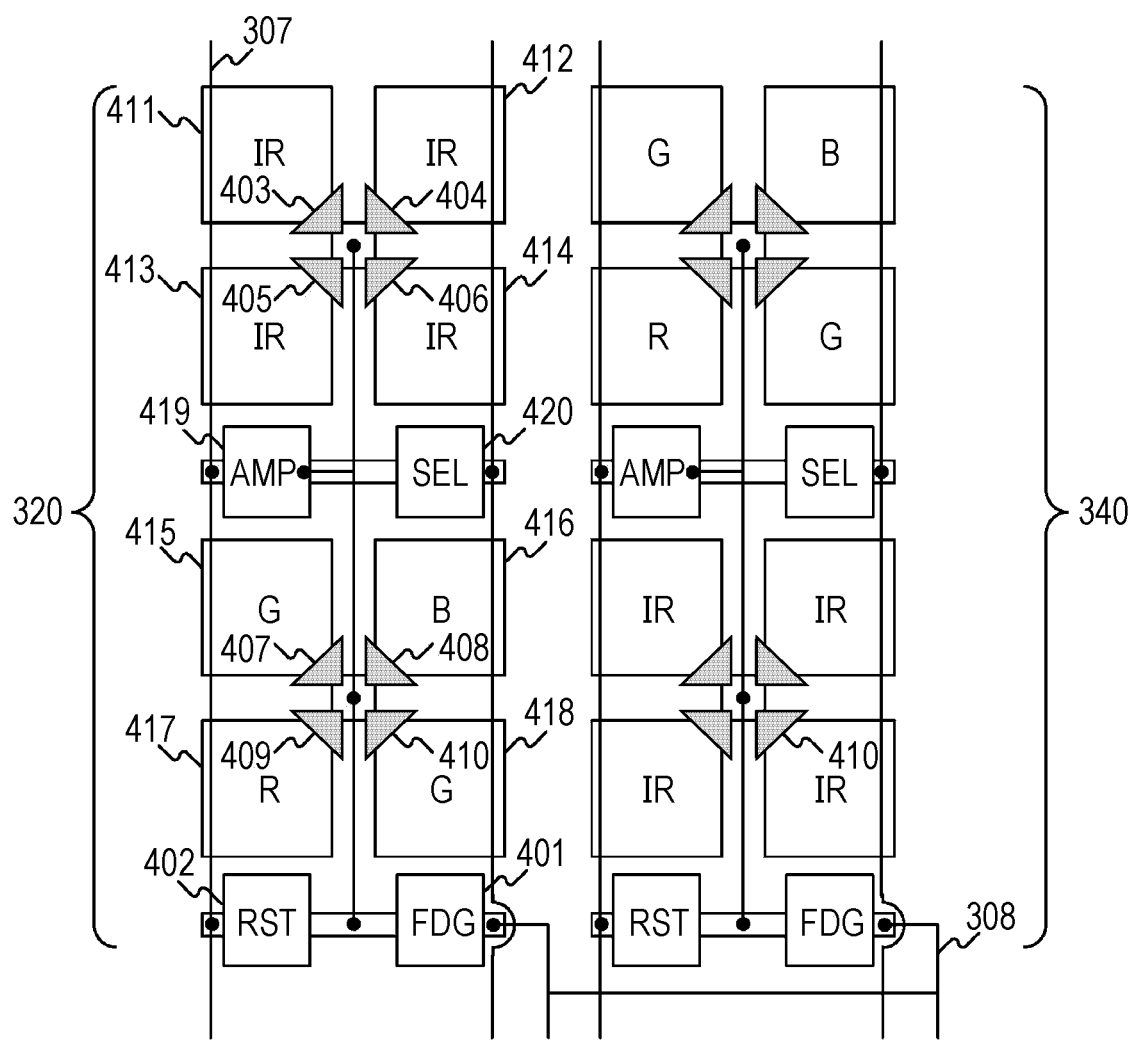
FIG. 15 is a plan view showing one example of an arrangement including infrared (IR) pixels in the first embodiment of the present technology.

Furthermore, arrangement other than the Bayer array can be used. For example, as illustrated in FIG. 14, it is also possible to arrange blocks of 2 rows×2 columns of G pixels in the diagonal direction, and to arrange blocks of 2 rows×2 columns of B pixels and 2 rows×2 columns of R pixels in the other region. Furthermore, as illustrated in FIG. 15, IR pixels provided with a near-infrared light filter can be further arranged. As illustrated in FIG. 15, since the IR pixels are sometimes arranged in the diagonal direction, there is an advantage that pixel addition can be performed especially in the diagonal direction.

Figure 16:
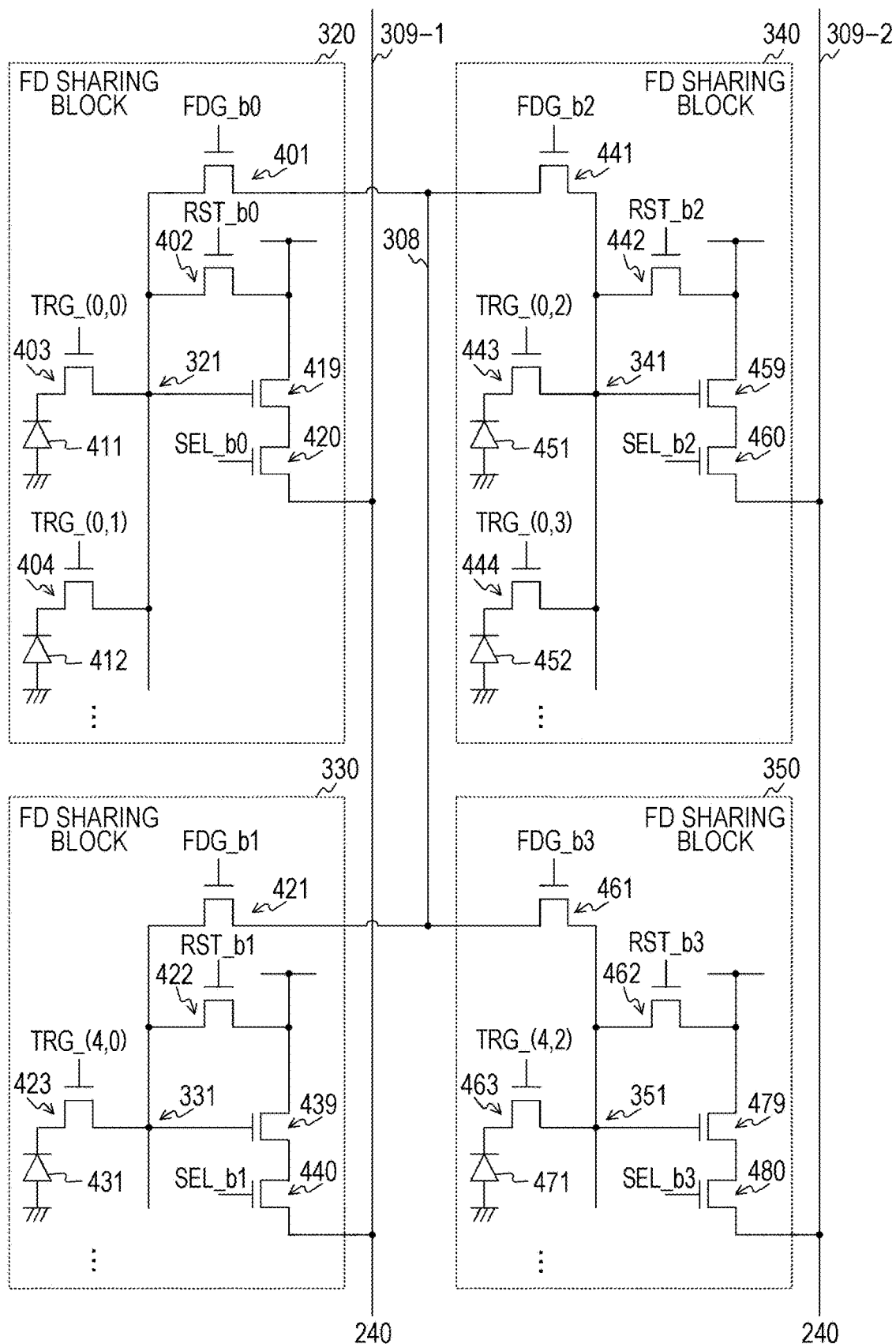
FIG. 16 is a circuit diagram showing one configuration example of the pixel block in the first embodiment of the present technology.

FIG. 16 is a circuit diagram showing one configuration example of the pixel block 310 in the first embodiment of the present technology. When attention is paid to the FDs, the FDs 321 and 331 are arranged in the vertical direction. Furthermore, the FDs 341 and 351 are arranged in the vertical direction at positions adjacent to the FDs 321 and 331 in the horizontal direction. Note that the FDs 321 and 331 are one example of the pair of first floating diffusion layers described in the claims, and the FDs 341 and 351 are one example of the pair of second floating diffusion layers described in the claims. Furthermore, the connection transistor 401 connects the FD 321 to the FD wire 308 according to the control signal FDG_b0. The connection transistor 421 connects the FD 331 to the FD wire 308 according to the control signal FDG_b1. The connection transistor 441 connects the FD 341 to the FD wire 308 according to the control signal FDG_b2. The connection transistor 461 connects the FD 351 to the FD wire 308 according to the control signal FDG_b3.

Note that the connection transistor 401 is one example of the first connection transistor described in the claims, and the connection transistor 421 is one example of the second connection transistor described in the claims. Furthermore, the connection transistor 441 is one example of the third connection transistor described in the claims, and the connection transistor 461 is one example of the fourth connection transistor described in the claims.

Note that, as described above, the number of pixels in each of the FD sharing blocks is not limited to eight pixels, and may be two pixels or the like. Furthermore, each of the FDs 321, 331, 341 and 351 is shared by a plurality of pixels, but a configuration in which the FDs are not shared may be adopted. In this case, for each of the FDs 321, 331, 341 and 351, only one set of the photoelectric conversion element and the transfer transistor is provided. Furthermore, in a case where the FDs are not shared, the number of pixels in the pixel block 310 is 4 pixels of 2 rows×2 columns.

Figure 17:
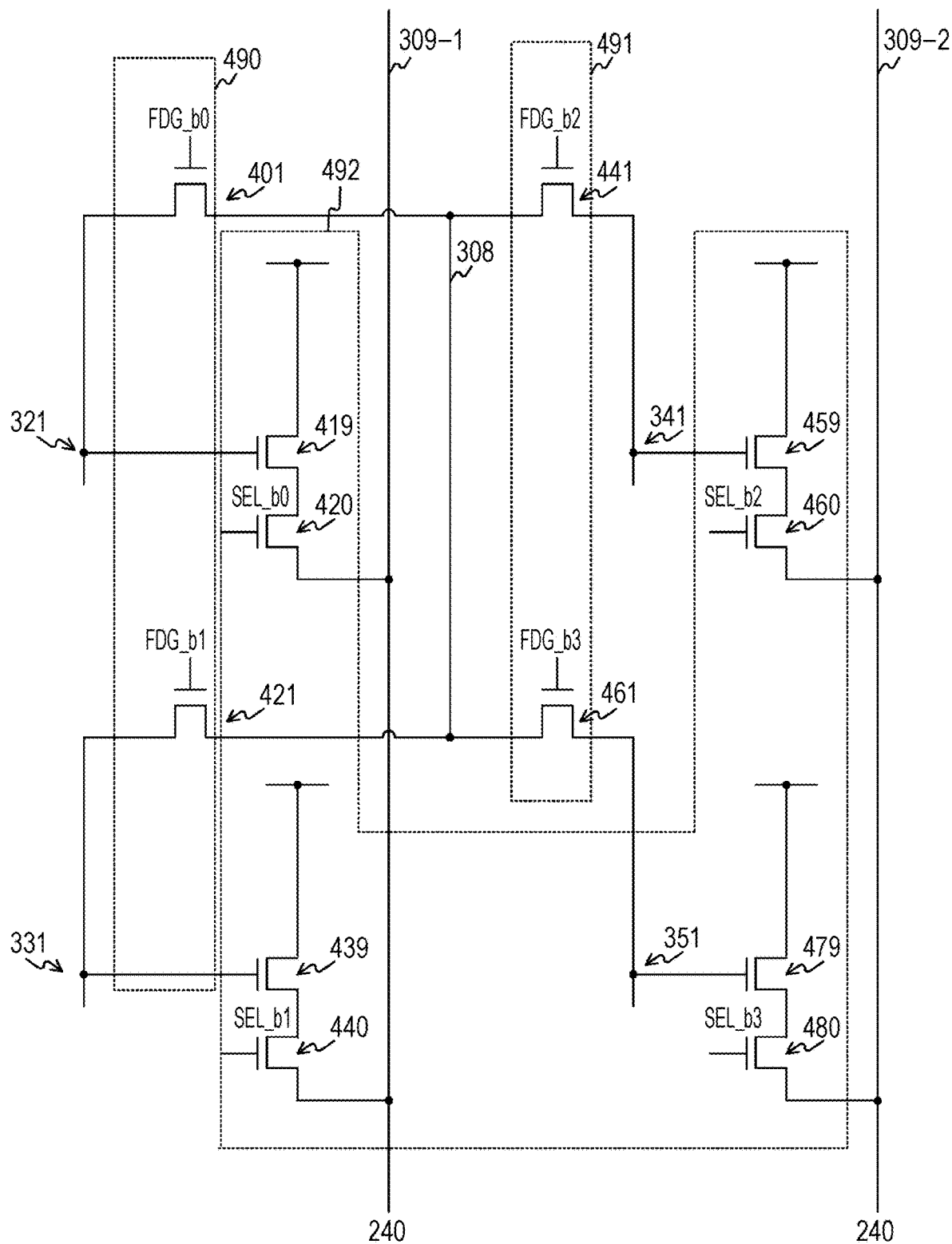
FIG. 17 is a simplified diagram of the circuit diagram of the pixel block in the first embodiment of the present technology.

FIG. 17 is a simplified circuit diagram of the pixel block 310 in the first embodiment of the present technology. A connection circuit 490 including the connection transistors 401 and 421 selects at least one of the FD 321 or 331 and connects to the FD wire 308 according to the control signals FDG_b0 and FDG_b1.

A connection circuit 491 including the connection transistors 441 and 461 selects at least one of the FD 341 or 351 and connects to the FD wire 308 according to the control signals FDG_b2 and FDG_b3. Furthermore, an output circuit 492 including the amplification transistors 419, 439, 459 and 479 and the selection transistors 420, 440, 460 and 480 outputs a signal according to an amount of charge of at least one of the FDs 321, 331, 341 and 351.

Figure 18:
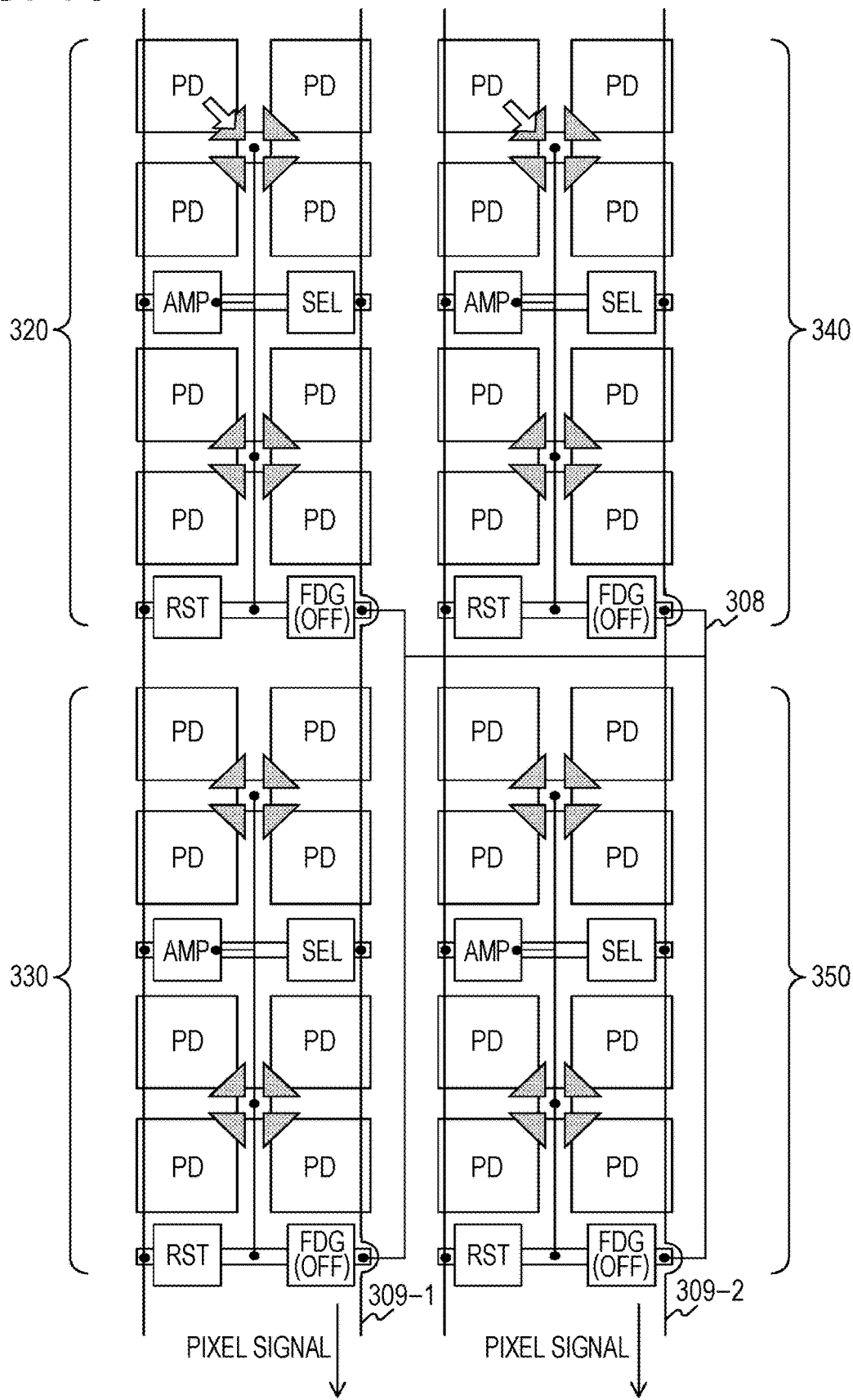
FIG. 18 is a diagram for describing a reading method in the normal mode in the first embodiment of the present technology.

FIG. 18 is a diagram for describing a reading method in the normal mode in the first embodiment of the present technology. In the normal mode, the row selection unit 210 turns off all the connection transistors (FDGs) of each of the FD sharing blocks 320, 330, 340, and 350. Furthermore, the row selection unit 210 selects a row of the FD sharing blocks, and selects one of the pixels (most upper left pixel or the like) in each of the FD sharing blocks in the row, and sets the selected pixel as a subject of reading. The row selection unit 210 supplies the pixel with the transfer signal TRG. With this operation, the pixel signal is output from the vertical signal line 309-1 or 309-2.

Figure 19:
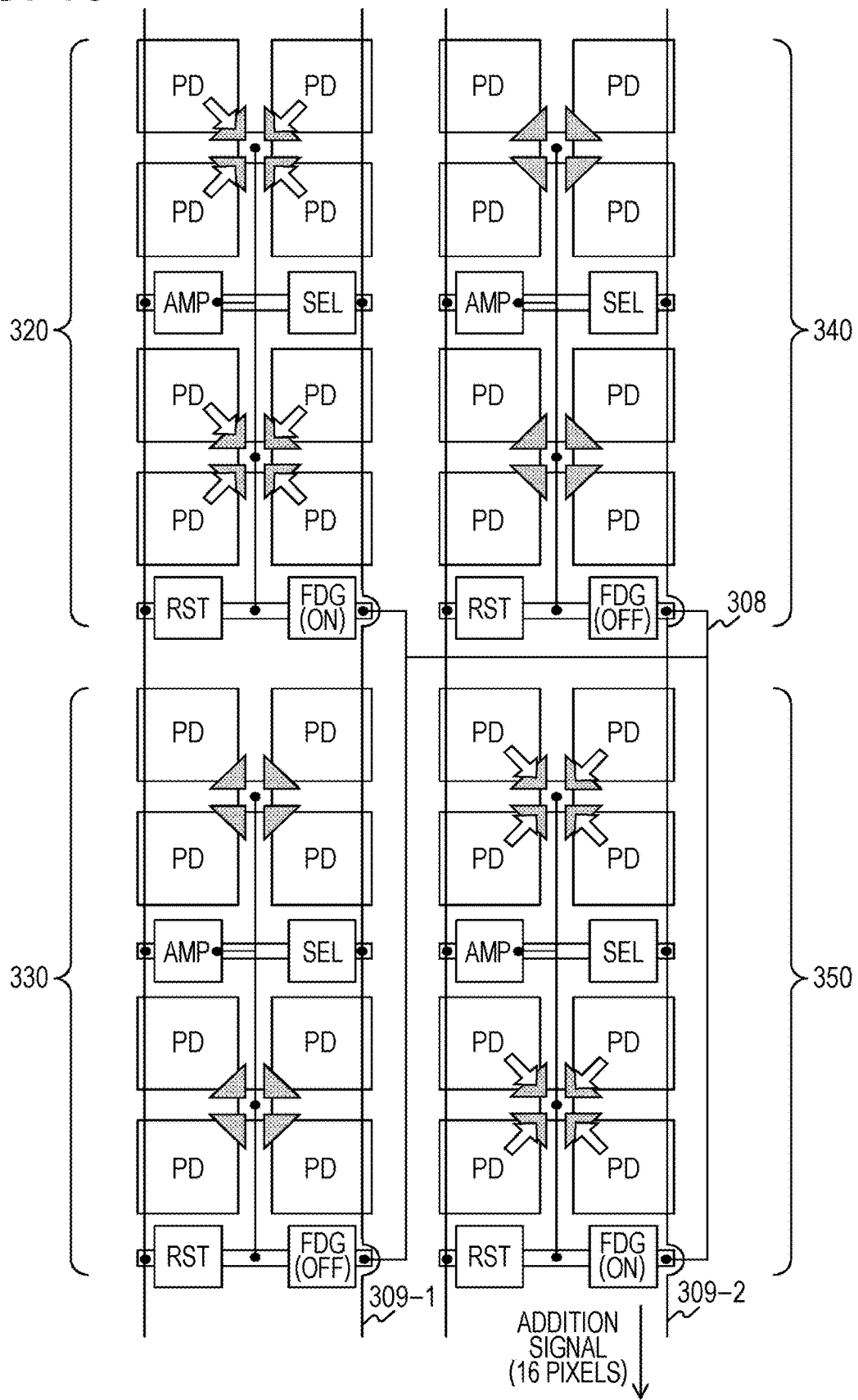
FIG. 19 is a diagram for describing the reading method in the pixel addition mode of 16 pixels in the first embodiment of the present technology.

FIG. 19 is a diagram for describing the reading method in the pixel addition mode of 16 pixels in the first embodiment of the present technology.

The row selection unit 210 turns on the connection transistors (FDG), for example, only in the upper left FD sharing block 320 and the lower right FD sharing block 350. Furthermore, the row selection unit 210 supplies the transfer signal TRG to all pixels in the FD sharing blocks 320 and 350. With this operation, for example, the addition signal for 16 pixels is output from the vertical signal line 309-2. With pixel addition, a reading speed can be improved and a vertical blanking period can be shortened. At this time, the selection transistor of the FD sharing block 350 is turned on. Furthermore, the selection transistor of the FD sharing block 360 (see FIG. 23) in which the FD is not shared with the adjacent FD sharing blocks 320 to 350 may be turned on. In that case, signals of the FD sharing block 360 can be simultaneously read from the vertical signal line 309-1. With this operation, unused vertical signal lines can be utilized, and the reading speed can be improved.

In this way, according to the first embodiment of the present technology, since four FD transistors connect respective four FDs individually to the FD wire 308, two pixels arranged in the diagonal direction in addition to the horizontal direction and the vertical direction can also be set as a subject of addition. Therefore, the row selection unit 210 can improve flexibility of the arrangement direction of a subject of addition.

<First Modification>

In the first embodiment described above, the reset transistor has been disposed between the two connection transistors in the horizontal direction. In this layout, it is necessary to install the FD wire 308 for each column of the FD sharing blocks. A solid-state image capturing element 200 in the first modification of the first embodiment differs from the solid-state image capturing element 200 of the first embodiment in that the layout of the transistors in the horizontal direction is changed and the number of wires is reduced.

Figure 20:
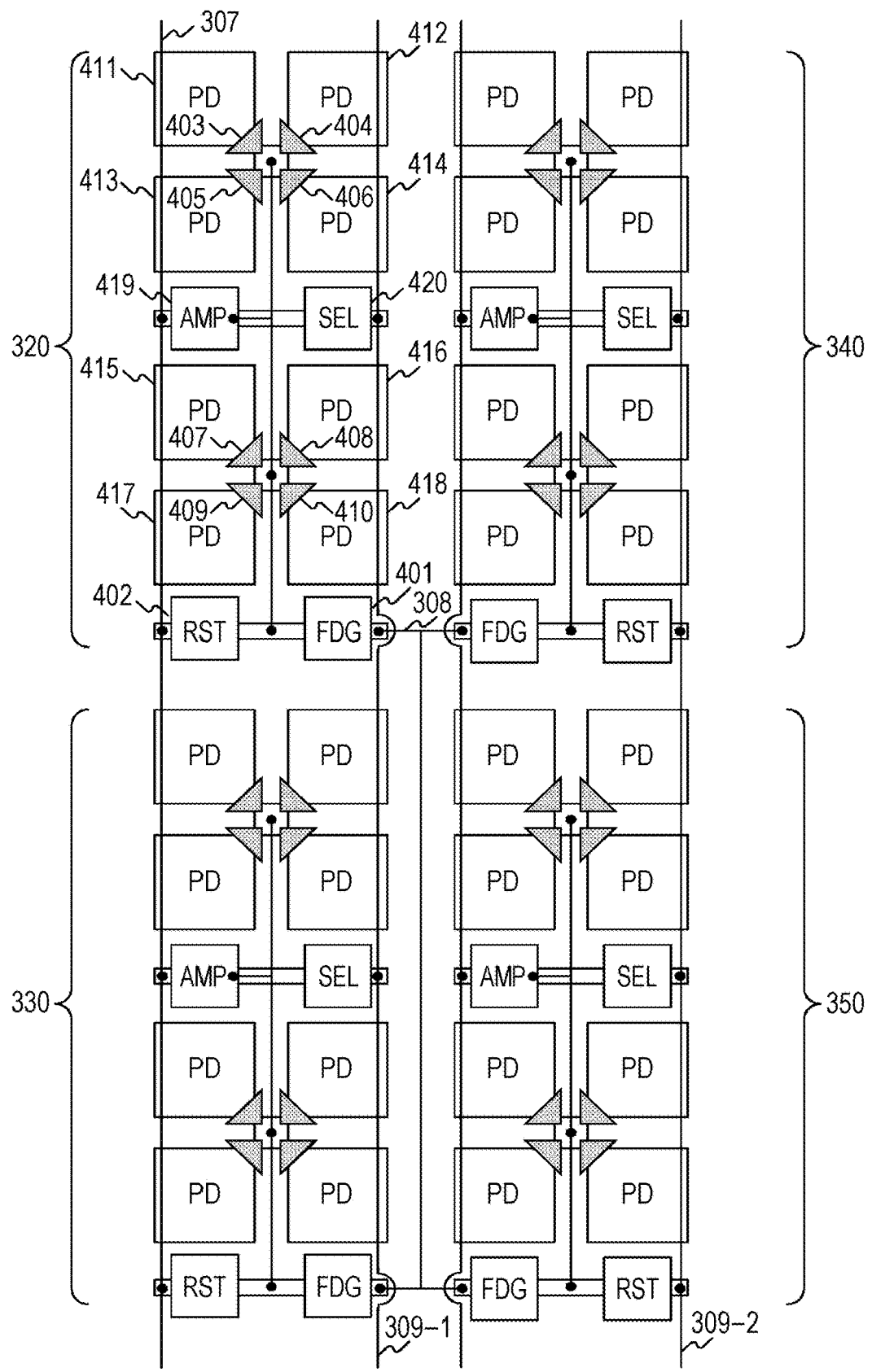
FIG. 20 is a plan view showing one example of a layout of elements and wires in a pixel array unit in a first modification of the first embodiment of the present technology.

FIG. 20 is a plan view showing one example of the layout of elements and wires of a pixel array unit 300 in the first modification of the first embodiment of the present technology. The layout of the first modification of the first embodiment differs from the layout of the first embodiment in that the column of the right blocks in the layout of the first embodiment is flipped horizontally. In the horizontally flipped pixel array unit 300, two connection transistors (FDGs) are disposed adjacently in the horizontal direction. With this configuration, in the vertical direction, two columns of the FD sharing blocks can share one FD wire 308 installed between the two columns. Therefore, the number of wires in the vertical direction can be smaller than in the first embodiment in which the FD wire 308 is installed for each column. Then, by reducing the number of wires, a shield area can be reduced and the conversion efficiency can be improved. Note that since high conversion efficiency is not always desirable, an optimum value is set during design.

In this way, in the first modification of the first embodiment of the present technology, since two connection transistors are disposed adjacently in the horizontal direction, two columns can share one FD wire 308. With this configuration, the number of wires in the vertical direction can be reduced.

<Second Modification>

In the first embodiment described above, the selection transistor has been disposed between two connection transistors in the vertical direction. With this layout, it is difficult to reduce the wiring distance of the FD wire 308. A solid-state image capturing element 200 in the second modification of the first embodiment differs from the solid-state image capturing element 200 of the first embodiment in that the layout of the transistors in the vertical direction is changed and the wiring distance is reduced.

Figure 21:
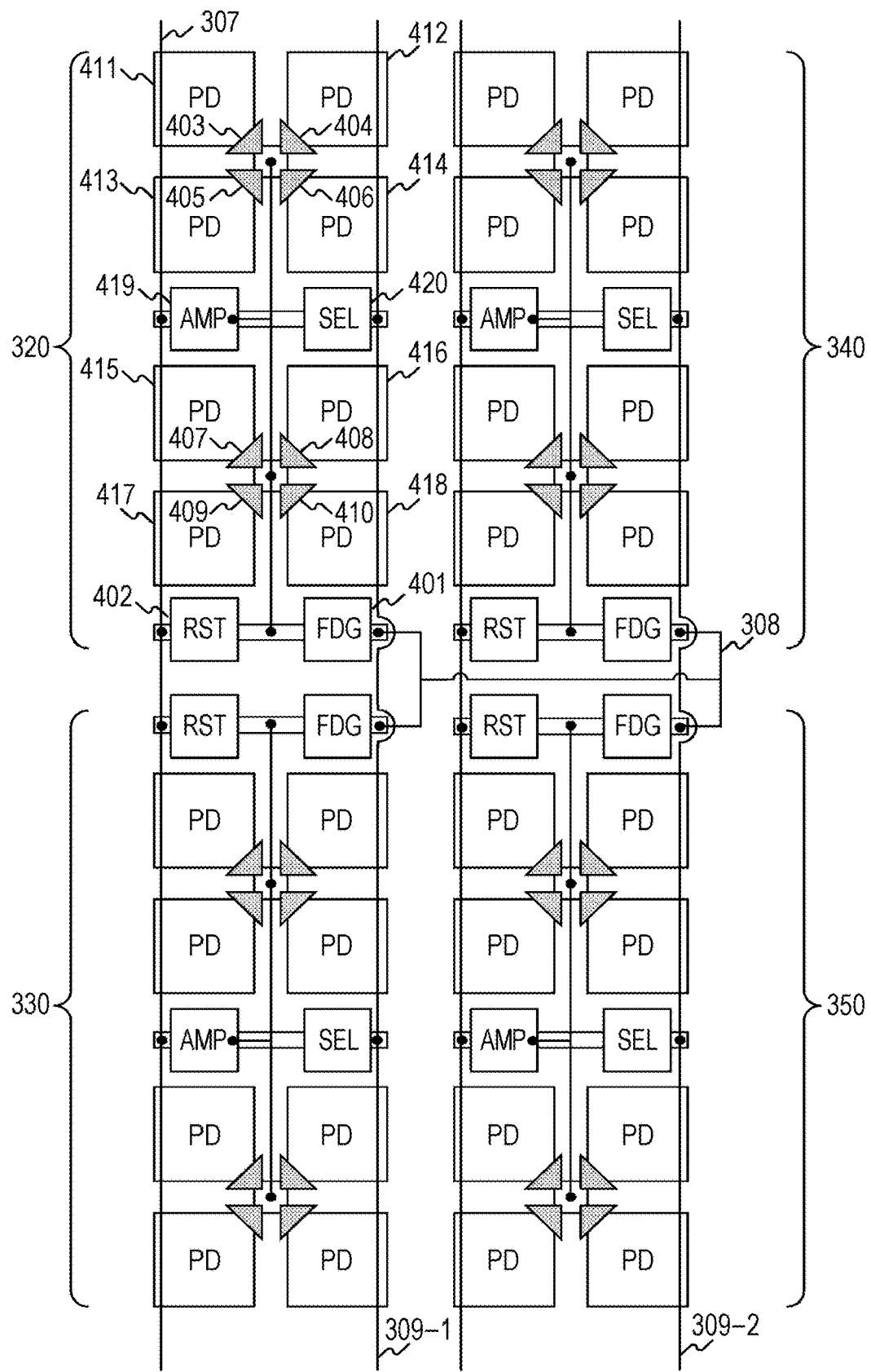
FIG. 21 is a plan view showing one example of a layout of elements and wires in a pixel array unit in a second modification of the first embodiment of the present technology.

FIG. 21 is a plan view showing one example of the layout of elements and wires in a pixel array unit 300 in the second modification of the first embodiment of the present technology. The layout of the second modification of the first embodiment differs from the layout of the first embodiment in that rows of lower blocks in the layout of the first embodiment is flipped vertically. In the vertically flipped pixel array unit 300, two connection transistors (FDGs) are disposed adjacently in the vertical direction. With this configuration, the vertical wiring distance of the FD wire 308 can be reduced.

In this way, in the second modification of the first embodiment of the present technology, since two connection transistors are disposed adjacently in the vertical direction, the wiring distance of the FD wire 308 in the vertical direction can be reduced.

<Third Modification>

In the second modification of the first embodiment described above, the reset transistor has been disposed between the two connection transistors in the horizontal direction. With this layout, it is difficult to reduce the wiring distance of the FD wire 308. A solid-state image capturing element 200 in the third modification of the first embodiment differs from the solid-state image capturing element 200 of the second modification of the first embodiment in that the layout of transistors in the horizontal direction is changed and the wiring distance is reduced.

Figure 22:
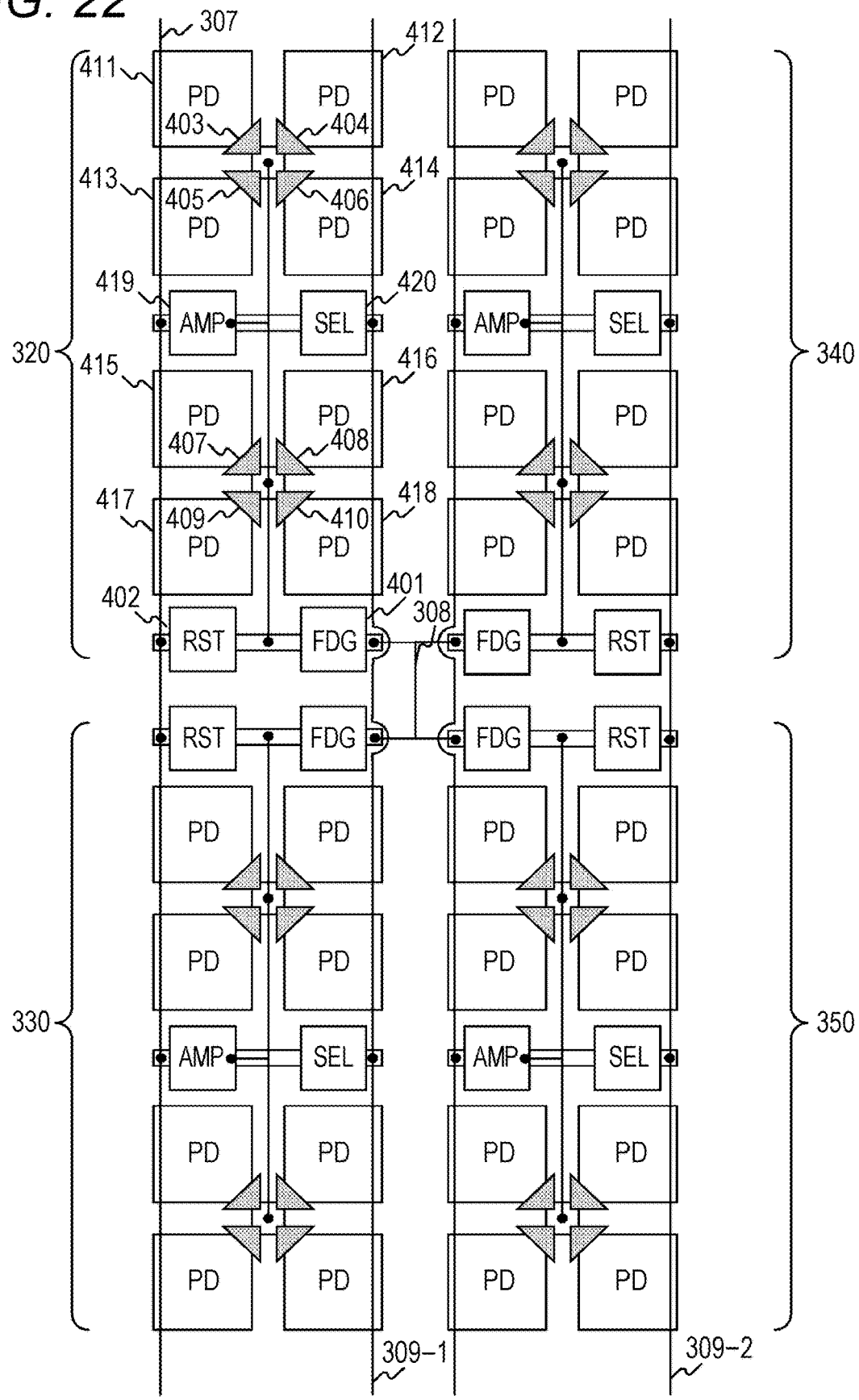
FIG. 22 is a plan view showing one example of a layout of elements and wires in a pixel array unit in a third modification of the first embodiment of the present technology.

FIG. 22 is a plan view showing one example of the layout of elements and wires in a pixel array unit 300 in the third modification of the first embodiment of the present technology. The layout of the third modification of the first embodiment differs from the layout of the second modification of the first embodiment in that columns of right blocks in the layout of the second modification of the first embodiment is flipped horizontally. In the horizontally flipped pixel array unit 300, two connection transistors (FDGs) are disposed adjacently in the horizontal direction. With this configuration, the horizontal wiring distance of the FD wire 308 can be further reduced.

In this way, in the third modification of the first embodiment of the present technology, since two connection transistors are disposed adjacently in the horizontal direction, the wiring distance of the FD wire 308 in the horizontal direction can be reduced.

2. Second Embodiment

In the first embodiment described above, pixel addition is performed on maximum 32 pixels. However, there are cases where addition of more pixels may be required. A solid-state image capturing element 200 of the second embodiment differs from the solid-state image capturing element 200 of the first embodiment in that the number of pixels to be added is increased by adding connection transistors.

Figure 23:
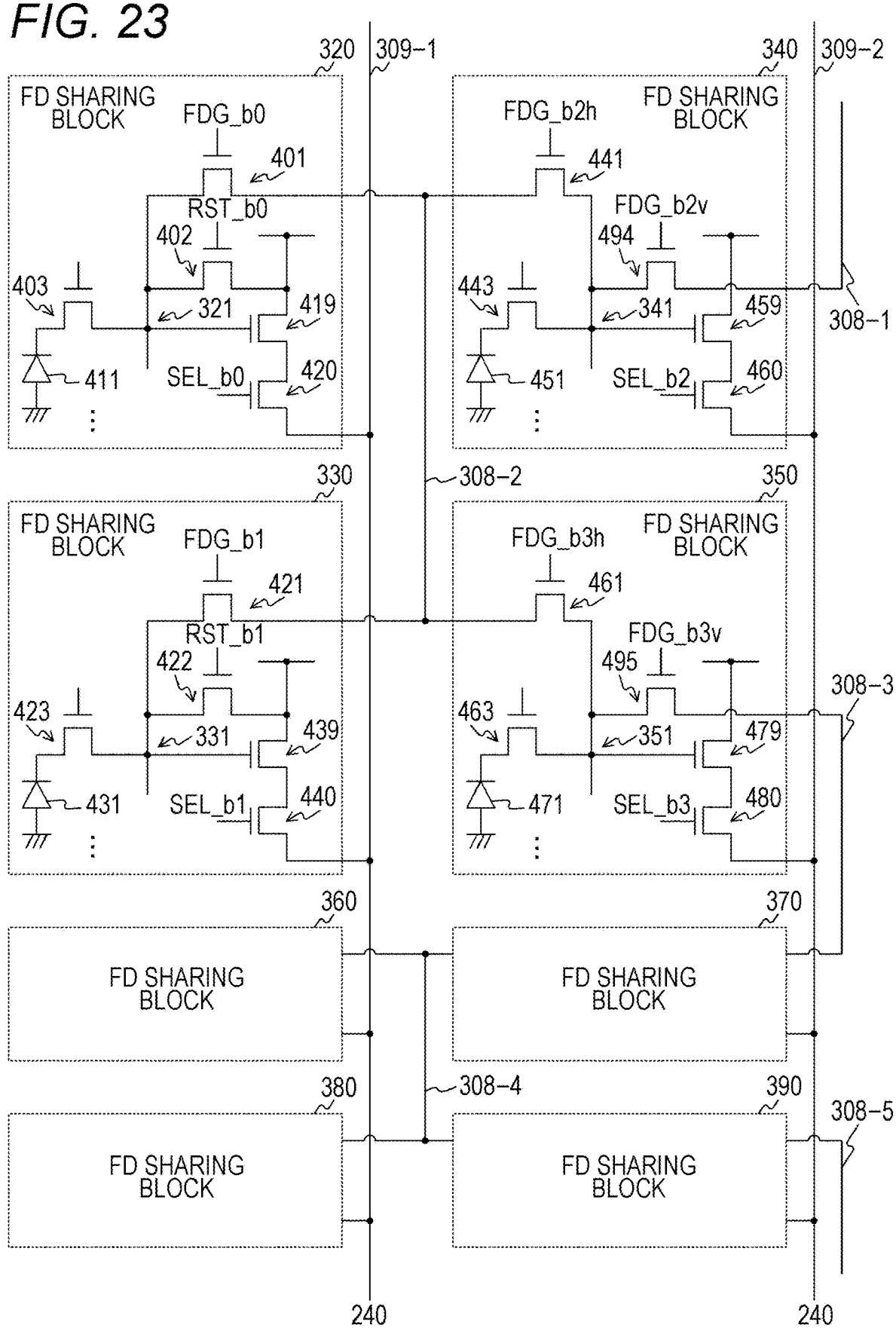
FIG. 23 is a circuit diagram showing one configuration example of a pixel array unit in a second embodiment of the present technology.

FIG. 23 is a circuit diagram showing one configuration example of a pixel array unit 300 in the second embodiment of the present technology. It is assumed that FD sharing blocks 360, 370, 380 and 390 are arranged below FD sharing blocks 320, 330, 340 and 350.

The configuration of the left FD sharing blocks 320 and 330 in the second embodiment is similar to the configuration in the first embodiment. Meanwhile, the right FD sharing blocks 340 and 350 in the second embodiment differ from the FD sharing blocks 340 and 350 in the first embodiment in that connection transistors 494 and 495 are provided instead of reset transistors 442 and 462.

Furthermore, the FD sharing block 340 and an FD sharing block (not shown) above the FD sharing block 340 are connected to an FD wire 308-1. The FD sharing blocks 320, 330, 340 and 350 are connected to an FD wire 308-2. The FD sharing block 350 and the FD sharing block 370 are connected to an FD wire 308-3. The FD sharing blocks 360, 370, 380 and 390 are connected to an FD wire 308-4. The FD sharing block 390 and an FD sharing block (not shown) below the FD sharing block 390 are connected to an FD wire 308-5.

The connection transistor 494 connects an FD 341 to the FD wire 308-1 according to a control signal FDG_b2v from a row selection unit 210. Furthermore, a control signal FDG_b2h is supplied to a connection transistor 441 of the second embodiment. Note that the connection transistor 494 is one example of the fourth connection transistor described in the claims.

The connection transistor 495 connects an FD 351 to the FD wire 308-3 according to a control signal FDG_b3v from the row selection unit 210. Furthermore, a control signal FDG_b3h is supplied to a connection transistor 461 of the second embodiment. Note that the connection transistor 495 is one example of the fifth connection transistor described in the claims.

Note that a reset transistor 402 is shared by the FD sharing blocks 320 and 340. A reset transistor 422 is shared by the FD sharing blocks 330 and 350.

The configuration of the FD sharing blocks 360, 370, 380 and 390 is similar to the configuration of the FD sharing blocks 320, 330, 340 and 350.

By turning on the connection transistor 494, pixels in the FD sharing block 340 and pixels in the FD sharing block above the FD sharing block 340 can be added. Furthermore, by turning on the connection transistor 495, pixels in the FD sharing block 350 and pixels in the FD sharing block 370 below the FD sharing block 350 can be added. With this configuration, pixels more than 32 pixels can be added. For example, all the pixels (64 pixels) in the FD sharing blocks 320, 330, 340, 350, 360, 370, 380 and 390 can be added. Furthermore, since the pixels in the 4 blocks such as the FD sharing blocks 360, 370, 380, and 390 can be added to pixels outside the four blocks, flexibility of pixel addition can be further improved.

Figure 24:
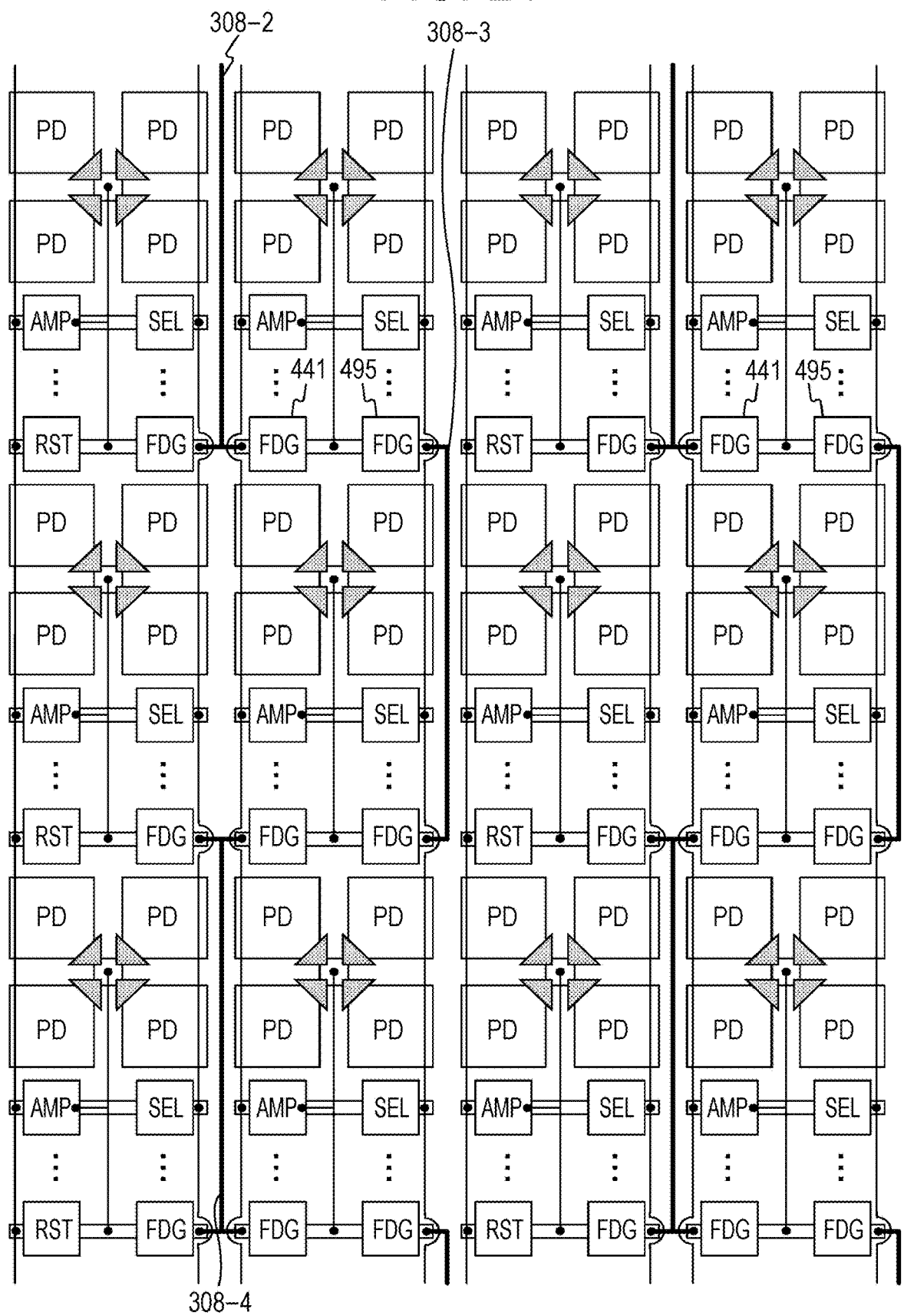
FIG. 24 is a plan view showing one example of a layout of elements and wires in the pixel array unit in the second embodiment of the present technology.

FIG. 24 is a plan view showing one example of the layout of elements and wires in the pixel array unit 300 in the second embodiment of the present technology.

As illustrated in FIG. 24, in the vertical direction, a plurality of FD wires such as the FD wires 308-2, 308-3, and 308-4 is installed in a zigzag manner. In a column of FD sharing blocks on the right side of the FD wire 308-2, the connection transistors 441 and 495 (FDGs) are disposed in the horizontal direction. Note that the connection transistor 494 (not shown) is disposed above the connection transistor 495. Furthermore, in the horizontal direction, a reset transistor (RST) of a block adjacent to the added connection transistor 494 (FDG) is disposed on the right side of the connection transistor 494 (FDG).

In this way, according to the second embodiment of the present technology, since the connection transistor 494 connected to the FD wire 308-1 and the connection transistor 495 connected to the FD wire 308-3 are provided, the number of pixels to be added can be increased.

<Modification>

In the second embodiment described above, the reset transistor has been disposed on the right side of the connection transistor 494 in the horizontal direction. With this layout, it is difficult to reduce the number of wires in the vertical direction. A solid-state image capturing element 200 in a modification of the second embodiment differs from the solid-state image capturing element 200 of the second embodiment in that the layout of transistors in the horizontal direction is changed and the number of wires is reduced.

Figure 25:
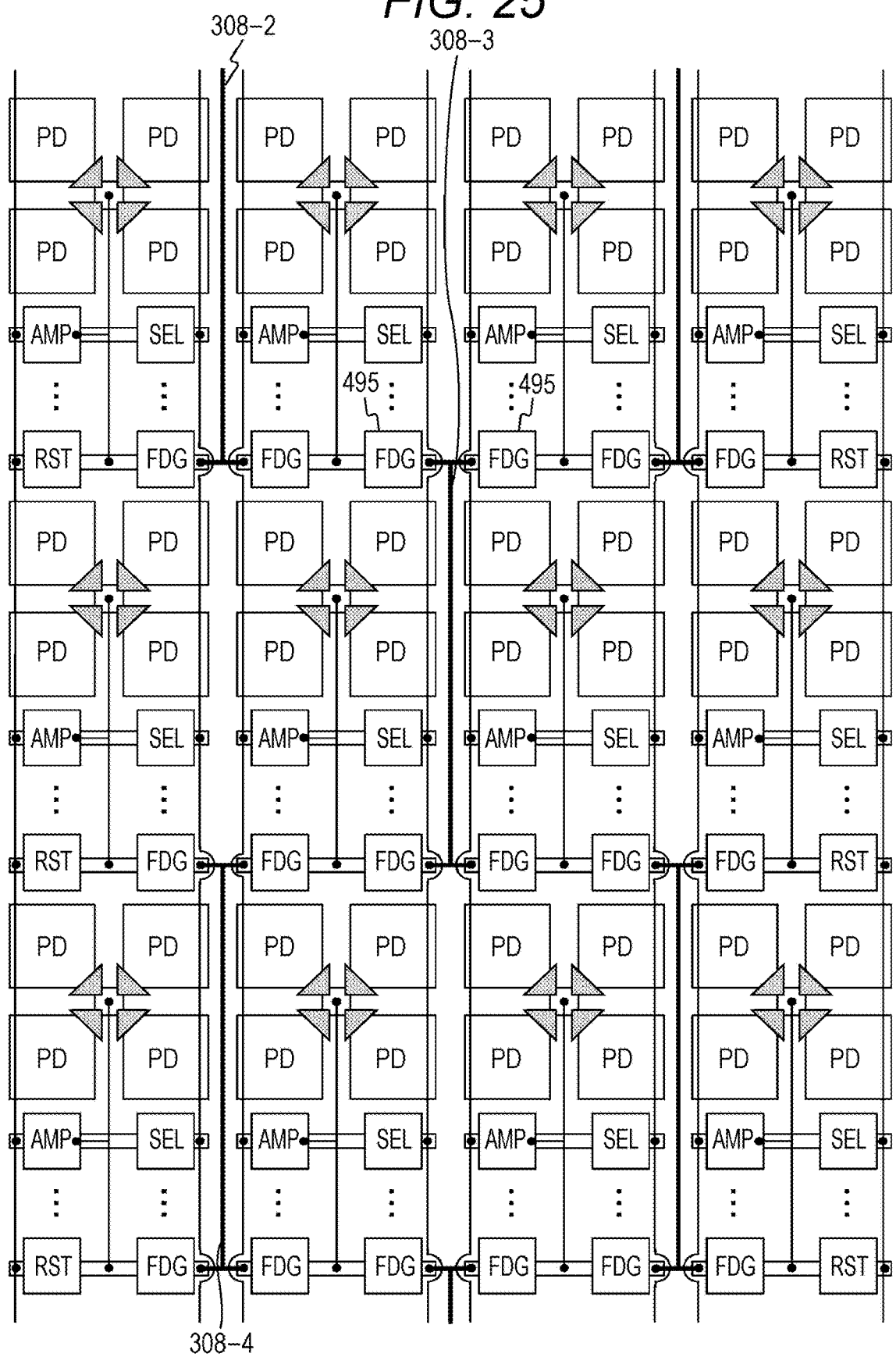
FIG. 25 is a plan view showing one example of a layout of elements and wires in a pixel array unit in a modification of the second embodiment of the present technology.

FIG. 25 is a plan view showing one example of the layout of elements and wires in a pixel array unit 300 in the modification of the second embodiment of the present technology. The layout of the modification of the second embodiment differs from the layout of the second embodiment in that two columns of right blocks in the layout of the second embodiment are flipped horizontally. In the horizontally flipped pixel array unit 300, a connection transistor 495 added in the left FD sharing block and a connection transistor 495 added in the right FD sharing block are disposed adjacently in the horizontal direction. With this configuration, the FD wire 308-3 can be shared between the left side and the right side. FD wires other than the FD wire 308-3 can also be shared similarly. Since two adjacent columns can share an FD wire as illustrated in FIG. 25, the number of wires in the vertical direction can be reduced.

In this way, according to the modification of the second embodiment of the present technology, since the connection transistors 495 of the left and right FD sharing blocks are disposed adjacently in the horizontal direction, the FD wire 308-3 can be shared between the left side and the right side. With this configuration, the number of wires in the vertical direction can be reduced.

3. Third Embodiment

In the second embodiment described above, the reset transistor has connected the power node to the corresponding FD. With this configuration, the circuit is asymmetric between a case where the left FD sharing block is initialized and a case where the right FD sharing block is initialized. For example, when initializing the right side, unlike when initializing the left side, the power node needs to go through two connection transistors in addition to the reset transistor. A solid-state image capturing element 200 of the third embodiment differs from the solid-state image capturing element 200 of the second embodiment in that circuit symmetry is provided by changing connection destinations of the reset transistors.

Figure 26:
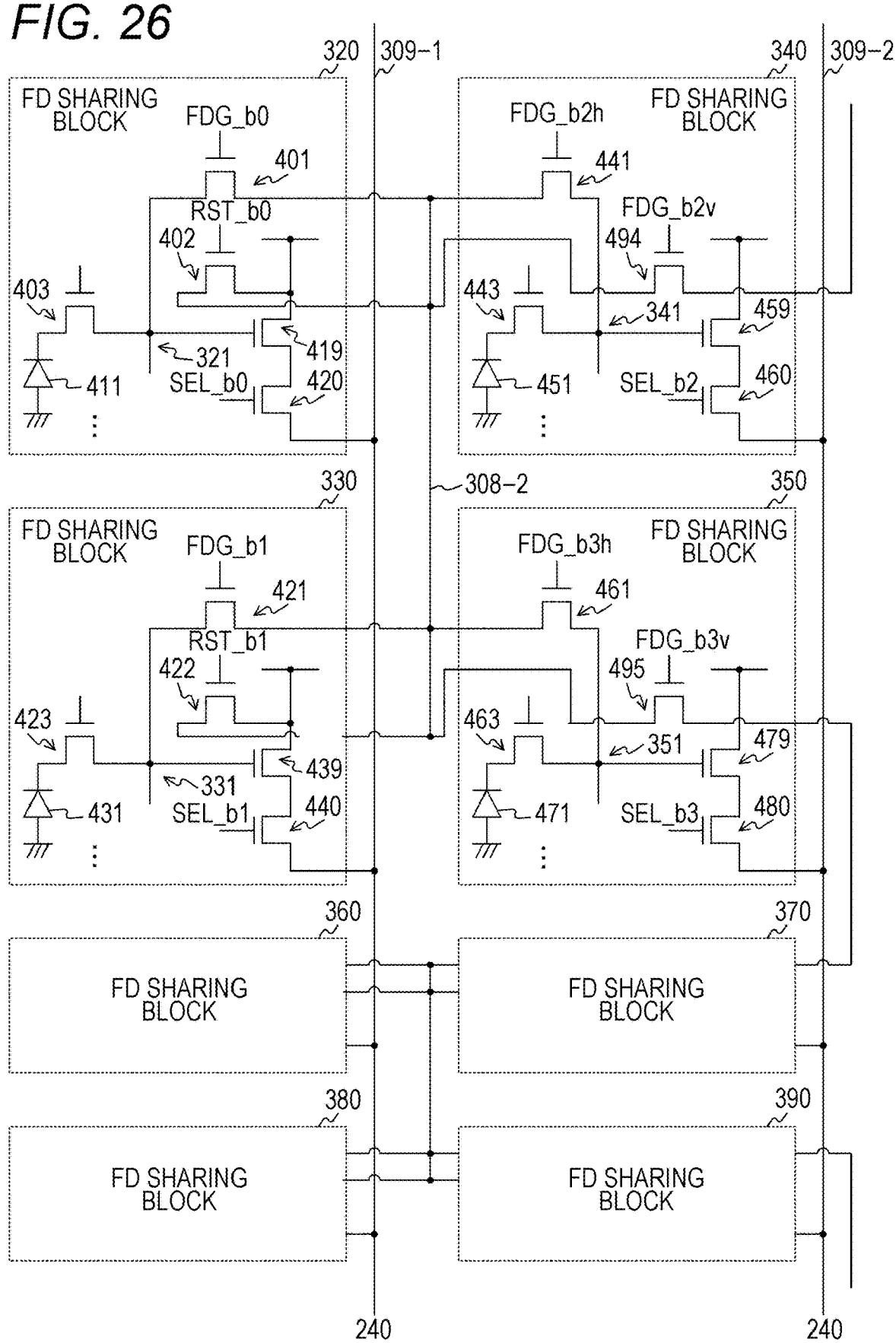
FIG. 26 is a circuit diagram showing one configuration example of a pixel array unit in a third embodiment of the present technology.

FIG. 26 is a circuit diagram showing one configuration example of a pixel array unit 300 in the third embodiment of the present technology. A reset transistor 402 of the third embodiment connects a power node to a FD wire 308-2 according to a reset signal RST_b0. Furthermore, a reset transistor 422 connects a power node to the FD wire 308-2 according to a reset signal RST_b1. With this connection, the number of transistors through which the power node passes is the same between in a case where the left FD sharing block is initialized and in a case where the right FD sharing block is initialized, and circuit symmetry is maintained.

Note that the modification of the second embodiment can be applied to the third embodiment.

In this way, according to the third embodiment of the present technology, since the reset transistor 402 connects the power node to the FD wire 308-2, the number of transistors through which the power node passes can be the same between when initializing the left FD sharing block and when initializing the right FD sharing block.

4. Fourth Embodiment

In the first embodiment described above, pixel addition is performed on maximum 32 pixels. However, there are cases where addition of more pixels may be required. A solid-state image capturing element 200 of a fourth embodiment differs from the solid-state image capturing element 200 of the first embodiment in that the number of blocks connected to an FD wire 308 is increased and the number of pixels to add is increased.

Figure 27:
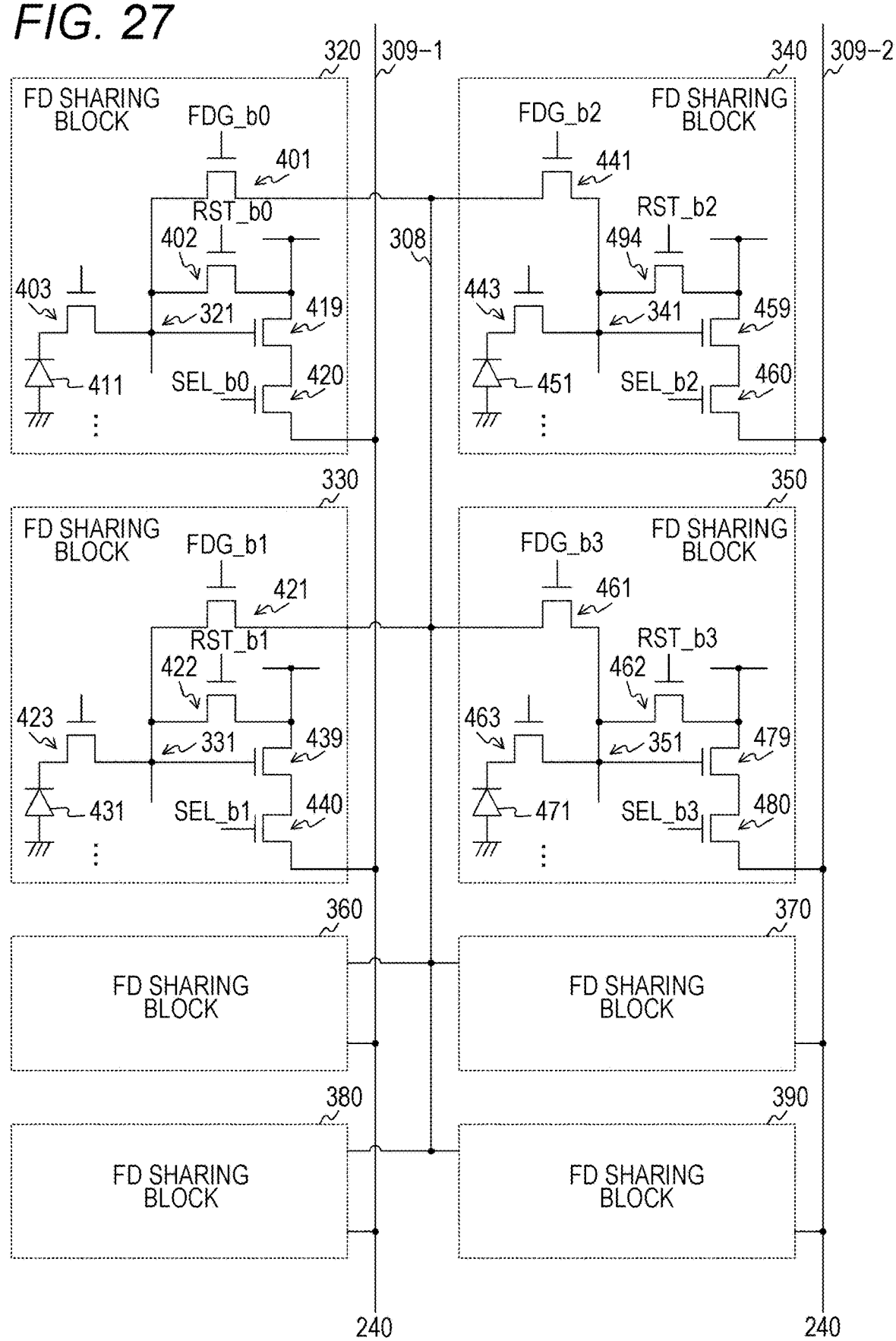
FIG. 27 is a circuit diagram showing one configuration example of a pixel array unit in a fourth embodiment of the present technology.

FIG. 27 is a circuit diagram showing one configuration example of a pixel array unit 300 in the fourth embodiment of the present technology. It is assumed that FD sharing blocks 360, 370, 380 and 390 are further arranged below FD sharing blocks 320, 330, 340 and 350 in a pixel block 310 of the fourth embodiment.

The configuration of the FD sharing blocks 360, 370, 380 and 390 is similar to the configuration of the FD sharing blocks 320, 330, 340 and 350. Furthermore, the FD sharing blocks 360, 370, 380 and 390 are connected to the FD wire 308, together with the FD sharing blocks 320, 330, 340 and 350.

Note that an FD of each of the FD sharing blocks 360 and 370 is one example of the pair of third floating diffusion layers described in the claims, and an FD of each of the FD sharing blocks 380 and 390 is one example of the pair of fourth floating diffusion layers described in the claims.

As illustrated in FIG. 27, since eight FD sharing blocks are connected to the FD wire 308, the number of pixels to add can be larger than in the first embodiment in which four FD sharing blocks are connected.

Note that although the number of blocks connected to the FD wire 308 is increased in the vertical direction, the number of blocks can also be increased in the horizontal direction. In this case, the FD sharing blocks 360, 370, 380, and 390 are arranged on the right side or left side of the FD sharing blocks 320, 330, 340, and 350. The number of blocks connected to the FD wire 308 can also be increased in both the vertical direction and the horizontal direction. Furthermore, although eight FD sharing blocks are connected to the FD wire 308, more FD sharing blocks can be connected. By increasing the number of blocks in the vertical direction or horizontal direction, it is also possible to connect up to all the FD sharing blocks.

In this way, according to the fourth embodiment of the present technology, since the number of blocks connected to the FD wire 308 is increased, the number of pixels to add can be increased.

5. Fifth Embodiment

In the first embodiment described above, the solid-state image capturing element 200 generates image data by per-forming pixel addition. With this configuration, however, it is difficult to measure a distance to an object. An electronic device of the fifth embodiment differs from the electronic device of the first embodiment in that a distance to an object is measured by a time of flight (ToF) method.

Figure 28:
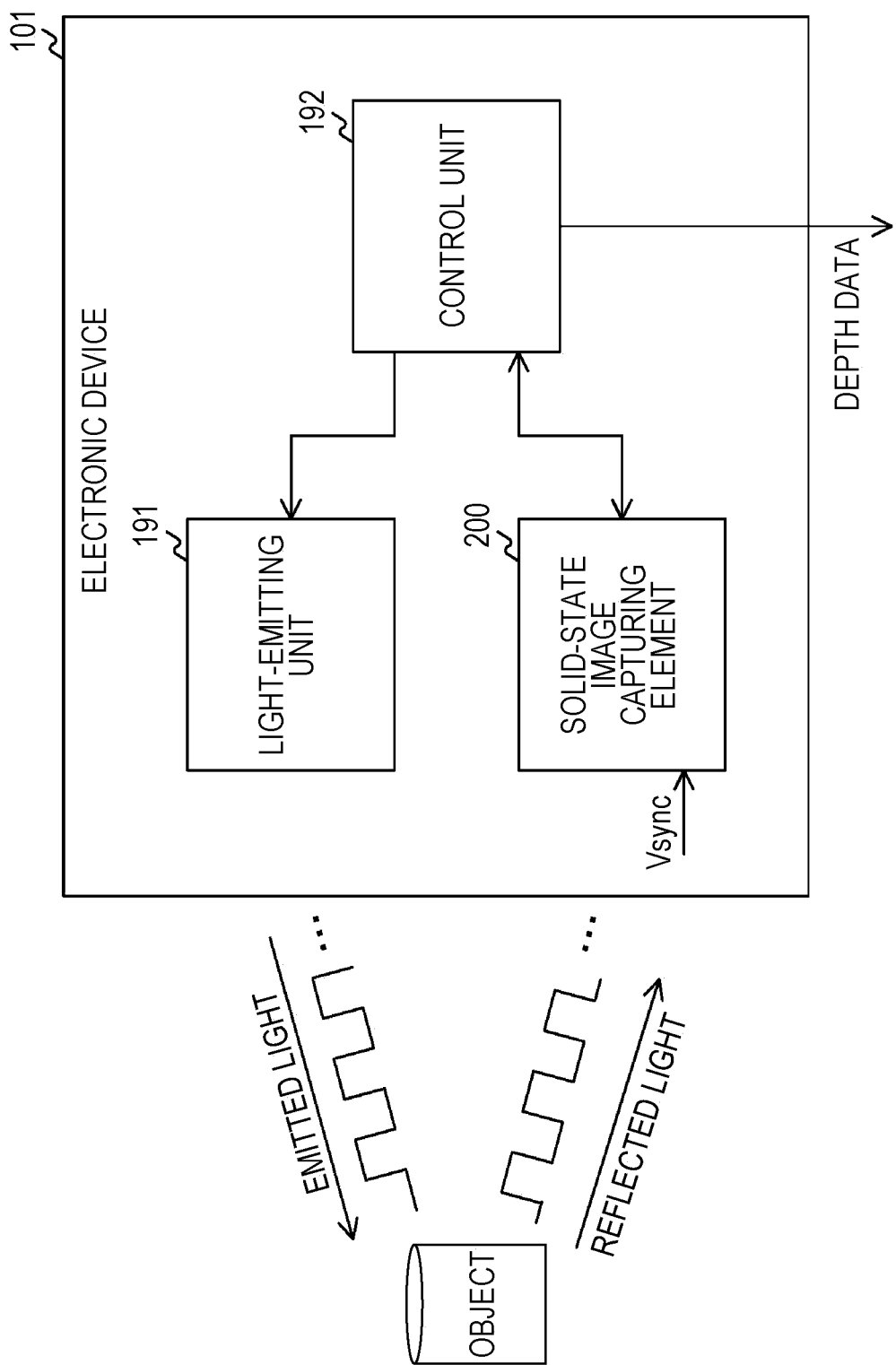
FIG. 28 is a block diagram showing one configuration example of an electronic device in a fifth embodiment of the present technology.

FIG. 28 is a block diagram showing one configuration example of the electronic device 101 in the fifth embodiment of the present technology. The electronic device 101 is a device that can measure a distance to an object by the ToF method, and includes a light-emitting unit 191, a solid-state image capturing element 200, and a control unit 192.

The light-emitting unit 191 emits intermittent light in synchronization with a synchronization signal having a frequency set by the control unit 192. For example, near-infrared light or the like is used as the emitted light. Furthermore, a rectangular-wave clock signal is used as the synchronization signal. Note that a sine-wave signal can also be used as the synchronization signal.

The solid-state image capturing element 200 of the fifth embodiment receives reflected light of the intermittent light and generates image data. The solid-state image capturing element 200 generates image data in synchronization with a vertical synchronizing signal Vsync and supplies the image data to the control unit 192. The frequency of the vertical synchronizing signal Vsync is, for example, 30 Hz. Note that an optical unit that collects the reflected light and guides the reflected light to the solid-state image capturing element 200 is disposed in a preceding stage of the solid-state image capturing element 200, but the optical unit is omitted in FIG. 28 for convenience of description.

The control unit 192 controls the light-emitting unit 191 and the solid-state image capturing element 200. The control unit 192 supplies the synchronization signal to the light-emitting unit 191. Furthermore, the control unit 192 also transmits the synchronization signal to the solid-state image capturing element 200. The frequency of these synchronization signals is higher than the frequency of the vertical synchronizing signal, for example, 10 to 20 MHz.

Then, the control unit 192 receives the image data from the solid-state image capturing element 200. The control unit 192 measures a distance to an object on the basis of the image data, and generates and outputs depth data indicating the measured value.

Figure 29:
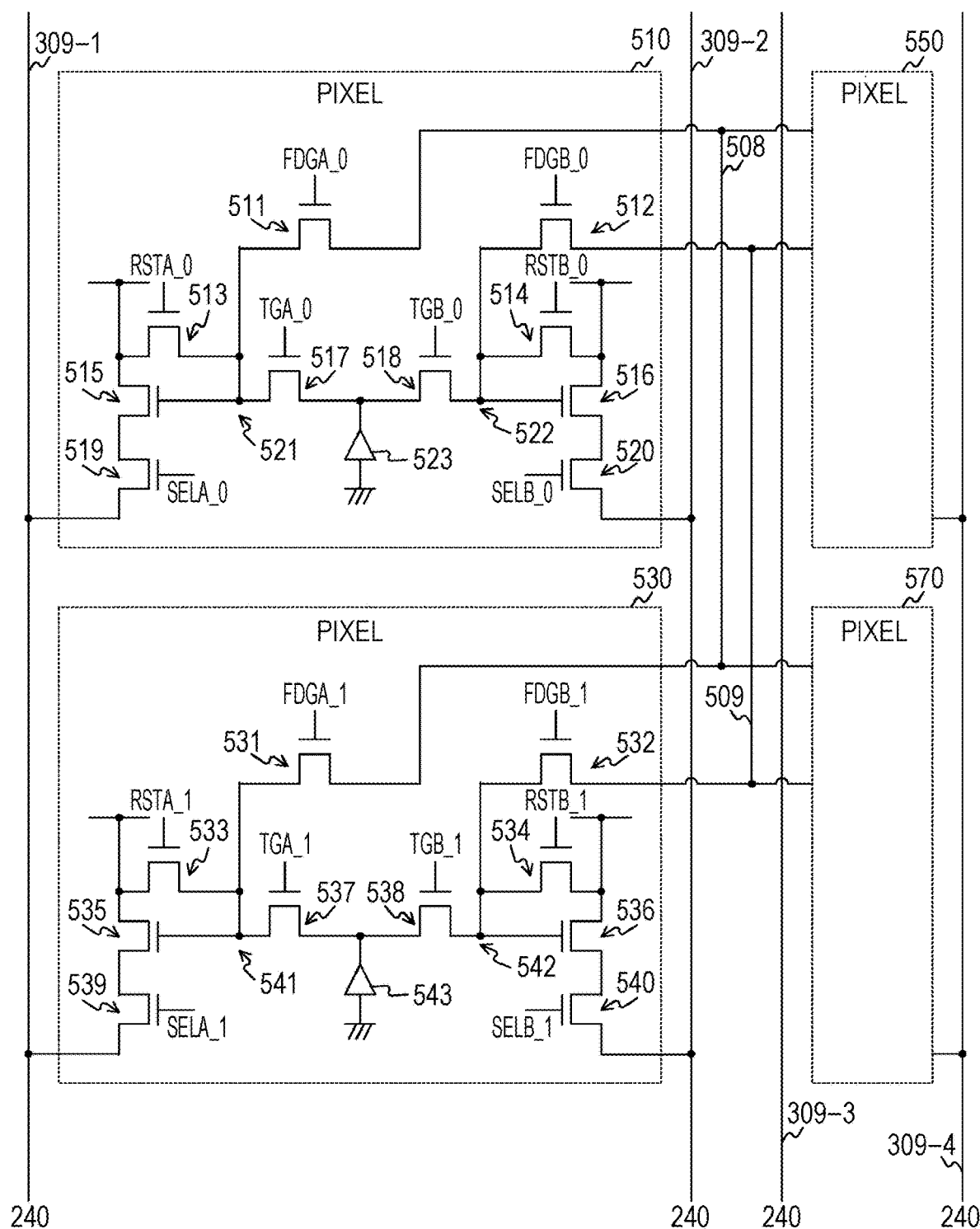
FIG. 29 is a circuit diagram showing one configuration example of two left pixels in a pixel block in the fifth embodiment of the present technology.

FIG. 29 is a circuit diagram showing one configuration example of two left pixels in a pixel block 310 in the fifth embodiment of the present technology. In the fifth embodiment, pixels 510, 530, 550, and 570 are arranged in 2 rows×2 columns in every pixel block 310.

Furthermore, FD wires 508 and 509 are installed in the pixel block 310, and two vertical signal lines are installed for every column of pixels. For example, vertical signal lines 309-1 and 309-2 are installed on both sides of the left column, and vertical signal lines 309-3 and 309-4 are installed on both sides of the right column.

In the pixel 510, connection transistors 511 and 512, reset transistors 513 and 514, amplification transistors 515 and 516, and transfer transistors 517 and 518 are provided. Moreover, in the pixel 510, selection transistors 519 and 520, FDs 521 and 522, and a photoelectric conversion element 523 are provided.

The connection transistor 511 connects the FD 521 to the FD wire 508 according to a control signal FDGA_0 from a row selection unit 210. The connection transistor 512 connects the FD 522 to the FD wire 509 according to a control signal FDGB_0 from the row selection unit 210. The reset transistor 513 initializes an amount of charge of the FD 521 according to a reset signal RSTA_0 from the row selection unit 210. The reset transistor 514 initializes an amount of charge of the FD 522 according to a reset signal RSTB_0 from the row selection unit 210. The amplification transistor 515 amplifies a voltage signal of the FD 521. The amplification transistor 516 amplifies a voltage signal of the FD 522.

The transfer transistor 517 transfers a charge from the photoelectric conversion element 523 to the FD 521 according to a transfer signal TGA_0 from the row selection unit 210. The transfer transistor 518 transfers a charge from the photoelectric conversion element 523 to the FD 522 according to a transfer signal TGB_0 from the row selection unit 210.

The selection transistor 519 outputs the amplified analog signal to the analog-to-digital conversion unit 240 via the vertical signal line 309-1 according to a selection signal SELA_0 from the row selection unit 210. The selection transistor 520 outputs the amplified analog signal to the analog-to-digital conversion unit 240 via the vertical signal line 309-2 according to a selection signal SELB_0 from the row selection unit 210.

The FDs 521 and 522 each accumulate the transferred charge and generate the voltage according to the amount of charge. The photoelectric conversion element 523 generates the charge by photoelectric conversion.

In the pixel 530, connection transistors 531 and 532, reset transistors 533 and 534, amplification transistors 535 and 536, and transfer transistors 537 and 538 are provided. Moreover, in the pixel 530, selection transistors 539 and 540, FDs 541 and 542, and a photoelectric conversion element 543 are provided. The connection configuration of these elements is similar to the connection configuration of the pixel 510.

Furthermore, the row selection unit 210 supplies, to the pixel 530, control signals FDGA_1 and FDGB_1, reset signals RSTA_1 and RSTB_1, transfer signals TGA_1 and TGB_1, and selection signals SELA_1 and SELB_1.

Note that the FDs 521 and 541 are one example of the pair of first floating diffusion layers described in the claims, and the FDs 522 and 542 are one example of the pair of third floating diffusion layers described in the claims.

Figure 30:
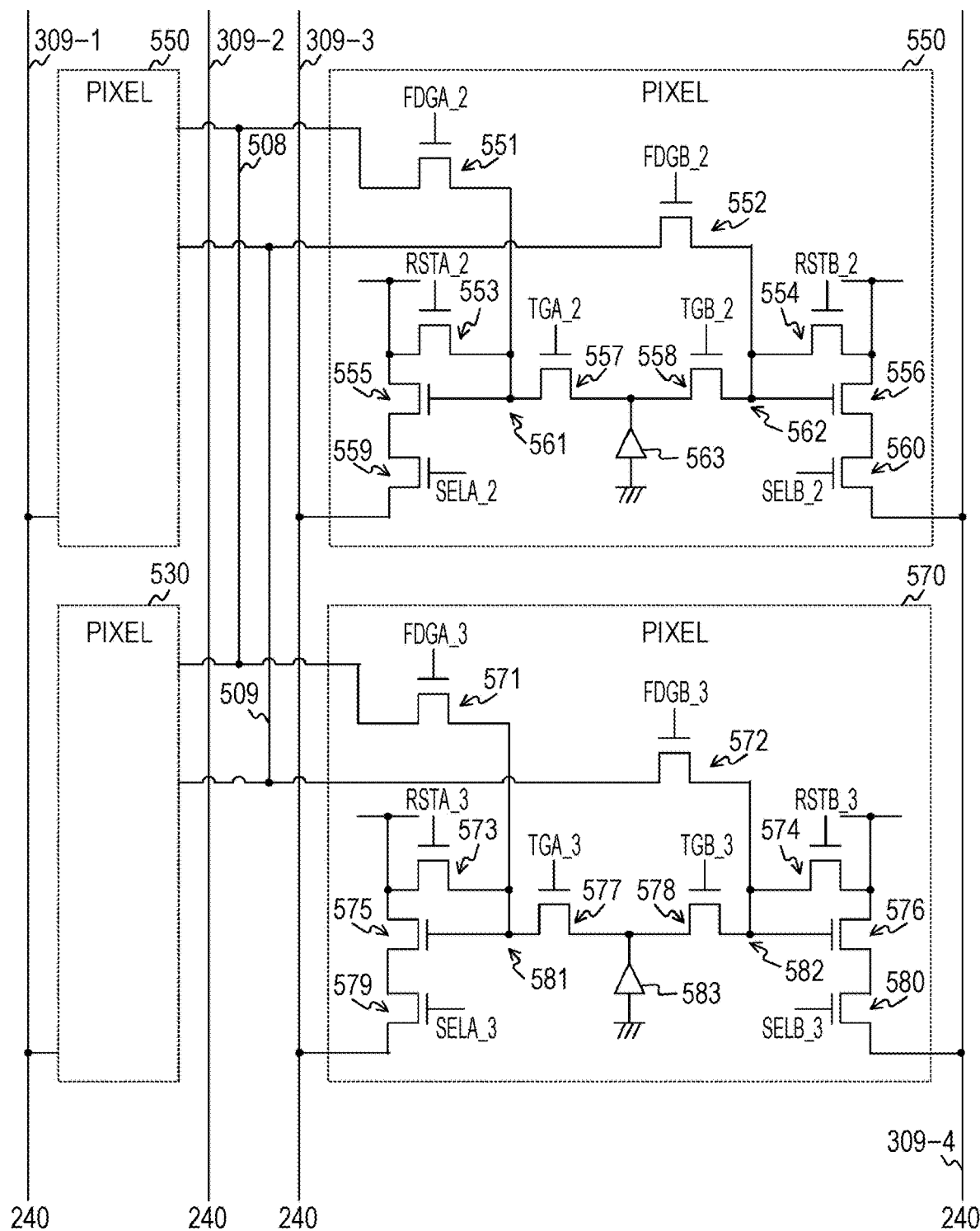
FIG. 30 is a circuit diagram showing one configuration example of two right pixels in the pixel block in the fifth embodiment of the present technology.

FIG. 30 is a circuit diagram showing one configuration example of two right pixels in the pixel block 310 in the fifth embodiment of the present technology. In the pixel 550, connection transistors 551 and 552, reset transistors 553 and 554, amplification transistors 555 and 556, and transfer transistors 557 and 558 are provided. Moreover, in the pixel 550, selection transistors 559 and 560, FDs 561 and 562, and a photoelectric conversion element 563 are provided. The connection configuration of these elements is similar to the connection configuration of the pixel 510.

Furthermore, the row selection unit 210 supplies, to the pixel 550, control signals FDGA_2 and FDGB_2, reset signals RSTA_2 and RSTB_2, transfer signals TGA_2 and TGB_2, and selection signals SELA_2 and SELB_2.

In the pixel 570, connection transistors 571 and 572, reset transistors 573 and 574, amplification transistors 575 and 576, and transfer transistors 577 and 578 are provided. Moreover, in the pixel 570, selection transistors 579 and 580, FDs 581 and 582, and a photoelectric conversion element 583 are provided. The connection configuration of these elements is similar to the connection configuration of the pixel 510.

Furthermore, the row selection unit 210 supplies, to the pixel 570, control signals FDGA_3 and FDGB_3, reset signals RSTA_3 and RSTB_3, transfer signals TGA_3 and TGB_3, and selection signals SELA_3 and SELB_3.

Note that the FDs 561 and 581 are one example of the pair of second floating diffusion layers described in the claims, and the FDs 562 and 582 are one example of the pair of fourth floating diffusion layers described in the claims.

Figure 31:
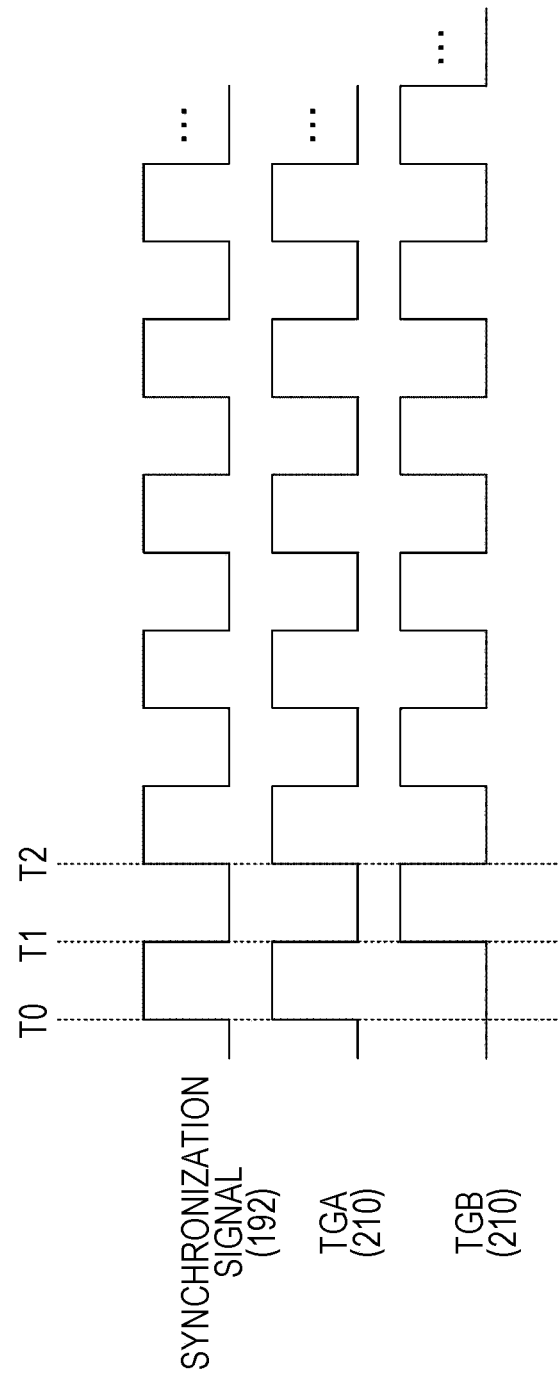
FIG. 31 is a timing chart showing one example of an operation of the electronic device in the fifth embodiment of the present technology.

FIG. 31 is a timing chart showing one example of an operation of the electronic device 101 in the fifth embodiment of the present technology. The control unit 192 supplies the synchronization signal to the light-emitting unit 191 to emit light. For example, the light-emitting unit 191 emits light during the period from timing T0 to T1, and turns off light during the period from timing T1 to T2.

Furthermore, the row selection unit 210 supplies the transfer signal TGA having a phase difference of 0 degrees from the synchronization signal and the transfer signal TGB having a phase difference of 180 degrees. With this operation, a charge according to an amount of reflected light received during the timing from T0 to T1 is transferred to the FD 521, and a charge according to an amount of reflected light received during the timing from T1 to T2 is transferred to the FD 522. The control unit 192 performs processing of measuring a distance according to time of flight of light on the basis of signals output from the solid-state image capturing element 200. Note that, instead of the control unit 192, a circuit in the solid-state image capturing element 200 (such as signal processing unit 260) can measure a distance.

Furthermore, by controlling the connection transistor 511 and the like, a signal having a phase difference of 0 degrees and a signal having a phase difference of 180 degrees can be separately added.

In this way, according to the fifth embodiment of the present technology, since signals having different phase differences from the synchronization signal are transferred to each of the FDs 521 and 522, on the basis of the signals, a distance to an object can be measured by the ToF method.

<First Modification>

In the first embodiment described above, two FD wires 508 and 509 have been installed for each pixel block 310. With this configuration, however, it is difficult to reduce the number of wires. A solid-state image capturing element 200 of a first modification of the fifth embodiment differs from the solid-state image capturing element 200 of the first embodiment in that four pixels share an FD wire and the number of wires is reduced.

Figure 32:
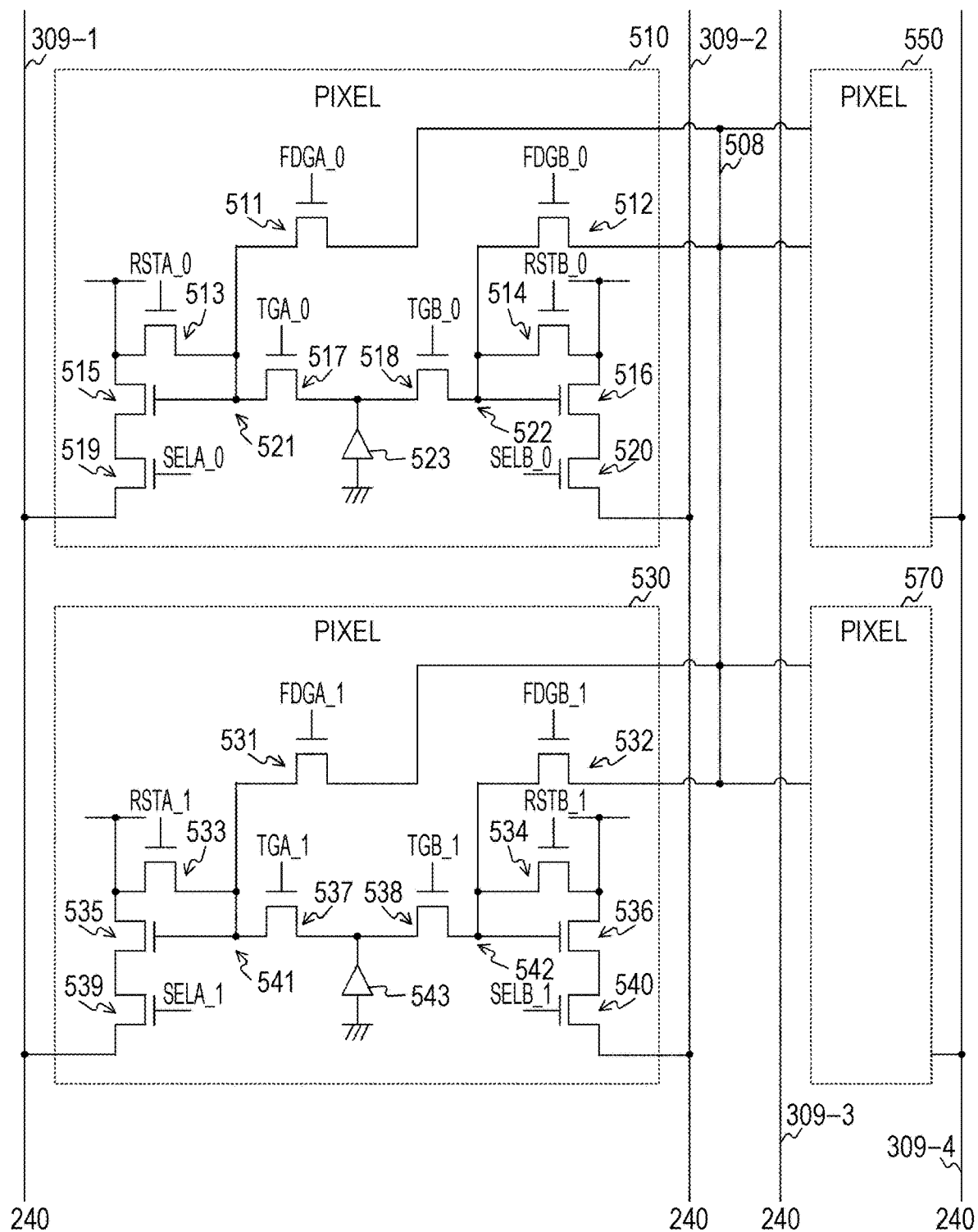
FIG. 32 is a circuit diagram showing one configuration example of two left pixels in a pixel block in a first modification of the fifth embodiment of the present technology.

FIG. 32 is a circuit diagram showing one configuration example of two left pixels in a pixel block 310 in the first modification of the fifth embodiment of the present technology. The pixel block 310 of the first modification of the fifth embodiment differs from the pixel block 310 of the fifth embodiment in that an FD wire 509 is not installed. Furthermore, connection transistors 512 and 532 are connected to an FD wire 508 instead of the FD wire 509. Pixels 550 and 570 are also similarly configured. With this configuration, the FD wire 509 can be removed.

In this way, in the first modification of the fifth embodiment of the present technology, since the connection transistor of each of the four pixels is connected to the FD wire 508, the FD wire 509 can be removed.

<Second Modification>

In the first embodiment described above, the transfer transistors 517 and 518 have transferred a charge to the FDs 521 and 522 arranged in the horizontal direction. The arrangement direction of transfer destination FDs may be the vertical direction. A solid-state image capturing element 200 of the second modification of the fifth embodiment differs from the solid-state image capturing element 200 of the fifth embodiment in that a charge is transferred to the FDs 521 and 522 arranged in the vertical direction.

Figure 33:
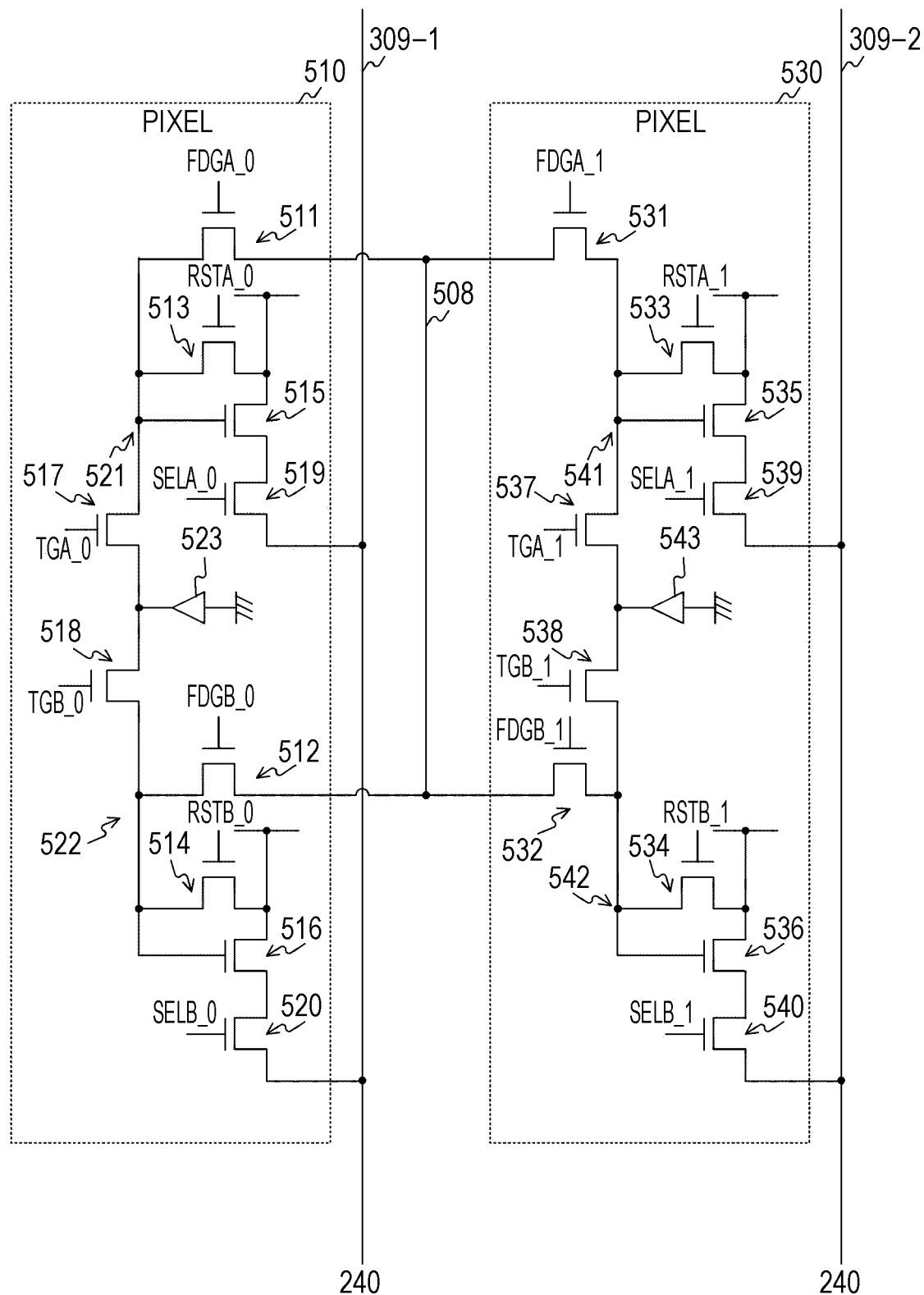
FIG. 33 is a circuit diagram showing one configuration example of a pixel block in a second modification of the fifth embodiment of the present technology.

FIG. 33 is a circuit diagram showing one configuration example of a pixel block 310 in the second modification of the fifth embodiment of the present technology. The pixel block 310 of the second modification of the fifth embodiment differs from the pixel block 310 of the fifth embodiment in that only two pixels 510 and 530 are arranged.

Furthermore, FDs 521 and 522, and FDs 541 and 542 are each arranged in the vertical direction.

Note that the FDs 521 and 522 are one example of the pair of first floating diffusion layers described in the claims, and the FDs 541 and 542 are one example of the pair of second floating diffusion layers described in the claims.

Furthermore, the FD wire 509 is removed, and connection transistors 512 and 532 are connected to the FD wire 508. The row selection unit 210 turns on or off the connection transistors 511, 512, 531, and 532 and connects the FDs 521 and 522, FDs 541 and 542 in the horizontal direction, the vertical direction, or the diagonal direction. With this configuration, signals having different phase differences can be added in the pixels 510 and 530, and signals having the same phase difference can be added. For example, a signal having a phase difference of 0 degrees in the pixel 510 can be added to a signal having a phase difference of 180 degrees in the pixel 530. Alternatively, a signal having a phase difference of 0 degrees in the pixel 510 can be added to a signal having a phase difference of 0 degrees in the pixel 530.

In this way, in the second modification of the fifth embodiment of the present technology, since the FDs 521 and 522 and the FDs 541 and 542 are arranged in the vertical direction, any of signals having different phase differences and signals having the same phase difference can be arbitrarily selected and added.

6. Sixth Embodiment

Figure 34:
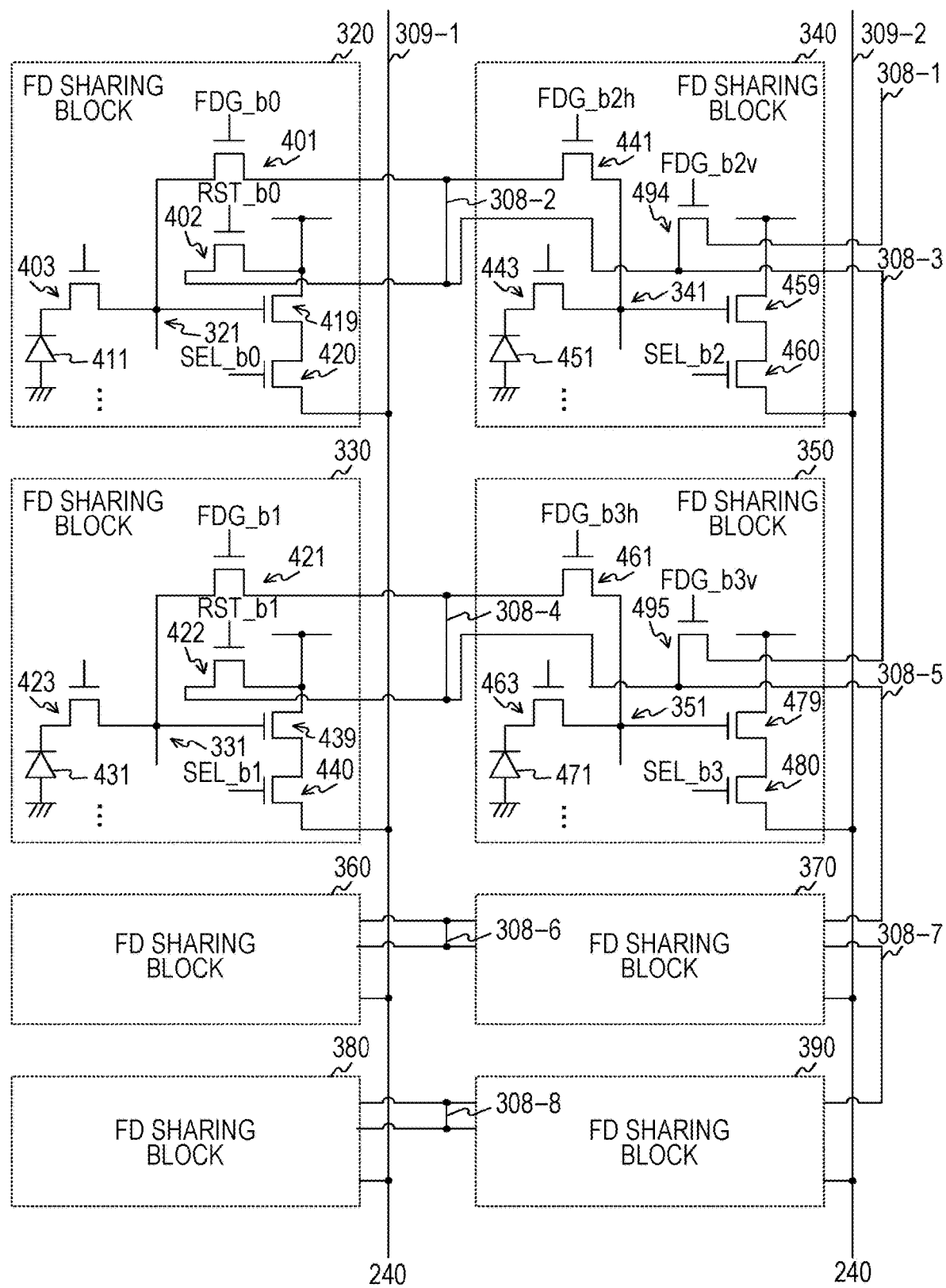
FIG. 34 is a circuit diagram showing one configuration example of upper FD sharing blocks in a sixth embodiment of the present technology.

In the first embodiment described above, a maximum of 2×2 FD sharing blocks are connected, and FDs are shared by those blocks. However, the FD sharing range can be arbitrarily changed. A solid-state image capturing element 200 of the sixth embodiment differs from the solid-state image capturing element 200 of the first embodiment in that the FD sharing range is variable. FIG. 34 is a circuit diagram showing one configuration example of upper FD sharing blocks 320, 330, 340, and 350 in the sixth embodiment of the present technology. Elements arranged in each FD sharing block are similar to elements illustrated in FIG. 26. However, the upper right FD sharing block 340 and the FD sharing block 350 thereunder are connected via an FD wire 308-3, and the FD sharing block 350 and the FD sharing block 370 thereunder are connected via an FD wire 308-5. Furthermore, an FD wire 308-2 is not installed to the FD sharing block thereunder, and an FD wire 308-4 is installed between the FD sharing blocks 330 and 350.

Furthermore, the FD wire 308-2 is connected to the FD wire 308-3, and the FD wire 308-4 is also connected to the FD wire 308-5. A connection transistor 494 connects an FD wire 308-1 to the FD wire 308-3 according to a control signal FDG_b2v. A connection transistor 495 connects the FD wire 308-3 to the FD wire 308-5 according to a control signal FDG_b3v.

By turning on connection transistors 401 and 421 and the connection transistor 495 in FIG. 34, left FDs 321 and 331 can be connected to the FD wire 308-3 via the FD wires 308-2 and 308-4. Furthermore, by turning on a connection transistor 441, a right FD 341 can be connected to the FD wire 308-3 via the FD wire 308-2. Note that the circuit including the connection transistors 401, 421, and 495 is one example of the first connection circuit described in the claims, and the circuit including the connection transistor 441 is one example of the second connection circuit described in the claims. The connection transistors 401, 421, and 495 are one example of the first, second, and third connection transistors described in the claims, and the connection transistor 441 is one example of the fourth connection transistor described in the claims. The FD wire 308-3 is one example of the first wire described in the claims. The FD wire 308-2 is one example of the second wire described in the claims. The FD wire 308-4 is one example of the third wire described in the claims.

Figure 35:
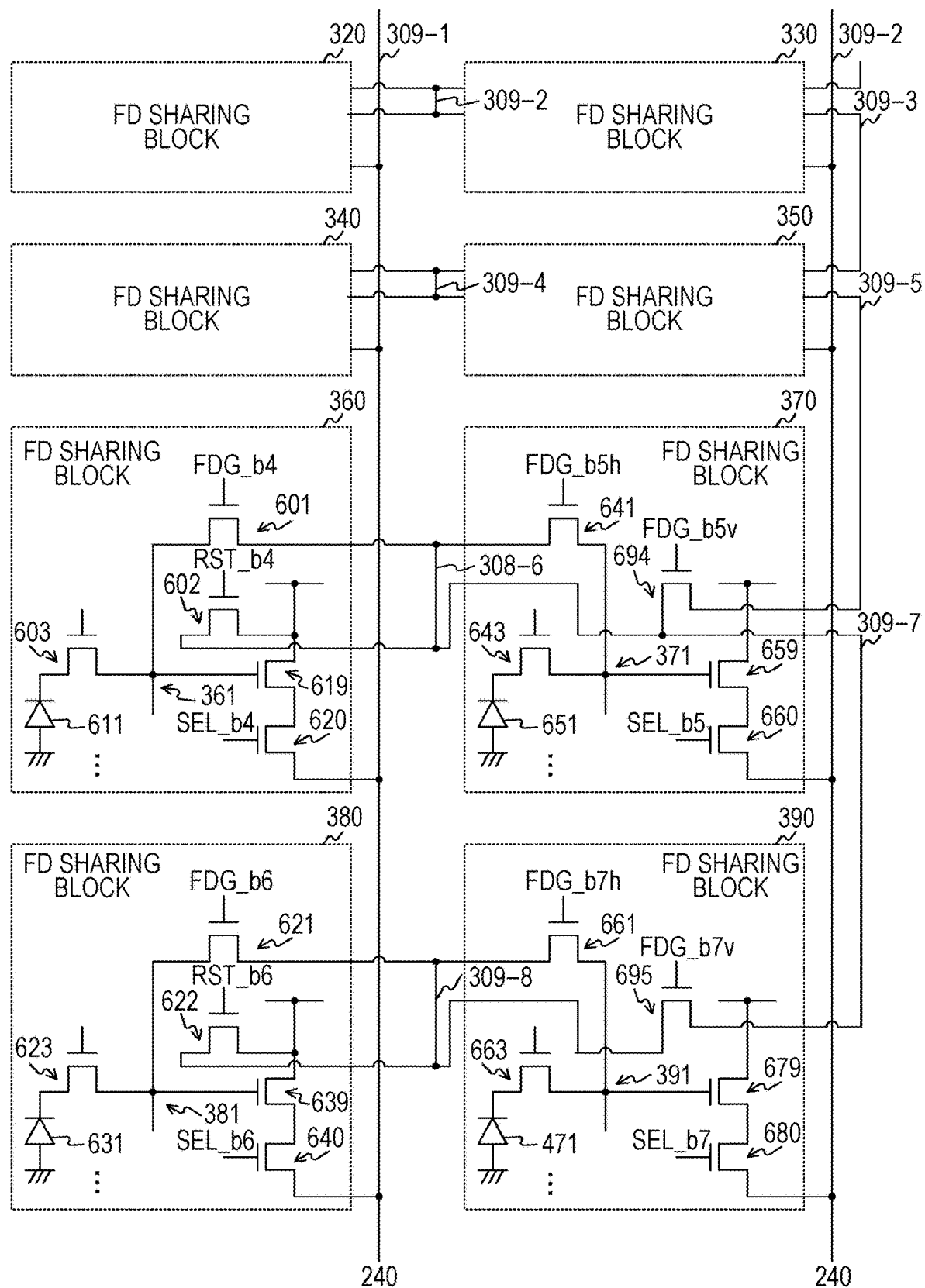
FIG. 35 is a circuit diagram showing one configuration example of lower FD sharing blocks in the sixth embodiment of the present technology.

FIG. 35 is a circuit diagram showing one configuration example of the lower FD sharing blocks 360, 370, 380, and 390 in the sixth embodiment of the present technology. The configuration of these FD sharing blocks is similar to the configuration of the upper FD sharing blocks 320, 330, 340 and 350. However, the upper right FD sharing block 370 and the FD sharing block 390 thereunder are connected via an FD wire 308-7. Furthermore, an FD wire 308-6 is installed between the FD sharing blocks 360 and 370, and an FD wire 308-8 is installed between the FD sharing blocks 380 and 390. Furthermore, the FD wire 308-6 is connected to the FD wire 308-7.

With the configuration illustrated in FIGS. 34 and 35, the solid-state image capturing element 200 can easily change the FD sharing range. For example, all the 2×4 FD sharing blocks (320 to 390) can be connected and FDs can be shared by the FD sharing blocks. The upper four FD sharing blocks can be further connected via the FD wire 308-1, and 4×4 FD sharing blocks can share the FDs. More FD sharing blocks can be connected, and 4×N (N is an integer) FD sharing blocks can share the FDs.

In this way, according to the sixth embodiment of the present technology, since the connection transistors 494 and 495 are provided and the FD sharing blocks are connected in the vertical direction through the connection transistors 494 and 495, the FD sharing range can be changed arbitrarily.

7. Example of Application to Moving Object

Figure 36:
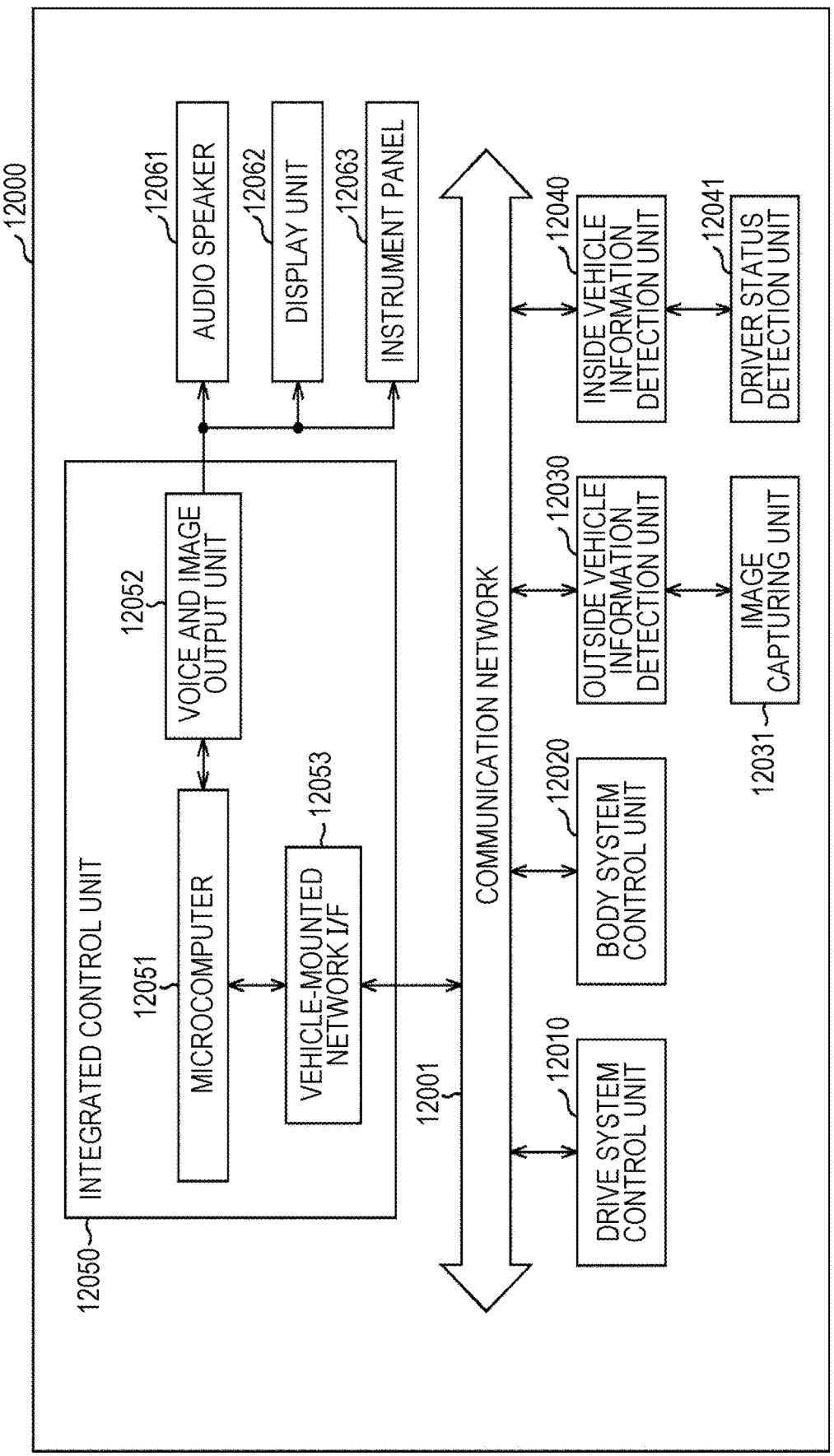
FIG. 36 is a block diagram showing a schematic configuration example of a vehicle control system.

The technology according to the embodiments of the present disclosure (present technology) can be applied to various products. For example, the technology according to the embodiments of the present disclosure may be implemented as a device mounted on any type of mobile object including automobiles, electric vehicles, hybrid electric vehicles, motorcycles, bicycles, personal mobility, airplanes, drones, ships, robots, and the like. FIG. 36 is a block diagram showing a schematic configuration example of a vehicle control system, which is one example of a mobile object control system to which the technology according to the embodiments of the present disclosure can be applied.

The vehicle control system 12000 includes a plurality of electronic control units connected via a communication network 12001. In the example shown in FIG. 36, the vehicle control system 12000 includes a drive system control unit 12010, a body system control unit 12020, an outside vehicle information detection unit 12030, an inside vehicle information detection unit 12040, and an integrated control unit 12050. Furthermore, as a functional configuration of the integrated control unit 12050, a microcomputer 12051, a voice and image output unit 12052, and a vehicle-mounted network interface (I/F) 12053 are illustrated.

The drive system control unit 12010 controls operations of devices related to the vehicle drive system according to various programs. For example, the drive system control unit 12010 functions as a control device of a driving force generation device for generating driving force of a vehicle such as an internal combustion engine or a driving motor, a driving force transmission mechanism for transmitting driving force to wheels, a steering mechanism for adjusting a steering angle of a vehicle, a braking device for generating braking force of a vehicle, and the like.

The body system control unit 12020 controls operations of various devices mounted on a vehicle body according to various programs. For example, the body system control unit 12020 functions as a control device of a keyless entry system, a smart key system, a power window device, or various lamps including a head lamp, a back lamp, a brake lamp, a direction indicator, a fog lamp, and the like. In this case, radio waves transmitted from a portable device replacing a key or signals from various switches can be input into the body system control unit 12020. The body system control unit 12020 receives the input of these radio waves or signals and controls a door lock device, the power window device, the lamps, and the like of the vehicle.

The outside vehicle information detection unit 12030 detects information outside the vehicle on which the vehicle control system 12000 is mounted. For example, an image capturing unit 12031 is connected to the outside vehicle information detection unit 12030. The outside vehicle information detection unit 12030 causes the image capturing unit 12031 to capture an image outside the vehicle, and receives the captured image. The outside vehicle information detection unit 12030 may perform object detection processing or distance detection processing on a person, a car, an obstacle, a sign, a character on a road surface, or the like on the basis of the received image.

The image capturing unit 12031 is an optical sensor that receives light and outputs an electric signal according to an amount of the received light. The image capturing unit 12031 can output the electric signal as an image or output the electric signal as distance measurement information. Furthermore, the light received by the image capturing unit 12031 may be visible light or invisible light such as infrared rays.

The inside vehicle information detection unit 12040 detects information within the vehicle. For example, a driver status detection unit 12041 that detects the status of a driver is connected to the inside vehicle information detection unit 12040. The driver status detection unit 12041 may include, for example, a camera that captures images of the driver. The inside vehicle information detection unit 12040 may calculate the degree of fatigue or concentration of the driver on the basis of the detection information input from the driver status detection unit 12041, or determine that the driver is not dozing.

On the basis of information inside and outside the vehicle acquired by the outside vehicle information detection unit 12030 or the inside vehicle information detection unit 12040, the microcomputer 12051 can calculate a control target value for the driving force generating device, the steering mechanism, or the braking device, and output a control command to the drive system control unit 12010. For example, the microcomputer 12051 can perform cooperative control aimed at implementing functions of an advanced driver assistance system (ADAS) including vehicle collision avoidance or impact mitigation, follow-up driving based on distance between vehicles, driving while maintaining vehicle speed, vehicle collision warning, vehicle lane deviation warning, or the like.

Furthermore, by controlling the driving force generating device, the steering mechanism, the braking device, or the like on the basis of information around the vehicle acquired by the outside vehicle information detection unit 12030 or the inside vehicle information detection unit 12040, the microcomputer 12051 can perform cooperative control aimed at automatic driving or the like in which the vehicle travels autonomously without depending on the operation of the driver.

Furthermore, the microcomputer 12051 can output a control command to the body system control unit 12020 on the basis of information outside the vehicle acquired by the outside vehicle information detection unit 12030. For example, the microcomputer 12051 can perform cooperative control aimed at preventing glare such as controlling a headlamp according to the position of a preceding vehicle or an oncoming vehicle detected by the outside vehicle information detection unit 12030 and switching a high beam to a low beam.

The voice and image output unit 12052 transmits an output signal of at least one of a voice or an image to an output device that can visually or auditorily notifying an occupant of the vehicle or the outside of the vehicle of information. In the example of FIG. 36, an audio speaker 12061, a display unit 12062, and an instrument panel 12063 are illustrated as the output device. The display unit 12062 may include, for example, at least one of an on-board display and a head-up display.

Figure 37:
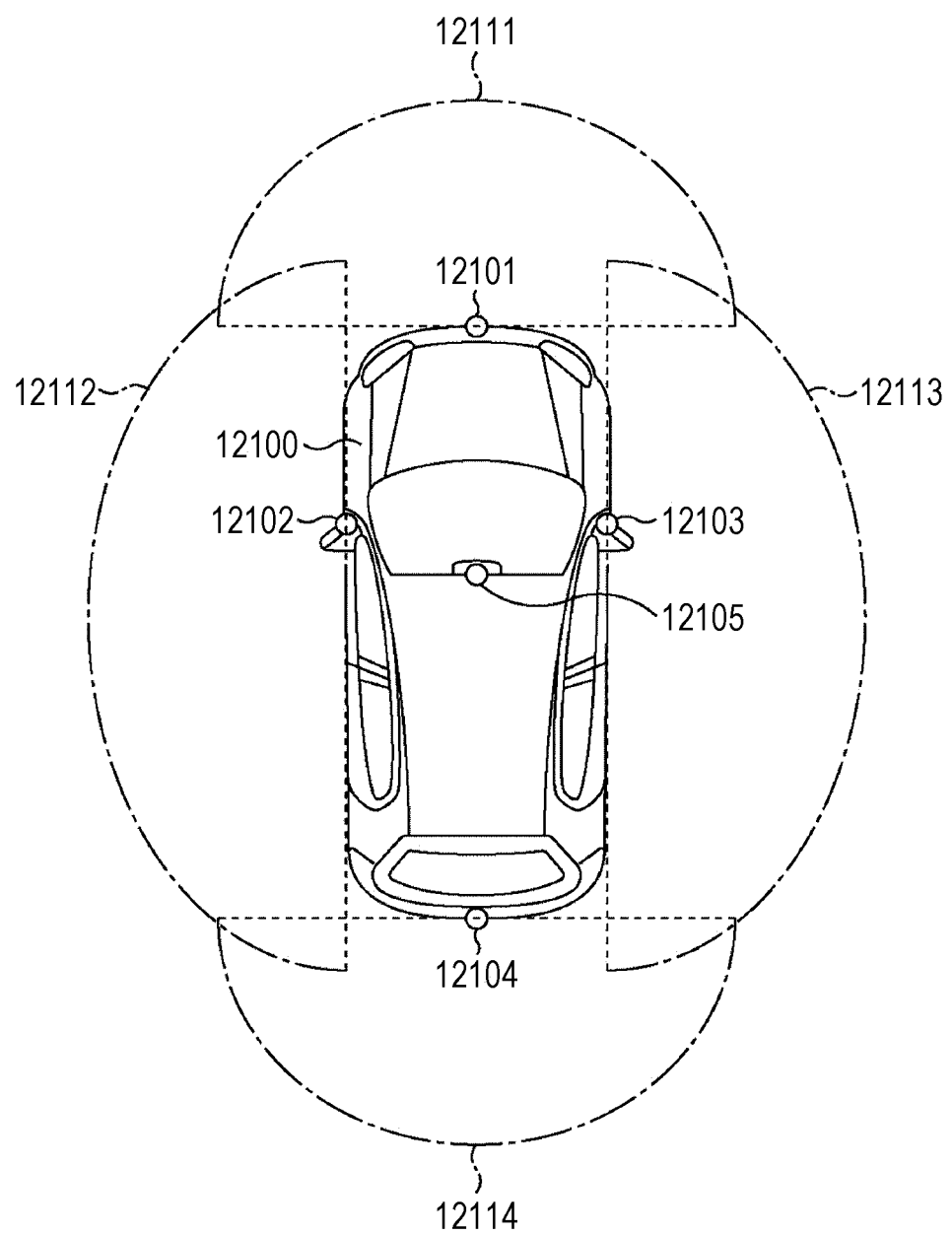
FIG. 37 is an explanatory diagram showing one example of an installation position of an image capturing unit.

FIG. 37 is a diagram showing an example of an installation position of the image capturing unit 12031. In FIG. 37, as the image capturing unit 12031, image capturing units 12101, 12102, 12103, 12104, and 12105 are provided.

The image capturing units 12101, 12102, 12103, 12104, and 12105 are provided, for example, at positions such as a front nose, side mirrors, a rear bumper, a back door, and an upper part of a windshield in the vehicle compartment of the vehicle 12100. The image capturing unit 12101 provided in the front nose and the image capturing unit 12105 provided in the upper part of the windshield in the vehicle compartment mainly acquire an image ahead of the vehicle 12100. The image capturing units 12102 and 12103 provided in the side mirrors mainly acquire side images of the vehicle 12100. The image capturing unit 12104 provided in the rear bumper or back door mainly acquires an image behind the vehicle 12100. The image capturing unit 12105 provided in the upper part of the windshield in the vehicle compartment is mainly used for detecting a preceding vehicle, a pedestrian, an obstacle, a traffic signal, a traffic sign, a lane, or the like.

Note that FIG. 37 shows one example of image capturing ranges of the image capturing units 12101 to 12104. The image capturing range 12111 indicates the image capturing range of the image capturing unit 12101 provided in the front nose. The image capturing ranges 12112 and 12113 indicate the image capturing ranges of the image capturing units 12102 and 12103 provided in the side mirrors, respectively. The image capturing range 12114 indicates the image capturing range of the image capturing unit 12104 provided in the rear bumper or the back door. For example, image data captured by the image capturing units 12101 to 12104 is superimposed, whereby a bird's-eye view image of the vehicle 12100 viewed from above is obtained.

At least one of the image capturing units 12101 to 12104 may have a function of acquiring distance information. For example, at least one of the image capturing units 12101 to 12104 may be a stereo camera including a plurality of image capturing elements or an image capturing element having pixels for detecting a phase difference.

For example, on the basis of the distance information obtained from the image capturing units 12101 to 12104, the microcomputer 12051 determines the distance to each three-dimensional object in the image capturing ranges 12111 to 12114 and the temporal change of the distance (relative speed with respect to the vehicle 12100), thereby particularly extracting, as a preceding vehicle, a three-dimensional object that is closest on a traveling path of the vehicle 12100 and travels at a predetermined speed (for example, 0 km/h or more) in the substantially same direction as the vehicle 12100. Moreover, the microcomputer 12051 can set a distance between vehicles to be secured before a preceding vehicle, and perform automatic brake control (including follow-up stop control), automatic acceleration control (including follow-up start control), and the like. In this way, cooperative control aimed at automatic driving or the like in which the vehicle autonomously travels without depending on the operation of the driver can be performed.

For example, on the basis of the distance information obtained from the image capturing units 12101 to 12104, the microcomputer 12051 classifies and extracts three-dimensional object data regarding three-dimensional objects into two-wheeled vehicles, ordinary vehicles, large vehicles, pedestrians, utility poles, and other three-dimensional objects, and can use the data for automatic obstacle avoidance. For example, the microcomputer 12051 discriminates obstacles around the vehicle 12100 between obstacles that can be visually recognized by the driver of the vehicle 12100 and obstacles that are difficult to be visually recognized. Then, the microcomputer 12051 determines the collision risk indicating the risk of collision with each obstacle. If the collision risk is equal to or higher than a set value and there is a possibility of collision, the microcomputer 12051 can provide driving assistance for collision avoidance by outputting an alarm to the driver via the audio speaker 12061 or the display unit 12062, or by performing forced deceleration or avoidance steering via the drive system control unit 12010.

At least one of the image capturing units 12101 to 12104 may be an infrared camera that detects infrared rays. For example, the microcomputer 12051 can recognize a pedestrian by determining whether or not a pedestrian exists in captured images of the image capturing units 12101 to 12104. Such pedestrian recognition is performed, for example, by a procedure for extracting feature points in the captured images of the image capturing units 12101 to 12104 serving as infrared cameras, and a procedure for performing pattern matching processing on a series of feature points indicating an outline of an object to determine whether or not the object is a pedestrian. When the microcomputer 12051 recognizes a pedestrian by determining that the pedestrian exists in the captured images of the image capturing units 12101 to 12104, the voice and image output unit 12052 controls the display unit 12062 such that a rectangular outline for emphasis is superimposed on the recognized pedestrian. Furthermore, the voice and image output unit 12052 may control the display unit 12062 to display an icon or the like indicating the pedestrian at a desired position.

One example of the vehicle control system to which the technology according to the embodiments of the present disclosure can be applied has been described above. The technology according to the embodiments of the present disclosure can be applied to, for example, the image capturing unit 12031 among the configurations described above. Specifically, for example, the image capturing device 100 of FIG. 1 can be applied to the image capturing unit 12031. By applying the technology according to the embodiments of the present disclosure to the image capturing unit 12031, pixel addition with high flexibility can be performed and a captured image that is easier to see can be obtained, making it possible to reduce driver fatigue.

Note that the embodiments described above show one example for embodying the present technology. The matters in the embodiments and the matters specifying the invention in the claims have a relationship. Similarly, the matters specifying the invention in the claims and the matters in the embodiments of the present technology with the same name have a relationship. However, the present technology is not limited to the embodiments, and can be embodied by variously modifying the embodiments without departing from the gist thereof.

Note that effects described in the present specification are merely illustrative and not restrictive, and other effects may be produced.

Note that the present technology can also have the following configurations.

(1) A solid-state image capturing element including: a pair of first floating diffusion layers arranged in a direction perpendicular to a predetermined direction; a pair of second floating diffusion layers arranged in the perpendicular direction and adjacent to the pair of first floating diffusion layers in the predetermined direction;

a first connection circuit configured to select at least one of the pair of first floating diffusion layers and to connect the selected first floating diffusion layer to a predetermined first wire;

a second connection circuit configured to select at least one of the pair of second floating diffusion layers and to connect the selected second floating diffusion layer to the first wire; and an output circuit configured to output a signal according to an amount of charge of at least one of the pair of first floating diffusion layers or the pair of second floating diffusion layers.

(2) The solid-state image capturing element according to (1), in which the first connection circuit includes:

a first connection transistor configured to connect one of the pair of first floating diffusion layers to the first wire according to a first control signal; and a second connection transistor configured to connect another one of the pair of first floating diffusion layers to the first wire according to a second control signal, and the second connection circuit includes:

a third connection transistor configured to connect one of the pair of second floating diffusion layers to the first wire according to a third control signal; and a fourth connection transistor configured to connect another one of the pair of second floating diffusion layers to the first wire according to a fourth control signal.

(3) The solid-state image capturing element according to (2), in which a reset transistor is disposed between the first connection transistor and the third connection transistor in the predetermined direction, and a selection transistor is disposed between the first connection transistor and the second connection transistor in the perpendicular direction.

(4) The solid-state image capturing element according to (2), in which
the first connection transistor and the third connection transistor are disposed adjacent to each other in the predetermined direction, and
a selection transistor is disposed between the first connection transistor and the second connection transistor in the perpendicular direction.
(5) The solid-state image capturing element according to (2), in which
a reset transistor is disposed between the first connection transistor and the third connection transistor in the predetermined direction, and
the first connection transistor and the second connection transistor are disposed adjacent to each other in the perpendicular direction.
(6) The solid-state image capturing element according to (2), in which
the first connection transistor and the third connection transistor are disposed adjacent to each other in the predetermined direction, and
the first connection transistor and the second connection transistor are disposed adjacent to each other in the perpendicular direction.
(7) The solid-state image capturing element according to (2), in which
the second connection circuit further includes:
a fifth connection transistor configured to connect one of the pair of second floating diffusion layers to a predetermined second wire according to a fifth control signal; and
a sixth connection transistor configured to connect another one of the pair of second floating diffusion layers to a predetermined third wire according to a sixth control signal.
(8) The solid-state image capturing element according to (7), in which
a reset transistor is disposed adjacent to the fifth connection transistor in the predetermined direction.
(9) The solid-state image capturing element according to (7), in which
a predetermined number of the fifth connection transistors are arranged adjacent to each other in the predetermined direction.
(10) The solid-state image capturing element according to (7) or (8), in which
the output circuit further includes:
a first reset transistor configured to connect a predetermined power node to the first wire according to a first reset signal; and
a second reset transistor configured to connect a predetermined power node to the first wire according to a second reset signal.
(11) The solid-state image capturing element according to (1), further including:
a pair of third floating diffusion layers arranged in the perpendicular direction;
a pair of fourth floating diffusion layers arranged in the perpendicular direction and adjacent to the pair of third floating diffusion layers in the predetermined direction;
a third connection circuit configured to select at least one of the pair of third floating diffusion layers and to connect the selected third floating diffusion layer to the first wire; and
a fourth connection circuit configured to select at least one of the pair of fourth floating diffusion layers and to connect the selected fourth floating diffusion layer to the first wire.
(12) The solid-state image capturing element according to (1), further including:
a signal processing unit configured to perform processing of measuring a distance according to a time of flight of light on the basis of the output signal.
(13) The solid-state image capturing element according to (12), further including:
a pair of third floating diffusion layers arranged in the perpendicular direction;
a pair of fourth floating diffusion layers arranged in the perpendicular direction;
a third connection circuit configured to select at least one of the pair of third floating diffusion layers and to connect the selected third floating diffusion layer to a predetermined second wire; and
a fourth connection circuit configured to select at least one of the pair of fourth floating diffusion layers and to connect the selected fourth floating diffusion layer to the second wire,
in which the output circuit outputs the signal according to an amount of charge of at least one of the pair of first floating diffusion layers or the pair of second floating diffusion layers, and a signal according to an amount of charge of at least one of the pair of third floating diffusion layers or the pair of fourth floating diffusion layers.
(14) The solid-state image capturing element according to (12), further including:
a pair of third floating diffusion layers arranged in the perpendicular direction;
a pair of fourth floating diffusion layers arranged in the perpendicular direction;
a third connection circuit configured to select at least one of the pair of third floating diffusion layers and to connect the selected third floating diffusion layer to the first wire; and
a fourth connection circuit configured to select at least one of the pair of fourth floating diffusion layers and to connect the selected fourth floating diffusion layer to the first wire,
in which the output circuit outputs the signal according to an amount of charge of at least one of the pair of first floating diffusion layers or the pair of second floating diffusion layers, and a signal according to an amount of charge of at least one of the pair of third floating diffusion layers or the pair of fourth floating diffusion layers.
(15) The solid-state image capturing element according to (12), further including:
a first transfer transistor configured to transfer a charge from a first photoelectric conversion element to one of the pair of first floating diffusion layers; a second transfer transistor configured to transfer a charge from the first photoelectric conversion element to another one of the pair of first floating diffusion layers;
a third transfer transistor configured to transfer a charge from a second photoelectric conversion element to one of the pair of second floating diffusion layers; and a fourth transfer transistor configured to transfer a charge from the second photoelectric conversion element to another one of the pair of second floating diffusion layers.
(16) The solid-state image capturing element according to (1), in which the first connection circuit includes:
a first connection transistor configured to connect one of the pair of first floating diffusion layers to a second wire connected to the first wire according to a first control signal;
a second connection transistor configured to connect another one of the pair of first floating diffusion layers to a third wire according to a second control signal; and
a third connection transistor configured to connect the first wire to the third wire according to a third control signal, and the second connection circuit includes a fourth connection transistor that connects one of the pair of second floating diffusion layers to the second wire according to a fourth control signal.

(17) An electronic device including:

a pair of first floating diffusion layers arranged in a direction perpendicular to a predetermined direction;

a pair of second floating diffusion layers arranged in the perpendicular direction and adjacent to the pair of first floating diffusion layers in the predetermined direction;

a first connection circuit configured to select at least one of the pair of first floating diffusion layers and to connect the selected first floating diffusion layer to a predetermined first wire;

a second connection circuit configured to select at least one of the pair of second floating diffusion layers and to connect the selected second floating diffusion layer to the first wire;

an output circuit configured to output a signal according to an amount of charge of at least one of the pair of first floating diffusion layers or the pair of second floating diffusion layers; and an analog-to-digital conversion unit configured to perform analog-to-digital conversion processing on the signal.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

100 Image capturing device
101 Electronic device
110 Optical unit
120 DSP circuit
130 Display unit
140 Operation unit
150 Bus
160 Frame memory
170 Storage unit
180 Power supply unit
191 Light-emitting unit
192 Control unit
200 Solid-state image capturing element
201 Pixel chip
202 Circuit chip
210 Row selection unit
220 Digital to analog converter (DAC)
230 Timing control circuit
240 Analog-to-digital conversion unit
241 ADC
242 Comparator
243 Counter
244 Latch circuit
250 Horizontal transfer scanning unit
260 Signal processing unit
300 Pixel array unit
307 Power supply line
308, 508, 509 FD wire
309 Vertical signal line
310 Pixel block
311, 510, 530, 550, 570 Pixel
320, 330, 340, 350, 360, 370, 380, 390 FD sharing block
321, 331, 341, 351, 521, 522, 541, 542, 561, 562, 581, 582 FD
401, 421, 441, 461, 494, 495, 511, 512, 531, 532, 551, 552, 571, 572 Connection transistor
402, 422, 442, 462, 513, 514, 533, 534, 553, 554, 573, 574 Reset transistor
403 to 410, 423 to 430, 443 to 450, 463 to 470, 517, 518, 537, 538, 557, 558, 577, 578 Transfer transistor
411 to 418, 431 to 438, 451 to 458, 471 to 478, 523, 543, 563, 583 Photoelectric conversion element
419, 439, 459, 479, 515, 516, 535, 536, 555, 556, 575, 576 Amplification transistor
420, 440, 460, 480, 519, 520, 539, 540, 559, 560, 579, 580 Selection transistor
490, 491 Connection circuit
492 Output circuit
12031 Image capturing unit

The invention claimed is:

1. A solid-state image capturing element comprising:
a pair of first floating diffusion layers arranged in a direction perpendicular to a predetermined direction;
a pair of second floating diffusion layers arranged in the perpendicular direction and adjacent to the pair of first floating diffusion layers in the predetermined direction;
a first connection circuit configured to select at least one of the pair of first floating diffusion layers and to connect the selected first floating diffusion layer to a predetermined first wire;
a second connection circuit configured to select at least one of the pair of second floating diffusion layers and to connect the selected second floating diffusion layer to the first wire; and
an output circuit configured to output a signal according to an amount of charge of at least one of the pair of first floating diffusion layers or the pair of second floating diffusion layers,
wherein the first connection circuit includes:
a first connection transistor configured to connect one of the pair of first floating diffusion layers to a second wire connected to the first wire according to a first control signal;
a second connection transistor configured to connect another one of the pair of first floating diffusion layers to a third wire according to a second control signal; and
a third connection transistor configured to connect the first wire to the third wire according to a third control signal, and
the second connection circuit includes a fourth connection transistor that connects one of the pair of second floating diffusion layers to the second wire according to a fourth control signal.

2. The solid-state image capturing element according to claim 1, wherein
a reset transistor is disposed between the first connection transistor and the third connection transistor in the predetermined direction, and
a selection transistor is disposed between the first connection transistor and the second connection transistor in the perpendicular direction.

3. The solid-state image capturing element according to claim 1, wherein
the first connection transistor and the third connection transistor are disposed adjacent to each other in the predetermined direction, and
a selection transistor is disposed between the first connection transistor and the second connection transistor in the perpendicular direction.

4. The solid-state image capturing element according to claim 1, wherein a reset transistor is disposed between the first connection transistor and the third connection transistor in the predetermined direction, and the first connection transistor and the second connection transistor are disposed adjacent to each other in the perpendicular direction.

5. The solid-state image capturing element according to claim 1, wherein the first connection transistor and the third connection transistor are disposed adjacent to each other in the predetermined direction, and the first connection transistor and the second connection transistor are disposed adjacent to each other in the perpendicular direction.

6. The solid-state image capturing element according to claim 1, wherein the second connection circuit further includes:

a fifth connection transistor configured to connect one of the pair of second floating diffusion layers to a predetermined second wire according to a fifth control signal; and a sixth connection transistor configured to connect another one of the pair of second floating diffusion layers to a predetermined third wire according to a sixth control signal.

7. The solid-state image capturing element according to claim 6, wherein a reset transistor is disposed adjacent to the fifth connection transistor in the predetermined direction.

8. The solid-state image capturing element according to claim 6, wherein a predetermined number of the fifth connection transistors are arranged adjacent to each other in the predetermined direction.

9. The solid-state image capturing element according to claim 6, wherein the output circuit further includes:

a first reset transistor configured to connect a predetermined power node to the first wire according to a first reset signal; and a second reset transistor configured to connect a predetermined power node to the first wire according to a second reset signal.

10. The solid-state image capturing element according to claim 1, further comprising:

a pair of third floating diffusion layers arranged in the perpendicular direction;

a pair of fourth floating diffusion layers arranged in the perpendicular direction and adjacent to the pair of third floating diffusion layers in the predetermined direction;

a third connection circuit configured to select at least one of the pair of third floating diffusion layers and to connect the selected third floating diffusion layer to the first wire; and a fourth connection circuit configured to select at least one of the pair of fourth floating diffusion layers and to connect the selected fourth floating diffusion layer to the first wire.

11. The solid-state image capturing element according to claim 1, further comprising:

a signal processing unit configured to perform processing of measuring a distance according to a time of flight of light on a basis of the output signal.

12. The solid-state image capturing element according to claim 11, further comprising:

a pair of third floating diffusion layers arranged in the perpendicular direction;

a pair of fourth floating diffusion layers arranged in the perpendicular direction;

a third connection circuit configured to select at least one of the pair of third floating diffusion layers and to connect the selected third floating diffusion layer to a predetermined second wire; and a fourth connection circuit configured to select at least one of the pair of fourth floating diffusion layers and to connect the selected fourth floating diffusion layer to the second wire, wherein the output circuit outputs the signal according to an amount of charge of at least one of the pair of first floating diffusion layers or the pair of second floating diffusion layers, and a signal according to an amount of charge of at least one of the pair of third floating diffusion layers or the pair of fourth floating diffusion layers.

13. The solid-state image capturing element according to claim 11, further comprising:

a pair of third floating diffusion layers arranged in the perpendicular direction;

a pair of fourth floating diffusion layers arranged in the perpendicular direction;

a third connection circuit configured to select at least one of the pair of third floating diffusion layers and to connect the selected third floating diffusion layer to the first wire; and a fourth connection circuit configured to select at least one of the pair of fourth floating diffusion layers and to connect the selected fourth floating diffusion layer to the first wire, wherein the output circuit outputs the signal according to an amount of charge of at least one of the pair of first floating diffusion layers or the pair of second floating diffusion layers, and a signal according to an amount of charge of at least one of the pair of third floating diffusion layers or the pair of fourth floating diffusion layers.

14. The solid-state image capturing element according to claim 11, further comprising:

a first transfer transistor configured to transfer a charge from a first photoelectric conversion element to one of the pair of first floating diffusion layers;

a second transfer transistor configured to transfer a charge from the first photoelectric conversion element to another one of the pair of first floating diffusion layers;

a third transfer transistor configured to transfer a charge from a second photoelectric conversion element to one of the pair of second floating diffusion layers; and a fourth transfer transistor configured to transfer a charge from the second photoelectric conversion element to another one of the pair of second floating diffusion layers.

15. An electronic device comprising:

a pair of first floating diffusion layers arranged in a direction perpendicular to a predetermined direction;

a pair of second floating diffusion layers arranged in the perpendicular direction and adjacent to the pair of first floating diffusion layers in the predetermined direction;

a first connection circuit configured to select at least one of the pair of first floating diffusion layers and to connect the selected first floating diffusion layer to a predetermined first wire;

a second connection circuit configured to select at least one of the pair of second floating diffusion layers and to connect the selected second floating diffusion layer to the first wire;

an output circuit configured to output a signal according to an amount of charge of at least one of the pair of first floating diffusion layers or the pair of second floating diffusion layers; and an analog-to-digital conversion unit configured to perform analog-to-digital conversion processing on the signal, wherein the first connection circuit includes:
- a first connection transistor configured to connect one of the pair of first floating diffusion layers to a second wire connected to the first wire according to a first control signal;
- a second connection transistor configured to connect another one of the pair of first floating diffusion layers to a third wire according to a second control signal; and
- a third connection transistor configured to connect the first wire to the third wire according to a third control signal, and the second connection circuit includes a fourth connection transistor that connects one of the pair of second floating diffusion layers to the second wire according to a fourth control signal.

\* \* \* \* \*